US009786736B2

United States Patent
Tamaki et al.

(10) Patent No.: US 9,786,736 B2
(45) Date of Patent: Oct. 10, 2017

(54) POWER SEMICONDUCTOR DEVICE

(71) Applicant: Renesas Electronics Corporation, Koutou-ku, Tokyo (JP)

(72) Inventors: Tomohiro Tamaki, Kanagawa (JP); Yoshito Nakazawa, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/062,029

(22) Filed: Mar. 4, 2016

(65) Prior Publication Data
US 2016/0190235 A1 Jun. 30, 2016

Related U.S. Application Data

(63) Continuation of application No. 14/569,730, filed on Dec. 14, 2014, now abandoned, which is a
(Continued)

(30) Foreign Application Priority Data

May 12, 2010 (JP) .................................. 2010-109957

(51) Int. Cl.
*H01L 29/08* (2006.01)
*H01L 29/06* (2006.01)
(Continued)

(52) U.S. Cl.
CPC ...... *H01L 29/0634* (2013.01); *H01L 29/0696* (2013.01); *H01L 29/1095* (2013.01);
(Continued)

(58) Field of Classification Search
CPC ............ H01L 29/0634; H01L 29/0696; H01L 29/1095; H01L 29/7802; H01L 29/7811; H01L 29/7813
(Continued)

(56) References Cited

U.S. PATENT DOCUMENTS 6,844,592 B2    1/2005   Yamaguchi et al.
6,888,195 B2    5/2005   Saito et al.
(Continued)

FOREIGN PATENT DOCUMENTS

JP    2003-273355 A    9/2003
JP    2004-022716 A    1/2004
(Continued)

OTHER PUBLICATIONS

Office Action dated Mar. 13, 2014, in Japanese Patent Application No. 2010-109957.
(Continued)

*Primary Examiner* — Julio J Maldonado
*Assistant Examiner* — Rodolfo D Fortich
(74) *Attorney, Agent, or Firm* — Shapiro, Gabor and Rosenberger, PLLC

(57) ABSTRACT

A problem associated with n-channel power MOSFETs and the like that the following is caused even by relatively slight fluctuation in various process parameters is solved: source-drain breakdown voltage is reduced by breakdown at an end of a p-type body region in proximity to a portion in the vicinity of an annular intermediate region between an active cell region and a chip peripheral portion, arising from electric field concentration in that area. To solve this problem, the following measure is taken in a power semiconductor device having a superjunction structure in the respective drift regions of a first conductivity type of an active cell region, a chip peripheral region, and an intermediate region located therebetween: the width of at least one of column regions of a second conductivity type comprising the superjunction structure in the intermediate region is made larger than the width of the other regions.

6 Claims, 68 Drawing Sheets

Related U.S. Application Data continuation of application No. 14/037,103, filed on Sep. 25, 2013, now Pat. No. 8,981,469, which is a continuation of application No. 13/731,065, filed on Dec. 30, 2012, now Pat. No. 8,558,309, which is a continuation of application No. 13/105,889, filed on May 11, 2011, now Pat. No. 8,350,325.

(51) Int. Cl.

| | | |
|---|---|---|
| *H01L 29/10* | (2006.01) | |
| *H01L 29/66* | (2006.01) | |
| *H01L 29/78* | (2006.01) | |
| *H01L 29/40* | (2006.01) | |
| *H01L 29/417* | (2006.01) | |

(52) U.S. Cl.
CPC .. *H01L 29/66681* (2013.01); *H01L 29/66727* (2013.01); *H01L 29/7802* (2013.01); *H01L 29/7811* (2013.01); *H01L 29/7813* (2013.01); *H01L 29/7823* (2013.01); *H01L 29/7825* (2013.01); *H01L 29/063* (2013.01); *H01L 29/0615* (2013.01); *H01L 29/0638* (2013.01); *H01L 29/0878* (2013.01); *H01L 29/402* (2013.01); *H01L 29/41766* (2013.01)

(58) Field of Classification Search
USPC .......................... 257/329, 330, 341, 328, 378
See application file for complete search history.

(56) References Cited

U.S. PATENT DOCUMENTS

| | | | |
|---|---|---|---|
| 7,317,213 | B2 | 1/2008 | Yamaguchi et al. |
| 7,345,339 | B2 | 3/2008 | Yamaguchi et al. |
| 7,345,342 | B2 | 3/2008 | Challa et al. |
| 7,417,284 | B2 | 8/2008 | Yamauchi et al. |
| 7,420,245 | B2 | 9/2008 | Yamashita et al. |
| 7,432,134 | B2 | 10/2008 | Ninomiya et al. |
| 7,498,619 | B2 | 3/2009 | Saggio et al. |
| 7,541,643 | B2 | 6/2009 | Ono et al. |
| 7,595,530 | B2 | 9/2009 | Tokano et al. |
| 7,642,597 | B2 | 1/2010 | Saito |
| 7,649,223 | B2 | 1/2010 | Kawashima |
| 7,855,415 | B2 | 12/2010 | Challa et al. |
| 8,097,511 | B2 | 1/2012 | Shibata et al. |
| 8,421,154 | B2 | 4/2013 | Miyajima |
| 8,558,309 | B2 | 10/2013 | Tamaki et al. |
| 2003/0132450 | A1* | 7/2003 | Minato ............... H01L 29/0619 257/110 |
| 2006/0231917 | A1 | 10/2006 | Ono et al. |
| 2007/0138543 | A1 | 6/2007 | Saito |
| 2008/0017897 | A1 | 1/2008 | Saito et al. |
| 2008/0237774 | A1 | 10/2008 | Ono et al. |
| 2008/0246079 | A1 | 10/2008 | Saito et al. |
| 2010/0025760 | A1 | 2/2010 | Kawashima |
| 2012/0276701 | A1 | 11/2012 | Yedinak et al. |
| 2012/0326226 | A1 | 12/2012 | Xiao |
| 2013/0020633 | A1 | 1/2013 | Iwamuro |

FOREIGN PATENT DOCUMENTS

| | | |
|---|---|---|
| JP | 2004-119611 A | 4/2004 |
| JP | 2006-66421 A | 3/2006 |
| JP | 2006-073615 A | 3/2006 |
| JP | 2006-245082 A | 9/2006 |
| JP | 2006-313892 A | 11/2006 |
| JP | 2007-300034 A | 11/2007 |
| JP | 2008-91450 A | 4/2008 |
| JP | 2008-124346 A | 5/2008 |
| JP | 2008-258442 A | 10/2008 |
| JP | 2008-305927 A | 12/2008 |
| JP | 2010-045307 A | 2/2010 |
| JP | 2010-056154 A | 3/2010 |

OTHER PUBLICATIONS

Office Action dated Nov. 20, 2014, in Japanese Patent Application No. 2010-10957.

* cited by examiner

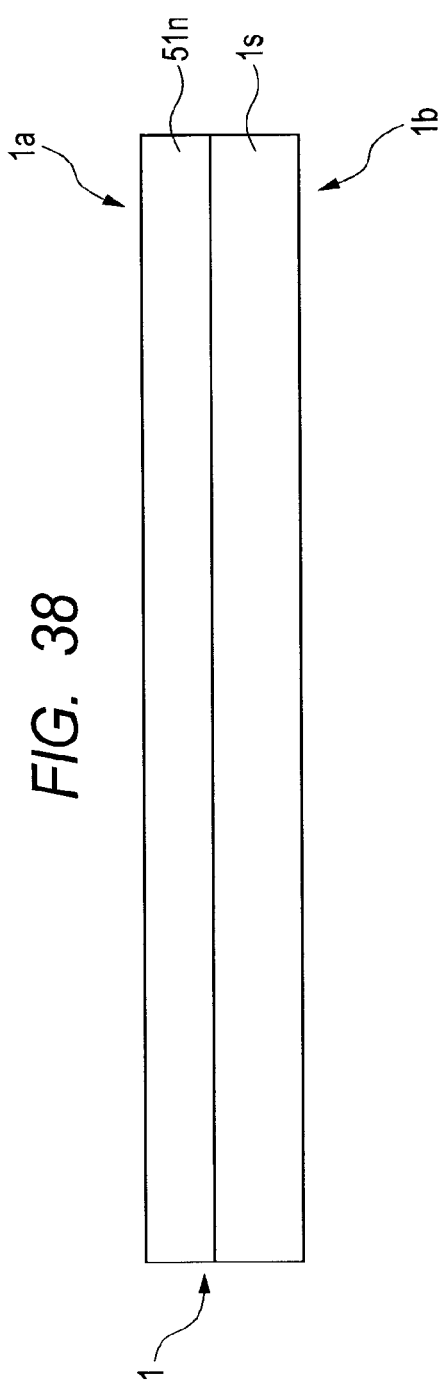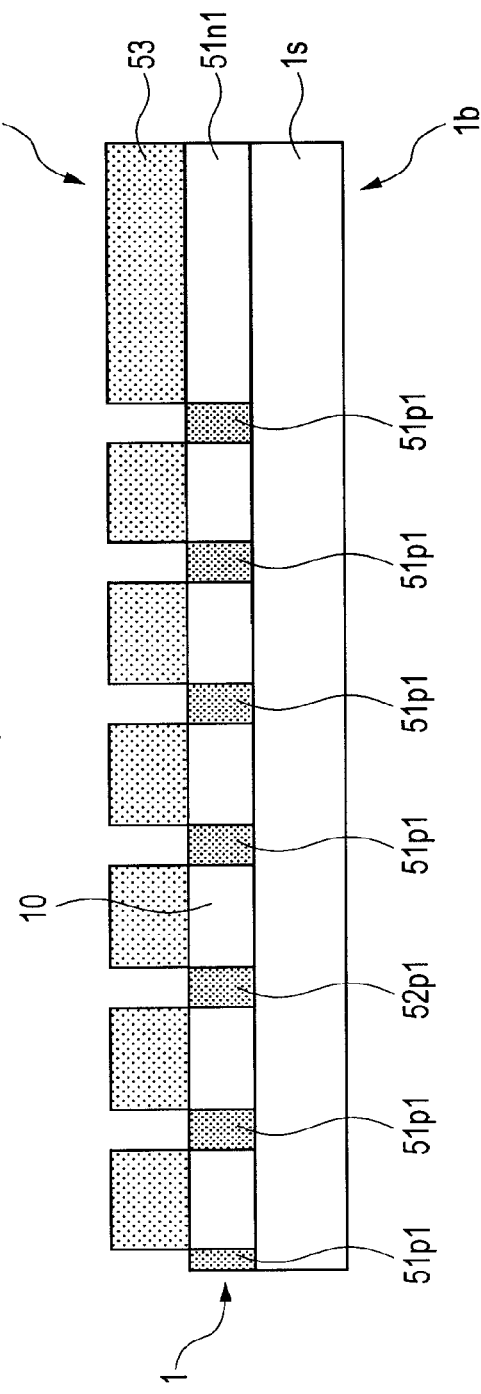

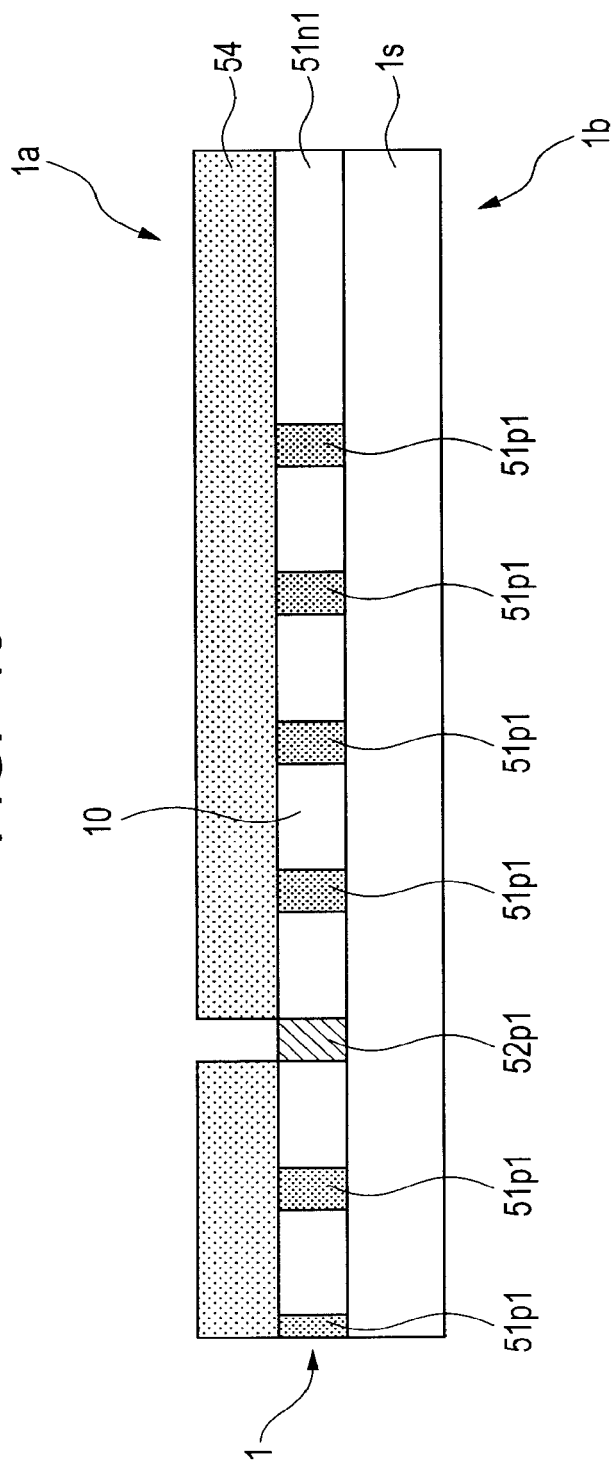

POWER SEMICONDUCTOR DEVICE

CROSS-REFERENCE TO RELATED APPLICATIONS

The disclosure of Japanese Patent Application No. 2010-109957 filed on May 12, 2010 including the specification, drawings and abstract is incorporated herein by reference in its entirety.

BACKGROUND

The present invention relates to a technology effectively applicable to cell periphery layout techniques or breakdown voltage enhancement techniques in semiconductor devices (or semiconductor integrated circuit devices), especially, power semiconductor devices such as power MOSFETs.

Japanese Unexamined Patent Publication No. 2008-124346 (Patent Document 1) or U.S. Pat. No. 7,642,597 (Patent Document 2) discloses an example of the following power MOSFET (Metal Oxide Semiconductor Field Effect Transistor): a power MOSFET manufactured using a multi-epitaxy technique or an epitaxy trench filling technique and having a so-called semi-super junction structure in which a super junction structure is introduced up to some midpoint in a drift region. In this example, such an impurity profile that the impurity concentration is gradually reduced from top to bottom is formed in a p-type column region comprising a semi-super junction structure. Electric field concentration at the lower end portion of a trench field plate is thereby reduced to achieve a high-breakdown voltage characteristic and low on resistance.

Japanese Unexamined Patent Publication No. 2004-119611 (Patent Document 3) discloses an example of a power MOSFET having a semi-super junction structure manufactured mainly using a multi-epitaxy technique. In this example, such an impurity profile that the impurity concentration is gradually increased from top to bottom is formed in an n-type column region comprising a semi-super junction structure. Degradation in breakdown voltage due to charge unbalance between an n-type column region and a p-type column region is thereby reduced.

Japanese Unexamined Patent Publication No. 2008-258442 (Patent Document 4) or US Patent Publication No. 2008-246079 (Patent Document 5) discloses an example of a power MOSFET having a semi-super junction structure manufactured mainly using a multi-epitaxy technique. In this example, an impurity profile high at the central part is formed in an n-type column region and a p-type column region comprising a semi-super junction structure. Depletion at the upper and lower ends is thereby facilitated to reduce electric field concentration at these parts.

Japanese Unexamined Patent Publication No. 2008-91450 (Patent Document 6) or US Patent Publication No. 2008-237774 (Patent Document 7) discloses an example of a power MOSFET having a semi-super junction structure manufactured mainly using a multi-epitaxy technique. In this example, such an impurity profile that the impurity concentration is reduced stepwise from top to bottom is formed in an n-type column region and a p-type column region comprising a semi-super junction structure to achieve a high-breakdown voltage characteristic and low on resistance.

Japanese Unexamined Patent Publication No. 2007-300034 (Patent Document 8) or US Patent Publication No. 2008-17897 (Patent Document 9) discloses an example of a power MOSFET having a semi-super junction structure manufactured mainly using an epitaxy trench filling technique. In this example, the width of an n-type column region and a p-type column region comprising a semi-super junction structure is made different between top and bottom. (Specifically, the width of the lower part of the p-type column region is reduced.) Diffusion of boron at the lower part of a column is thereby suppressed to prevent increase in on resistance.

Japanese Unexamined Patent Publication No. 2006-66421 (Patent Document 10) or U.S. Pat. No. 7,420,245 (Patent Document 11) discloses an example of the following power MOSFET manufactured using a multi-epitaxy technique: a power MOSFET having a so-called full-super junction structure (or simply referred to as "super junction structure") in which a super junction structure is introduced so that it penetrates a drift region. In this example, an n-type column region and a p-type column region comprising a super junction structure are each divided into two sections, an upper section and a lower section. The concentration of the upper section is increased to reduce degradation in breakdown voltage due to charge unbalance between the n-type column region and the p-type column region.

[Patent Document 1]
Japanese Unexamined Patent Publication No. 2008-124346
[Patent Document 2]
U.S. Pat. No. 7,642,597
[Patent Document 3]
Japanese Unexamined Patent Publication No. 2004-119611
[Patent Document 4]
Japanese Unexamined Patent Publication No. 2008-258442
[Patent Document 5]
US Patent Publication No. 2008-246079
[Patent Document 6]
Japanese Unexamined Patent Publication No. 2008-91450
[Patent Document 7]
US Patent Publication No. 2008-237774
[Patent Document 8]
Japanese Unexamined Patent Publication No. 2007-300034
[Patent Document 9]
US Patent Publication No. 2008-17897
[Patent Document 10]
Japanese Unexamined Patent Publication No. 2006-66421
[Patent Document 11]
U.S. Pat. No. 7,420,245

SUMMARY

With respect to the drift regions of power MOSFETs and the like, the following is a key challenge: restriction arising from conventional silicon limit is avoided and a high-breakdown voltage FET (for example, source-drain breakdown voltage of approximately 650 volts or above) with low on resistance or the like is developed. For this purpose, various methods have been developed to introduce the following superjunction structure into a drift region: a superjunction structure in which slab-like n-type column regions and p-type column regions of a relatively high concentration are alternately provided. There are roughly three techniques for introducing this superjunction structure: multi-epitaxy technique, trench insulating film burying technique, and epitaxy trench filling technique (trench fill technique or trench epitaxy embedding technique).

Of these techniques, the multi-epitaxy technique in which epitaxial growth and ion implantation are repeated a large number of times is high in the degree of freedom of process and design. This accordingly complicates the process steps and thus increases costs.

The trench insulating film burying technique is such that a trench is subjected to oblique ion implantation and the trench (groove for embedding a p-type column region) is filled with a CVD (Chemical Vapor Deposition) insulating film. This process is simpler; however, it is disadvantageous by an amount equivalent to the area of the trench in terms of area.

The epitaxy trench filling technique is such that: a trench is formed in an epitaxial layer (designated as "ordinary epitaxy layer" or "base epitaxy layer") as a base; and a column region of the opposite conductivity type is embedded and formed there by burying epitaxial growth. Because of the restriction of growth conditions for the burying epitaxial growth, it is relatively low in the degree of freedom of design but it has an advantage of simple process steps.

The present inventors used simulation and the like to examine problems associated with the device structure and mass production of power MOSFETs and the like obtained by the epitaxy trench filling technique, the multi-epitaxy technique, and the like. As a result, it was revealed that these techniques involved the problem described below. When n-channel power MOSFETs will be taken as an example, the following takes place also by relatively slight fluctuation in various process parameters: because of electric field concentration in the vicinity of the annular intermediate region between an active cell region and a chip peripheral portion, the source-drain breakdown voltage is reduced by breakdown at an end of a p-type body region in proximity to that portion.

The invention has been made to solve these problems.

It is an object of the invention to provide a high-breakdown voltage and low-on resistance semiconductor device, such as a power solid state active element.

The above and other objects and novel features of the invention will be apparent from the description of this specification and the accompanying drawings.

The following is a brief description of the gist of the representative elements of the invention laid open in this application:

An aspect of the invention laid open in this application is a power semiconductor device having a superjunction structure in the respective drift regions of a first conductivity type of an active cell region, a chip peripheral region, and the intermediate region between them. In this intermediate region, the width of at least one of column regions of a second conductivity type comprising a superjunction structure is made larger than the width of the other regions.

The following is a brief description of the gist of the effect obtained by the representative elements of the invention laid open in this application:

A power semiconductor device has a superjunction structure in the respective drift regions of a first conductivity type of an active cell region, a chip peripheral region, and an intermediate region located between them. In this intermediate region, the width of at least one of column regions of a second conductivity type comprising a superjunction structure is made larger than the width of the other regions. As a result, the following can be implemented in the intermediate region where local charge unbalance occurs and electric field concentration is prone to occur: the depth at which the peak of an electric field comes can be shifted from the surface of a drift region to the inner part thereof.

BRIEF DESCRIPTION OF THE DRAWING

FIG. 38 illustrates a device section in the wafer process (mainly by a multi-epitaxy technique) in a manufacturing method for a semiconductor device in the second embodiment of the invention (the basic structure in FIG. 33 and the doping profile in FIG. 37 are taken as an example) (step of forming first-tier n-type silicon epitaxial layer in multi-epitaxial growth);

FIG. 39 illustrates a device section in the wafer process (mainly by a multi-epitaxy technique) in a manufacturing method for a semiconductor device in the second embodiment of the invention (the basic structure in FIG. 33 taken as an example) (step #1 of implanting p-type impurity in first-tier n-type silicon epitaxial layer in multi-epitaxial growth);

FIG. 40 illustrates a device section in the wafer process (mainly by a multi-epitaxy technique) in a manufacturing method for a semiconductor device in the second embodiment of the invention (the basic structure in FIG. 33 is taken as an example) (step #2 of implanting p-type impurity in first-tier n-type silicon epitaxial layer in multi-epitaxial growth);

DETAILED DESCRIPTION

Overview of Embodiments

Figure 1:
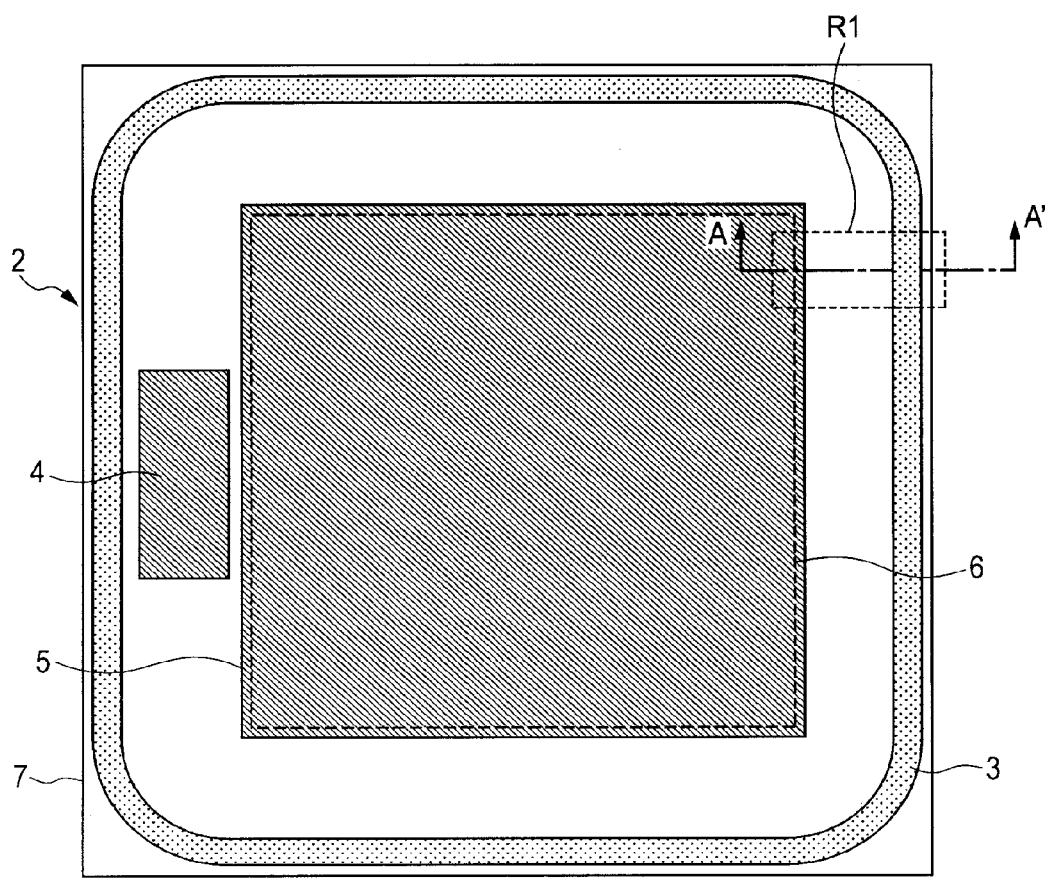
FIG. 1 is an overall plan layout diagram of a chip upper surface in the device structure (basic structure: single line wide column type) of a power MOSFET as an example of a semiconductor device in a first embodiment of the invention.

Description will be given to representative embodiments of the invention laid open in this application.

1. A power semiconductor device includes: (a) a semiconductor chip having a first main surface where the source electrode of a power MOSFET is provided and a second main surface; (b) an active cell region provided substantially at the central part of the first main surface of the semiconductor chip, a chip peripheral region provided in the periphery of the first main surface, and an annular intermediate region provided in the first main surface of the semiconductor chip between the active cell region and the chip peripheral region; (c) a drift region of a first conductivity type provided in the surfaces of the active cell region, the chip peripheral region, and the annular intermediate region on the first main surface side of the semiconductor chip; (d) a first superjunction structure provided in the drift region in substantially the whole of the active cell region; (e) a second superjunction structure provided in the drift region corresponding to the annular intermediate region; and (f) a third superjunction structure provided in the drift region corresponding to the chip peripheral region. At least one of the multiple column regions of a second conductivity type comprising the second superjunction structure is larger in width than the multiple column regions of the second conductivity type comprising the first superjunction structure.

2. The semiconductor device in Section 1 above further includes: (g) a cell peripheral body region of the second conductivity type provided in the surface region of the drift region in the first main surface of the semiconductor chip in correspondence with the annular intermediate region so that it surrounds the active cell region.

3. In the semiconductor device in Section 2 above, at least one of the column regions of the second conductivity type is comprised of one or more column regions of the second conductivity type and at least one of them is coupled with the cell peripheral body region.

4. In the semiconductor device in any of Sections 1 to 3 above, at least the one column region of the second conductivity type is larger in width than the multiple column regions of the second conductivity type comprising the third superjunction structure.

5. In the semiconductor device in any of Sections 1 to 4 above, the width of part of at least the one column region of the second conductivity type is substantially equal to the width of the multiple column regions of the second conductivity types comprising the first superjunction structure.

6. In the semiconductor device in any of Sections 1 to 5 above, the cross section structure of the multiple column regions of the second conductivity type comprising the first superjunction structure, the second superjunction structure, and the third superjunction structure is in a tapered shape and their lower parts are thinned.

7. The semiconductor device in any of Sections 1 to 6 above, the semiconductor chip contains a silicon member as a principal constituent element.

8. In the semiconductor device in any of Sections 1 to 7 above, the first conductivity type is n type.

9. In the semiconductor device in any of Sections 1 to 8 above, the semiconductor chip comprises a single or complex power active device.

10. In the semiconductor device in any of Sections 1 to 9 above, the semiconductor chip comprises a single device of planar power MOSFET.

11. The semiconductor device in Section 4 above further includes: (h) a surface RESURF region of the second conductivity type provided in the surface region of the drift region in the first main surface of the semiconductor chip so that it surrounds the active cell region and the cell peripheral body region and lower in impurity concentration than the cell peripheral body region.

12. A power semiconductor device includes: (a) a semiconductor chip having a first main surface where the source electrode of a power MOSFET is provided and a second main surface; (b) an active cell region provided substantially at the central part of the first main surface of the semiconductor chip, a chip peripheral region provided in the periphery of the first main surface, and an annular intermediate region provided in the first main surface of the semiconductor chip between the active cell region and the chip peripheral region; (c) a drift region of a first conductivity type provided in the surfaces of the active cell region, the chip peripheral region, and the annular intermediate region on the first main surface side of the semiconductor chip; (d) a first superjunction structure provided in the drift region in substantially the whole of the active cell region; (e) a second superjunction structure provided in the drift region corresponding to the annular intermediate region; and (f) a third superjunction structure provided in the drift region corresponding to the chip peripheral region. At least one of the multiple column regions of a second conductivity type comprising the second superjunction structure includes a portion higher in impurity concentration than the multiple column regions of the second conductivity type comprising the first superjunction structure.

13. In the semiconductor device in Section 12 above, the first superjunction structure, the second superjunction structure, and the third superjunction structure are formed by multi-epitaxial technique.

14. In the semiconductor device in Section 13 above, only its lower half part is high in concentration.

15. The semiconductor device in Section 13 above has such a concentration gradient that the concentration is increased from top to bottom.

16. A power semiconductor device includes: (a) a semiconductor chip having a first main surface where the source electrode of a power MOSFET is provided and a second main surface; (b) an active cell region provided substantially at the central part of the first main surface of the semiconductor chip, a chip peripheral region provided in the periphery of the first main surface, and an annular intermediate region provided in the first main surface of the semiconductor chip between the active cell region and the chip peripheral region; (c) a drift region of a first conductivity type provided in the surfaces of the active cell region, the chip peripheral region, and the annular intermediate region on the first main surface side of the semiconductor chip; (d) a first superjunction structure provided in the drift region in substantially the whole of the active cell region; (e) a second superjunction structure provided in the drift region corresponding to the annular intermediate region; and (f) a third superjunction structure provided in the drift region corresponding to the chip peripheral region. The drift region of the first conductivity type includes an ordinary epitaxial lower region and an ordinary epitaxial upper region higher in concentration than it.

17. In the semiconductor device Section 16 above, the impurity concentration of the ordinary epitaxial upper region is such a concentration that the column regions of the first conductivity type and the column regions of the second conductivity type comprising the first superjunction structure are substantially charge balanced.

18. A power semiconductor device includes: (a) a semiconductor chip having a first main surface where the source electrode of a power MOSFET is provided and a second main surface; (b) an active cell region provided substantially at the central part of the first main surface of the semiconductor chip, a chip peripheral region provided in the periphery of the first main surface, and an annular intermediate region provided in the first main surface of the semiconductor chip between the active cell region and the chip peripheral region; (c) a drift region of a first conductivity type provided in the surfaces of the active cell region, the chip peripheral region, and the annular intermediate region on the first main surface side of the semiconductor chip; (d) a first superjunction structure provided in the drift region in substantially the whole of the active cell region; (e) a second superjunction structure provided in the drift region corresponding to the annular intermediate region; and (f) a third superjunction structure provided in the drift region corresponding to the chip peripheral region. At least one distance between the multiple column regions of a second conductivity type comprising the second superjunction structure is shorter than the distances between the column regions of the second conductivity type comprising the first superjunction structure.

19. The semiconductor device in Section 18 above further includes: (g) a cell peripheral body region of the second conductivity type provided in the surface region of the drift region in the first main surface of the semiconductor chip in correspondence with the annular intermediate region so that it surrounds the active cell region.

20. In the semiconductor device in any of Sections 1 to 11 above, the first superjunction structure, the second superjunction structure, and the third superjunction structure are formed by an epitaxy trench filling technique.

21. In the semiconductor device in any of Sections 12 to 15 above, the first superjunction structure, the second superjunction structure, and the third superjunction structure are formed by a multi-epitaxial technique.

22. In the semiconductor device in any of Sections 16 to 19 above, the first superjunction structure, the second superjunction structure, and the third superjunction structure are formed by an epitaxy trench filling technique.

23. In the semiconductor device in any of Sections 1 to 22 above, a field plate is provided over the annular intermediate region with an interlayer insulating film in between.

(Explanation of Style of Description, Basic Terms, and Usage Thereof in this Specification)

1. The description of embodiments in this specification may be divided into multiple sections as required for the sake of convenience. These sections are not independent of or separate from one another unless otherwise explicitly stated. Each section is each part of a single example and one section is the details of part of another or a modification or the like to part or all of another. The repetitive description of a similar part will be omitted as a rule. Each constituent element of the embodiments is not indispensable unless otherwise explicitly stated, the number of constituent elements is theoretically limited, or the constituent element is contextually obviously indispensable.

When "semiconductor device" is cited in this specification, it refers to what is obtained by integrating mainly various transistors, single diodes (active elements), or resistors, capacitors, and the like located around them over a semiconductor chip or the like (for example, single crystal silicon substrate). An example of a transistor representative of the various transistors cited here is MISFET (Metal Insulator Semiconductor Field Effect Transistors) typified by MOSFET (Metal Oxide Semiconductor Field Effect Transistor). Examples of transistors representative of various single transistors are power MOSFET and IGBT (Insulated Gate Bipolar Transistor). The IGBT cited here is a bipolar transistor with a power MOSFET incorporated therein and they are basically classified according to the power MOSFETs incorporated therein.

The power MOSFETs (basically the same with the IGBTs) are roughly classified into vertical type and lateral type. The vertical power MOSFETs and the like can be further classified into planar type and trench type. In this specification, planar power MOSFET and trench power MOSFET will be concretely described.

2. Even when the wording of "X comprised of A" or the like is used in the description of the embodiments or the like with respect to material, composition, or the like, what containing an element other than A as one of major constituent elements is not excluded. This applies unless otherwise explicitly stated or it is contextually obviously excluded. Examples will be taken. With respect to component, the above wording means that "X including A as a main component" or the like. A term of "silicon member" or the like is not limited to members of pure silicon and includes SiGe alloys, other multi-element alloys predominantly composed of silicon, and members containing other additive or the like, needless to add. Similarly, even when the term of "silicon oxide film," "silicon oxide insulating film," or the like is used, it does not include only relatively pure undoped silicon dioxide. It also includes the following, needless to add: thermally-oxidized films of FSG (Fluorosilicate Glass), TEOS-based silicon oxide, SiOC (Silicon Oxicarbide) or carbon-doped silicon oxide or OSG (Organosilicate glass), PSG (Phosphorus Silicate Glass), BPSG (Borophosphosilicate Glass), or the like; CVD oxide films; silica low-k insulating films (porous insulating films) obtained by introducing electron holes in a member of applied silicon oxide, such as SOG (Spin ON Glass), NCS (Nano-Clustering Silica), or the like or a similar member; composite films with any other silicon insulating film containing them as a principal constituent element; and the like.

As silicon insulating films regularly used in the field of semiconductor along with silicon oxide insulating films, there are silicon nitride insulating films. The materials belonging to this family include SiN, SiCN, SiNH, SiCNH and the like. When the term of "silicon nitride" is used here, it includes both SiN and SiNH unless otherwise explicitly state. Similarly, when the term of "SiCN" is used, it includes both SiCN and SiCNH unless otherwise explicitly state.

SiC has similar properties to those of SiN. SiON should be often classified into silicon oxide insulating film.

3. In the following description, preferred examples are taken with respect to graphic, position, attribute, or the like. However, the invention should not be strictly limited to such examples unless otherwise explicitly stated or it should be contextually obviously limited to them, needless to add.

4. When reference is made to any specific numeric value or quantity, the specific numeric value or quantity may be exceeded or may be underrun. This applies unless otherwise explicitly stated, any other specific numerical value or quantity is theoretically impermissible, or the specific value or quantity contextually may not be exceeded or underrun.

5. When the term of "wafer" is used, it usually refers to a single crystal silicon wafer over which a semiconductor device (the same with semiconductor integrated circuit device and electronic device) is formed. However, it also includes an epitaxial wafer, a composite wafer of an insulating substrate, such as SOI substrate, LCD glass substrate, or the like, and a semiconductor layer or the like, and the like, needless to add.

6. In general, the superjunction structure refers to a structure obtained by inserting columnar or plate-like column regions of the opposite conductivity type into a semiconductor region of some conductivity type at substantially equal intervals so that charge balance is maintained. When a "superjunction structure" by a trench fill technique is cited in this specification, it refers to a structure obtained by taking the following measure, as a rule: plate-like "column regions" of the opposite conductivity type are inserted into a semiconductor region of some conductivity type at substantially equal intervals so that charge balance is maintained. (Usually, the "column regions" are in the shape of flat plate but they may be curved or bent.) In the description of embodiments, a structure formed by placing p-type columns in an n-type semiconductor layer (for example, a drift region) in parallel at substantially equal intervals.

Some superjunction structures are "semi-superjunction structure" in which p-type column regions or the like are terminated at some midpoint in an n-type drift region. Meanwhile, other superjunction structures are "full-superjunction structure" in which p-type column regions or the like penetrate an n-type drift region. The full-superjunction structure is more advantageous to the achievement of high breakdown voltage and low on resistance. In this specification, the full-superjunction structure will be mainly dealt with.

When the term of "orientation" is used with respect to a superjunction structure, it refers to the following direction:

the direction of length as a p-type column or an n-type column comprising the superjunction structure is two-dimensionally viewed in correspondence with a main surface of the chip (in a plane parallel to a main surface of the chip or the wafer).

When the term of junction edge extension or surface RESURF region (specifically, "p⁻-type surface RESURF region") is used with respect to RESURF (Reduced Surface Field) structure or junction edge termination structure in this specification, it refers to the following region: a region that is formed in the surface region of a drift region, coupled to an end of a p-type body region (p-type well region) comprising a channel region, and of the same conductivity type as that thereof and lower in impurity concentration than it. In general, it is formed in a ring shape so that it surrounds a cell part. Field plate refers to a part of a conductor film pattern coupled to source potential or potential equivalent thereto, that is extended to above the surface (device surface) of a drift region through an insulating film and surrounds a cell part in a ring-like manner. Floating field ring or field limiting ring refers to the following impurity region or impurity region group: an impurity region or impurity region group that is provided in the surface (device surface) of a drift region separately from a p-type body region (p-type well region), has the same conductivity type as that thereof and a concentration similar to that thereof, and singly or multiply surrounds a cell part in a ring-like manner.

Details of Embodiments

Further detailed description will be given to embodiments. In each drawing, the same or similar parts will be marked with the same or similar codes or reference numerals and the description thereof will not be repeated as a rule.

In each accompanying drawing, hatching or the like may be omitted even from a section when it complicates the drawing or it is clearly distinguishable from an airspace. Even in case of a planarly closed hole, a background contour line may be omitted when the hole is clearly recognizable from description or the like. Hatching may be given to something to clearly indicate that it is not an airspace even though it is not a section.

With respect to peripheral side regions or the like, for example, the number of p-type columns shown in each drawing is three or five as a matter of the convenience of diagrammatic representation. In actuality, the number may be larger than 10 or so. In the following description, a semiconductor device with a breakdown voltage of several hundred volts or so will be taken as an example. In the following description, a product with a breakdown voltage of several hundred volts or so (for example, 600 volts) will be taken as an example.

The preceding patent applications disclosed with respect to a power MOSFET utilizing a superjunction structure are, for example, Japanese Patent Application No. 2009-263600 (filed on Nov. 19, 2009 in Japan), Japanese Patent Application No. 2010-81905 (filed on Mar. 31, 2010 in Japan), and the like.

1. Description of the Device Structure (Basic Structure: Single Line Wide Column Type) of a Power MOSFET as an Example of a Semiconductor Device in the First Embodiment of the Invention (Mainly, FIG. 1 to FIG. 10)

In the following concrete description, a planar power MOSFET fabricated in a silicon semiconductor substrate with a source-drain breakdown voltage of 600 volts or so will be taken as an example. (With respect to planar power MOSFETs, this is the same with the following sections.)

However, the invention is also applicable to power MOSFETs and other devices having any other breakdown voltage value, needless to add.

Figure 2:
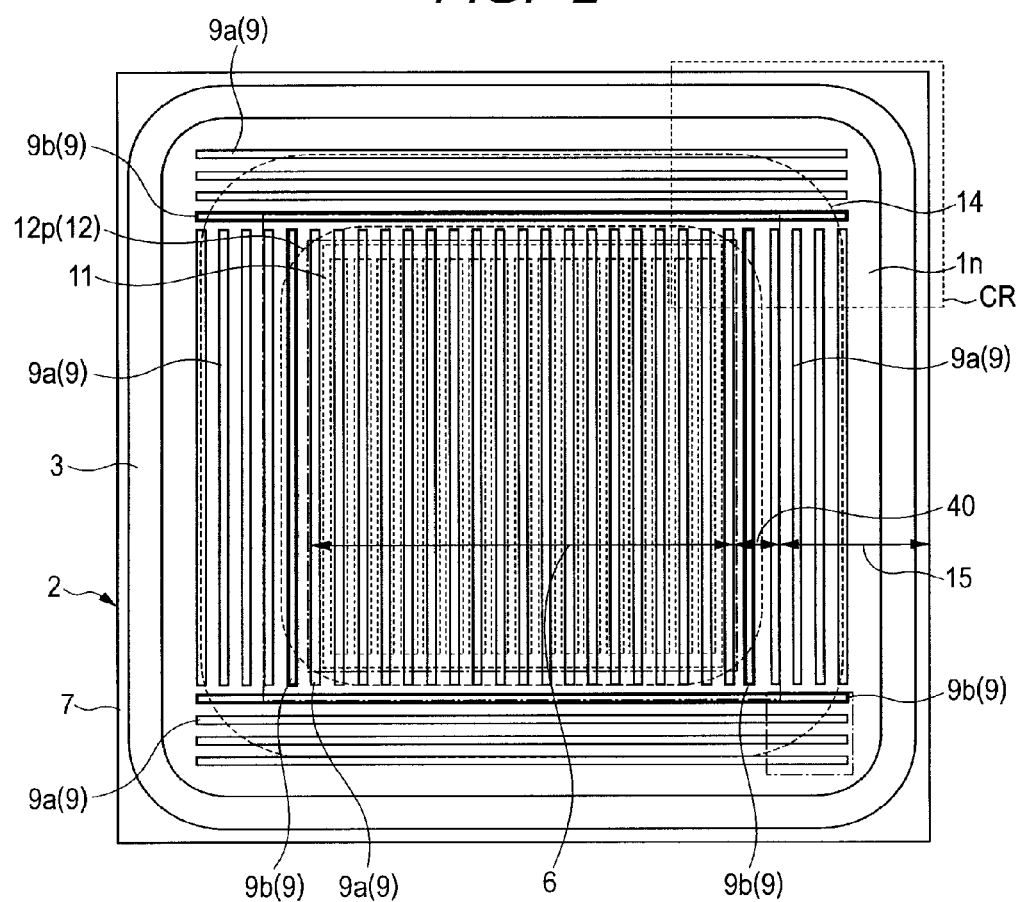
FIG. 2 is a plan layout diagram of p-type column regions in an entire chip surface, corresponding to FIG. 1.
Figure 3:
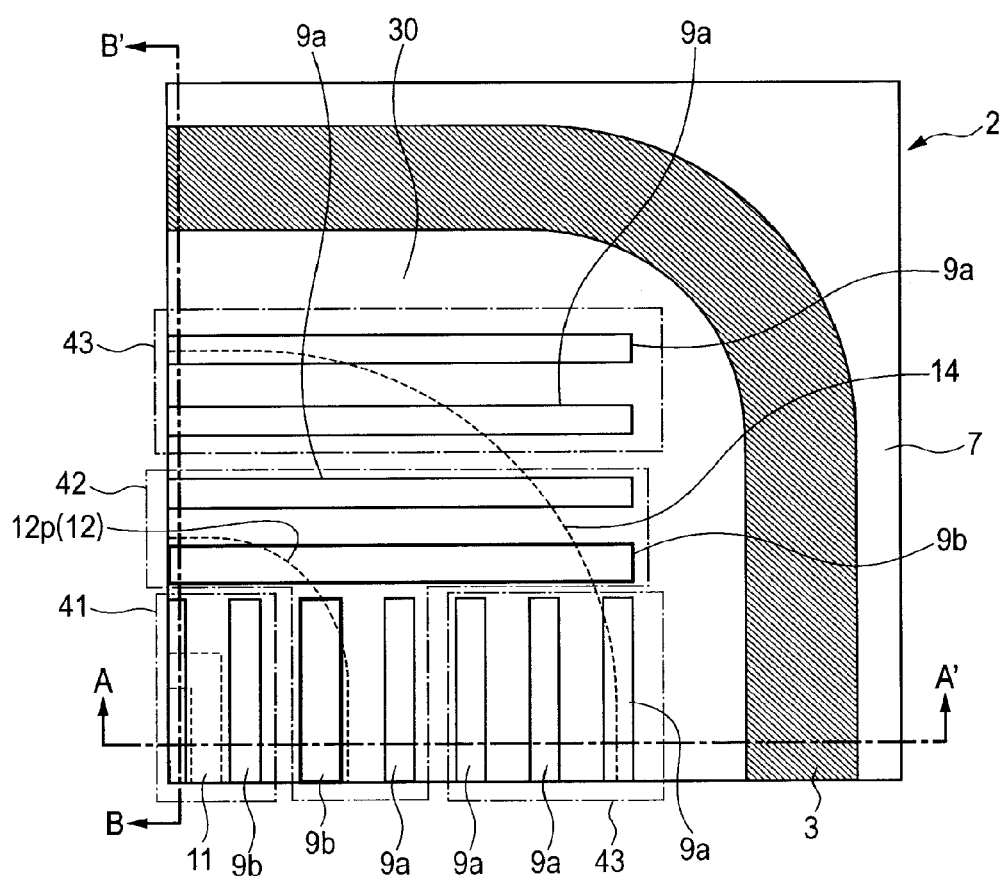
FIG. 3 is an enlarged plan view of a chip corner portion CR in FIG. 2.
Figure 4:
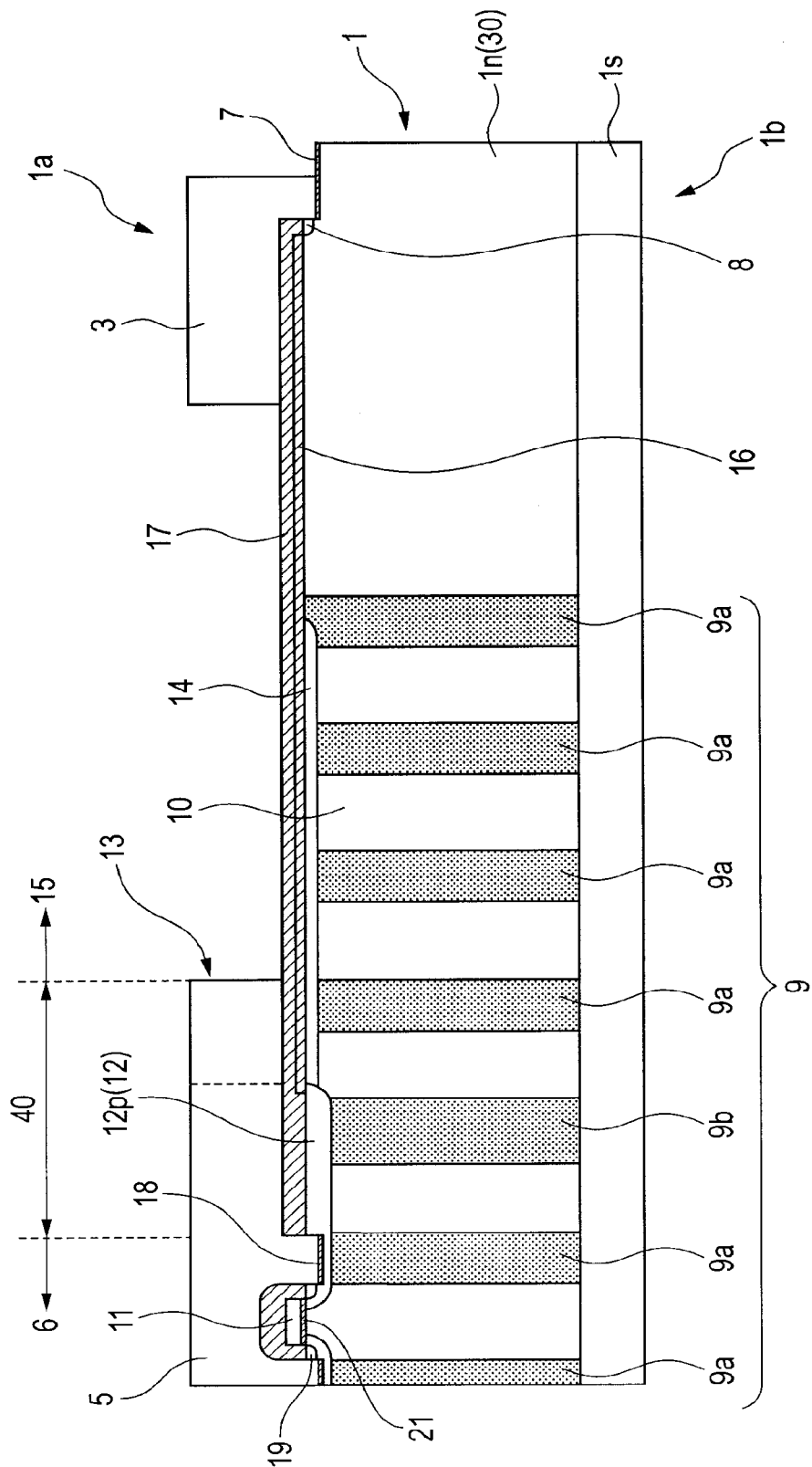
FIG. 4 is a device sectional view corresponding to the section taken along line A-A' of FIG. 3.
Figure 5:
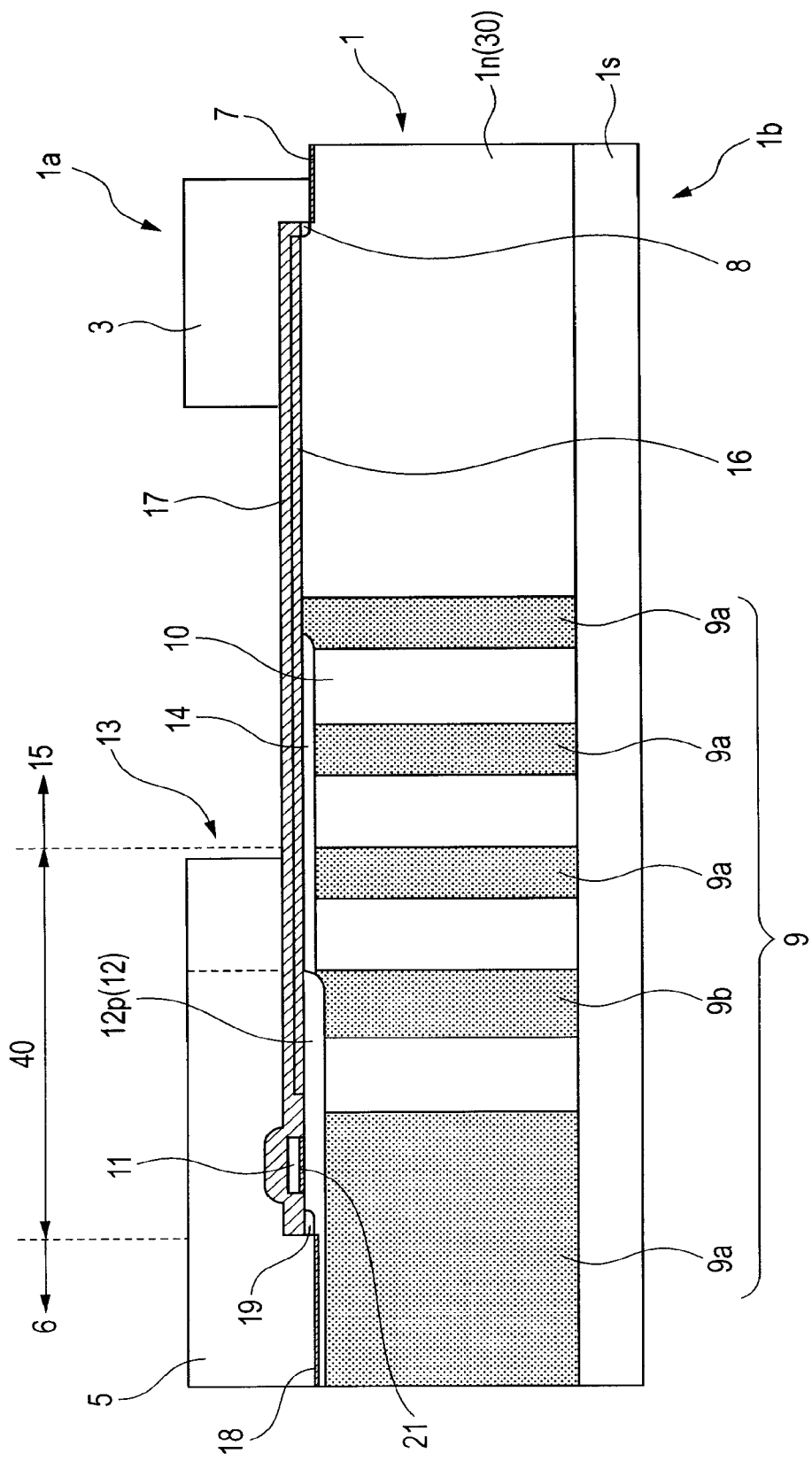
FIG. 5 is a device sectional view corresponding to the section taken along line B-B' of FIG. 3.
Figure 6:
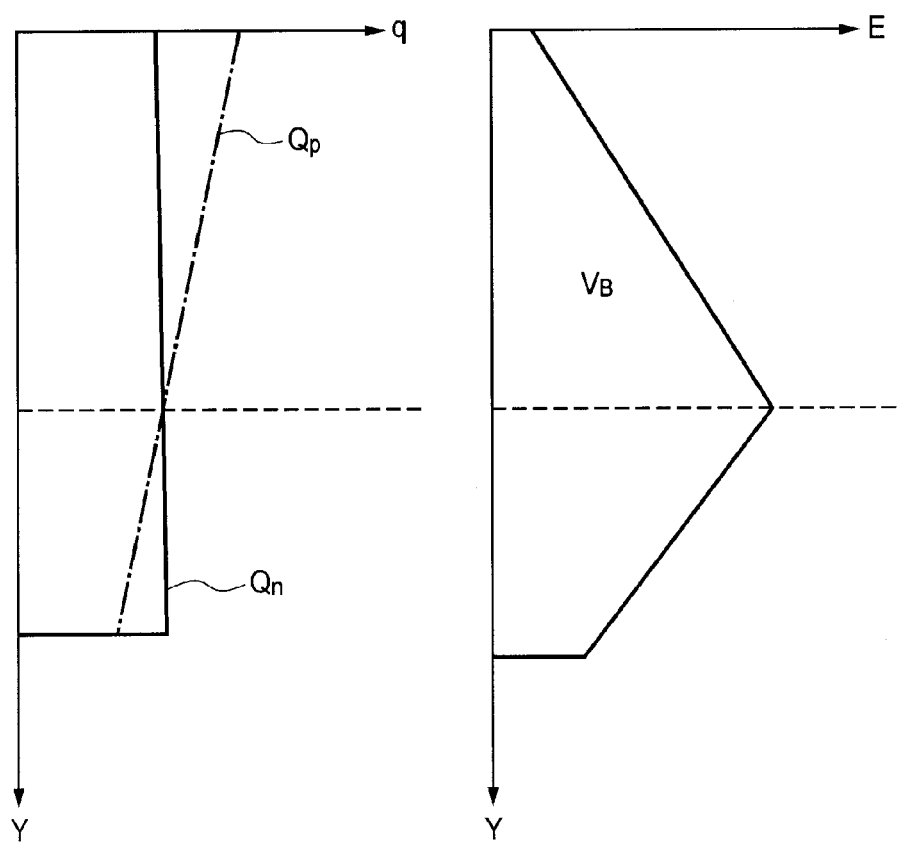
FIG. 6 is an explanatory drawing indicating the relation between charge balance in the direction of depth and breakdown voltage in the vicinity of the wide p-type column region 9b in FIG. 4 or FIG. 5.
Figure 7:
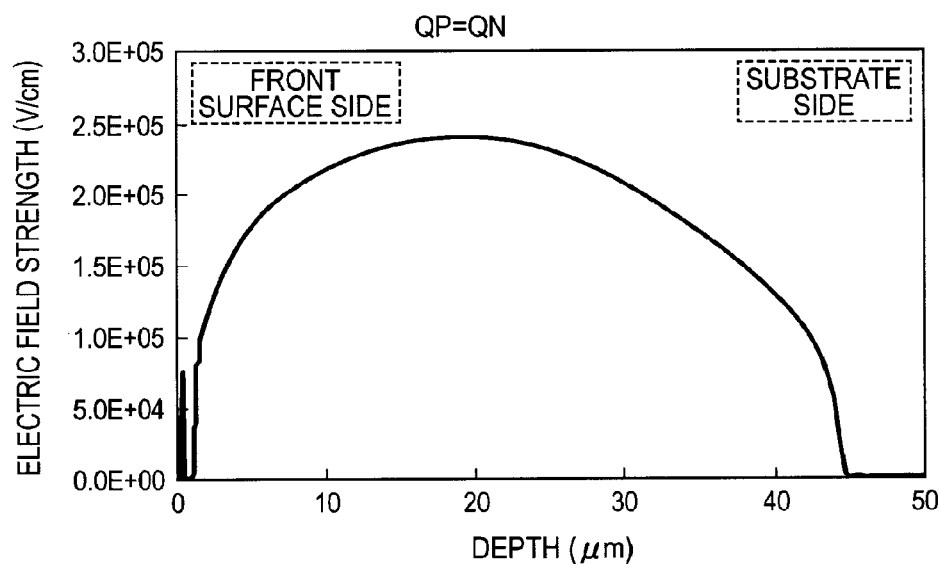
FIG. 7 is a simulation result plot chart indicating the relation between an ordinary charge balance state (Qp=Qn) in such a superjunction structure as illustrated in FIG. 1 to FIG. 5 and the electric field strength distribution in a drift region.
Figure 8:
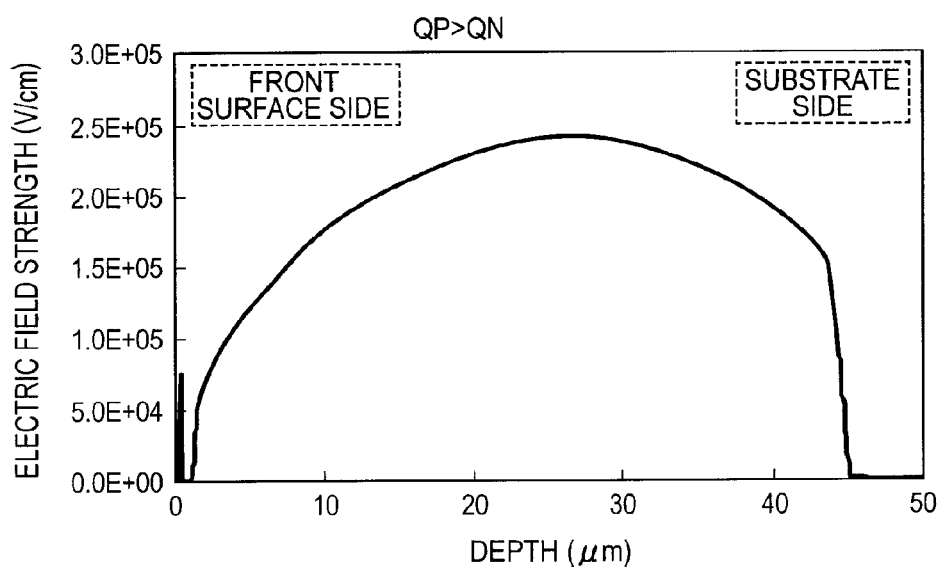
FIG. 8 is a simulation result plot chart indicating the relation between an ordinary charge balance state (Qp>Qn) in such a superjunction structure as illustrated in FIG. 1 to FIG. 5 and the electric field strength distribution in a drift region.
Figure 9:
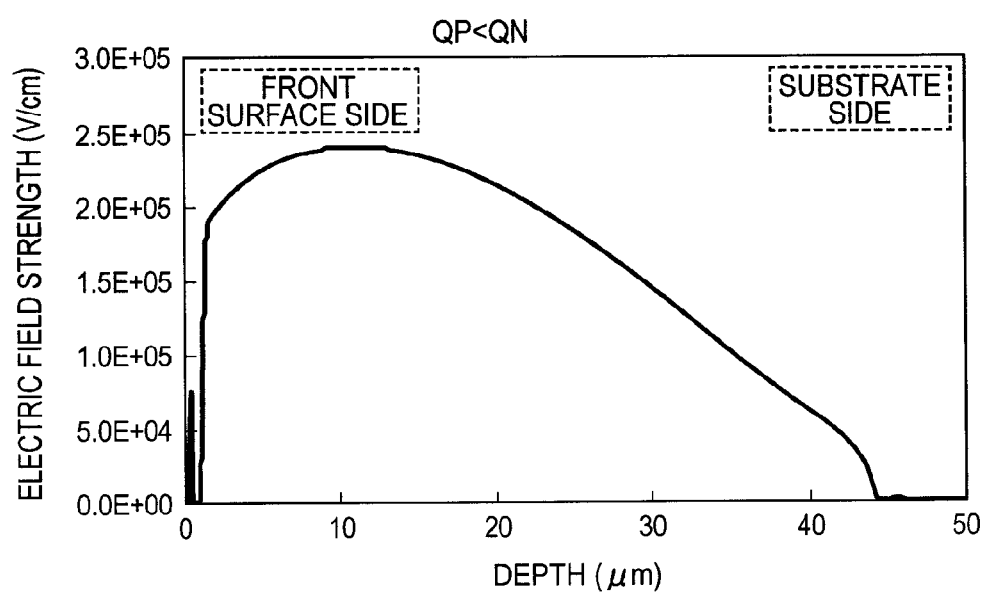
FIG. 9 is a simulation result plot chart indicating the relation between an ordinary charge balance state (Qp<Qn) in such a superjunction structure as illustrated in FIG. 1 to FIG. 5 and the electric field strength distribution in a drift region.
Figure 10:
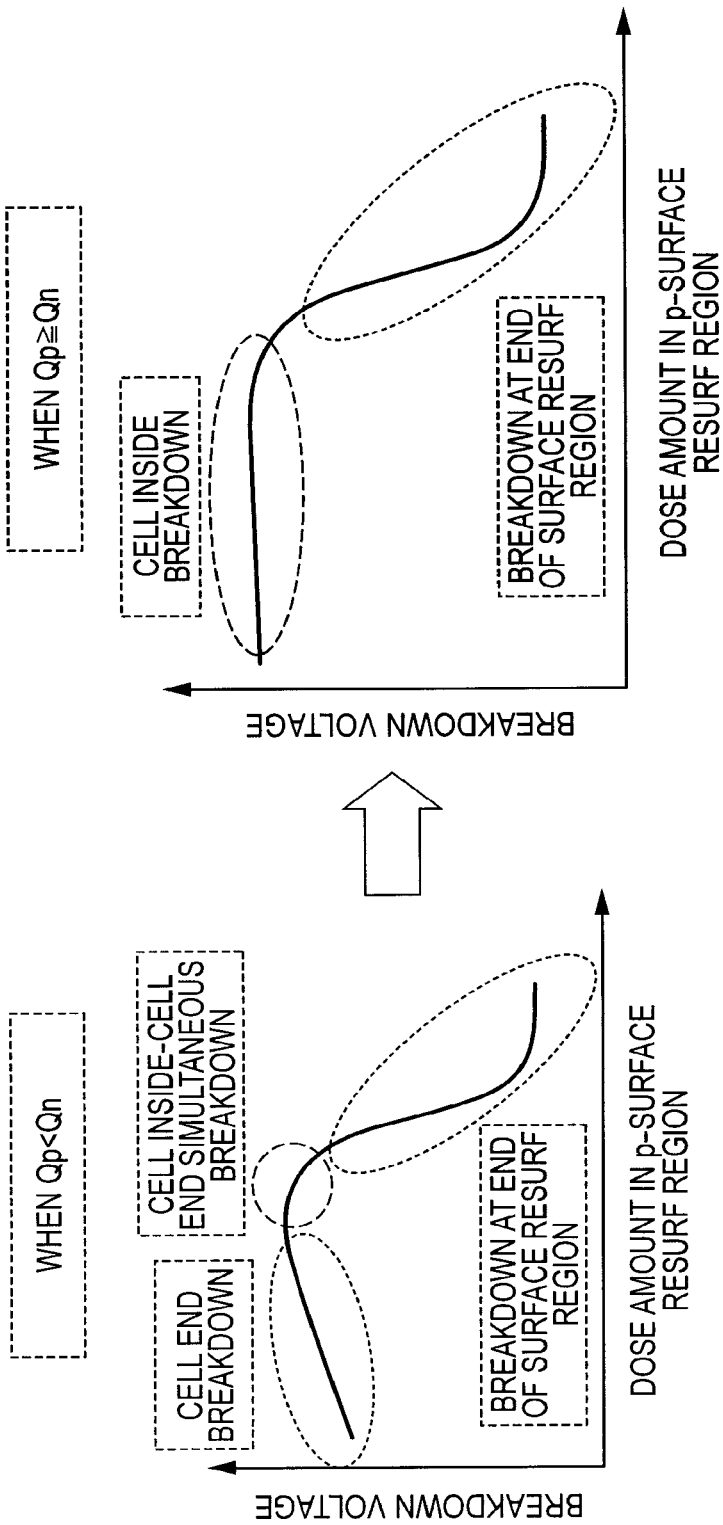
FIG. 10 is an explanatory drawing illustrating an advantage obtained when an ordinary charge balance state (Qp≥Qn) is obtained in such a superjunction structure as illustrated in FIG. 1 to FIG. 5.

FIG. 1 is an overall plan layout diagram of a chip upper surface in the device structure (basic structure: single line wide column type) of a power MOSFET as an example of a semiconductor device in the first embodiment of the invention. FIG. 2 is a plan layout diagram of p-type column regions in an entire chip surface, corresponding to FIG. 1. FIG. 3 is an enlarged plan view of a chip corner portion CR in FIG. 2. FIG. 4 is a device sectional view corresponding to the section taken along line A-A' of FIG. 3. FIG. 5 is a device sectional view corresponding to the section taken along line B-B' of FIG. 3. FIG. 6 is an explanatory drawing indicating the relation between charge balance in the direction of depth and breakdown voltage in the vicinity of the wide p-type column region $9b$ in FIG. 4 or FIG. 5. FIG. 7 is a simulation result plot chart indicating an ordinary charge balance state (Qp=Qn) in such a superjunction structure as illustrated in FIG. 1 to FIG. 5 and the electric field strength distribution in a drift region. FIG. 8 is a simulation result plot chart indicating the relation between an ordinary charge unbalance state (Qp>Qn) in such a superjunction structure as illustrated in FIG. 1 to FIG. 5 and the electric field strength distribution in a drift region. FIG. 9 is a simulation result plot chart indicating the relation between an ordinary charge unbalance state (Qp<Qn) in such a superjunction structure as illustrated in FIG. 1 to FIG. 5 and the electric field strength distribution in a drift region. FIG. 10 is an explanatory drawing illustrating an advantage obtained when an ordinary charge unbalance state (Qp≥Qn) is obtained in such a superjunction structure as illustrated in FIG. 1 to FIG. 5. Description will be given to the device structure (basic structure: single line wide column type) of a power MOSFET as an example of a semiconductor device in the first embodiment of the invention.

First, description will be given to the overall layout of a chip (single or complex power active device) with reference to FIG. 1. As illustrated in FIG. 1, a guard ring 3 is provided in the peripheral portion of a chip 2 (the principal part thereof is a silicon member). (The area outside the guard ring is the outermost peripheral $p^+$-type region 7.) A gate metal electrode 4 is provided inside the guard ring. A source metal electrode 5 occupies the central part of the chip 2 and an active cell region 6 is formed in substantially the whole area under the source metal electrode 5.

FIG. 2 is a planar structural drawing of a semiconductor substrate surface region under the source metal electrode 5 of the chip 2 illustrated in FIG. 1. As illustrated in FIG. 2 (Refer to FIG. 4, FIG. 5, or the like), the layout of the semiconductor chip 2 as viewed from the device main surface $1a$ side is comprised of the following: a substantially rectangular (square or oblong) active cell region 6 located at the central part; a ring-shaped intermediate region 40 surrounding it; a ring-shaped chip peripheral region 15 located further outside it; and the like. (The semiconductor chip can be reworded as chip region. In this description, a chip 3 millimeters square will be taken as an example.) (The device main surface $1a$ is the surface on the opposite side to the back surface $1b$ of the chip 2.)

This cell region 6 is comprised of: linear repetitive gate electrodes 11 as a principal part of the power MOSFET; p-type body regions 12 provided in the surface region of an n-type silicon epitaxial layer $1n$ so that they surround them; a superjunction structure comprised of a large number of p-type column regions 9 (ordinary p-type column regions $9a$, identical in width); and the like. (The p-type body regions 12 include an annular p-type body region $12p$ surrounding the active cell region 6.) (The n-type silicon epitaxial layer $1n$ is equivalent to an n-type drift region 30, that is, a drift region of a first conductivity type.) (The above superjunction structure is equivalent to the first superjunction structure 41 described with reference to FIG. 3, 4 micrometers or so in column thickness and 6 micrometers or so in column spacing.)

The following are provided on both sides of the active cell region 6 in the annular intermediate region 40 (intermediate region): wide p-type column regions $9b$ and ordinary p-type column regions $9a$ each having the same orientation as that of the first superjunction structure 41; and the like. (Both the p-type column regions $9b$ and the p-type column regions $9a$ are collectively designated as p-type column regions 9 or column regions of a second conductivity type). The following are provided above and below the active cell region 6: wide p-type column regions $9b$ and ordinary p-type column regions $9a$ each having an orientation orthogonal to the first superjunction structure 41; and the like. These wide p-type column regions $9b$ and ordinary p-type column regions $9a$ and the like comprise a second superjunction structure 42.

In the surface of the drift region 30 (refer to FIG. 4, FIG. 5, or the like) of the chip peripheral region 15, there is provided an annular $p^-$-type surface RESURF region 14 (usually, lower in impurity concentration than the p-type body region 12). The $p^-$-type surface RESURF region 14 is so provided that it is coupled with the annular p-type body region $12p$ and surrounds it. (In this example, the wide p-type column region $9b$ is directly coupled with the annular p-type body region $12p$.) In the areas in the chip peripheral region 15 corresponding to both side of the active cell region 6 and corresponding to above and below it, the following are provided: multiple ordinary p-type column region $9a$ and the like respectively having the same orientation as the corresponding second superjunction structure 42. They comprise a third superjunction structure 43. That is, the width of the p-type column regions $9b$ (extraordinary p-type column regions) is larger than that of the principal ordinary p-type column regions $9a$ comprising the first superjunction structure 41 and the third superjunction structure 43.

Description will be given to the details of the layout and the relation with a vertical structure with reference to FIG. 3 illustrating the chip corner portion CR including the upper right end portion of the cell part in FIG. 2 in an enlarged manner. In this layout under the metal electrode, the following measure is taken: it is axisymmetric with respect to the center lines (vertical, horizontal) of the chip and is 180-degree rotationally symmetric with respect to the center of the chip. (In actual chip layout, irregular planar concavities and convexities are often involved because of various reasons.) (Extraction electrodes, source pads, gate pads, or the like do not necessarily have this symmetrical property.) Therefore, when the vicinity of one corner is described, that is substantially equivalent to that substantially the whole of the chip 2 is described. In the following description mainly of plan layout, the vicinity of the upper right part of the chip 2 will be taken as an example. As illustrated in FIG. 3, the wide p-type column regions $9b$ coupled to the cell peripheral body region $12p$ substantially planarly surround the first superjunction structure 41.

FIG. 4 is a device sectional view corresponding to the section taken along line A-A' of FIG. 3 (the section taken along line A-A' of FIG. 1); and FIG. 5 is a device sectional view corresponding to the section taken along line B-B' of FIG. 3. As illustrated in FIG. 4 and FIG. 5, the semiconductor substrate 1 in which this device is formed is obtained by forming an ordinary single n-type silicon epitaxial layer in over an n+-type single crystal silicon substrate 1s (the back surface 1b side of the semiconductor substrate 1). Therefore, the n-type column regions 10 are part of the silicon epitaxial layer 1n (n-type drift region 30). A field insulating film 16 and a gate insulating film 21 are provided on the front surface 1a side of the semiconductor substrate 1 and a polysilicon gate electrode 11 is provided over the gate insulating film 21. An interlayer insulating film 17 is provided so that it covers the field insulating film 16 and the polysilicon gate electrode 11. In the surface region on the front surface 1a side of the semiconductor substrate 1, there is provided an n+-type source region 19 in a self-aligned manner with respect to the polysilicon gate electrode 11. (An n+-type channel stopper region 8 is usually formed at the same time as this step.) In the surface region on the front surface 1a side of the semiconductor substrate 1, there is provided a p+-type body contact region 18 in correspondence with a contact hole formed in the interlayer insulating film 17 in the vicinity of the polysilicon gate electrode 11. The outermost peripheral p+-type region 7 is usually formed at the same time as this step. Further, a guard ring 3, a source metal electrode 5, and the like comprised of a barrier metal film, an aluminum metal electrode film, or the like are formed over the interlayer insulating film 17. The area ranging from the outer half part of the p-type body region 12p(12) at an end of the active cell region 6 to a field plate part 13 is the intermediate region 40. (The field plate part 13 is an electrode kept at a source potential for reducing electric field concentration in the vicinity of the surface of the drift region.) The area located outside the above area is the cell peripheral region 15.

FIG. 6 illustrates the electrical structure of the semiconductor substrate 1 (n-type drift region 30) in the vicinity of the wide p-type column region 9b in the superjunction structure in FIG. 4 and FIG. 5. As shown in FIG. 6, the total charge amount Qp of the p-type column region 9b is larger than the total charge amount Qn of the adjacent n-type column regions 10 in the vicinity of the wide p-type column region 9b. Therefore, the following can be implemented by long-time heat treatment, such as burying epitaxial growth, even when the impurity concentration of the p-type column region 9b located below is relatively reduced: the point at which the charge area density q of each column is substantially equal, that is, the peak of electric field strength E in the drift region in the direction of depth Y can be located in a relatively low position. The area on the left side of the line of flexure indicating the electric field strength E in FIG. 6 is equivalent to the source-drain breakdown voltage $V_B$ of this portion.

FIG. 7 to FIG. 9 show results obtained by simulating the relation between charge balance in a superjunction structure and the electric field strength distribution of the n-type drift region 30 in the direction of depth. As shown in these drawings, the following can be implemented by establishing the relation of total charge amount Qp≥total charge amount Qn: even when various process parameters vary, the point at which the electric field is concentrated (that is, breakdown point) can be shifted from the surface to the internal region.

FIG. 10 shows variation in breakdown voltage and breakdown mode when the dose amount in ion implantation in the p−-type surface RESURF region 14 varies. As shown in FIG. 10 (left side), in such a structure as illustrated in FIG. 1 to FIG. 5, the following takes place when the charge balance in the superjunction is in the relation of total charge amount Qp<total charge amount Qn: even with the best dose amount, the breakdown mode is cell end-cell inside simultaneous breakdown. When the dose amount is shifted to the smaller side, the principal mode is cell end breakdown. When the dose amount is shifted to the larger side, the principal mode is breakdown at an end of the surface RESURF layer.

As shown in FIG. 10 (right side), meanwhile, the following takes place when charge balance in the superjunction is in the relation of total charge amount Qp≥total charge amount Qn: the breadth of the portion in which the principal mode is breakdown at an end of the surface RESURF layer is unchanged; but an ideal cell inside breakdown mode can be established in the other broad portion.

2. Description of the Wafer Process (Mainly by Epitaxy Trench Filling Technique) in a Manufacturing Method for a Semiconductor Device in the First Embodiment of the Invention (Mainly FIG. 11 to FIG. 25)

In this section, the wafer process will be described with the device structure described in Section 1 taken as an example. However, this process is not limited to the above specific structure and can be basically similarly applied to the follow modifications and other embodiments with respect to corresponding portions, needless to add.

Figure 11:
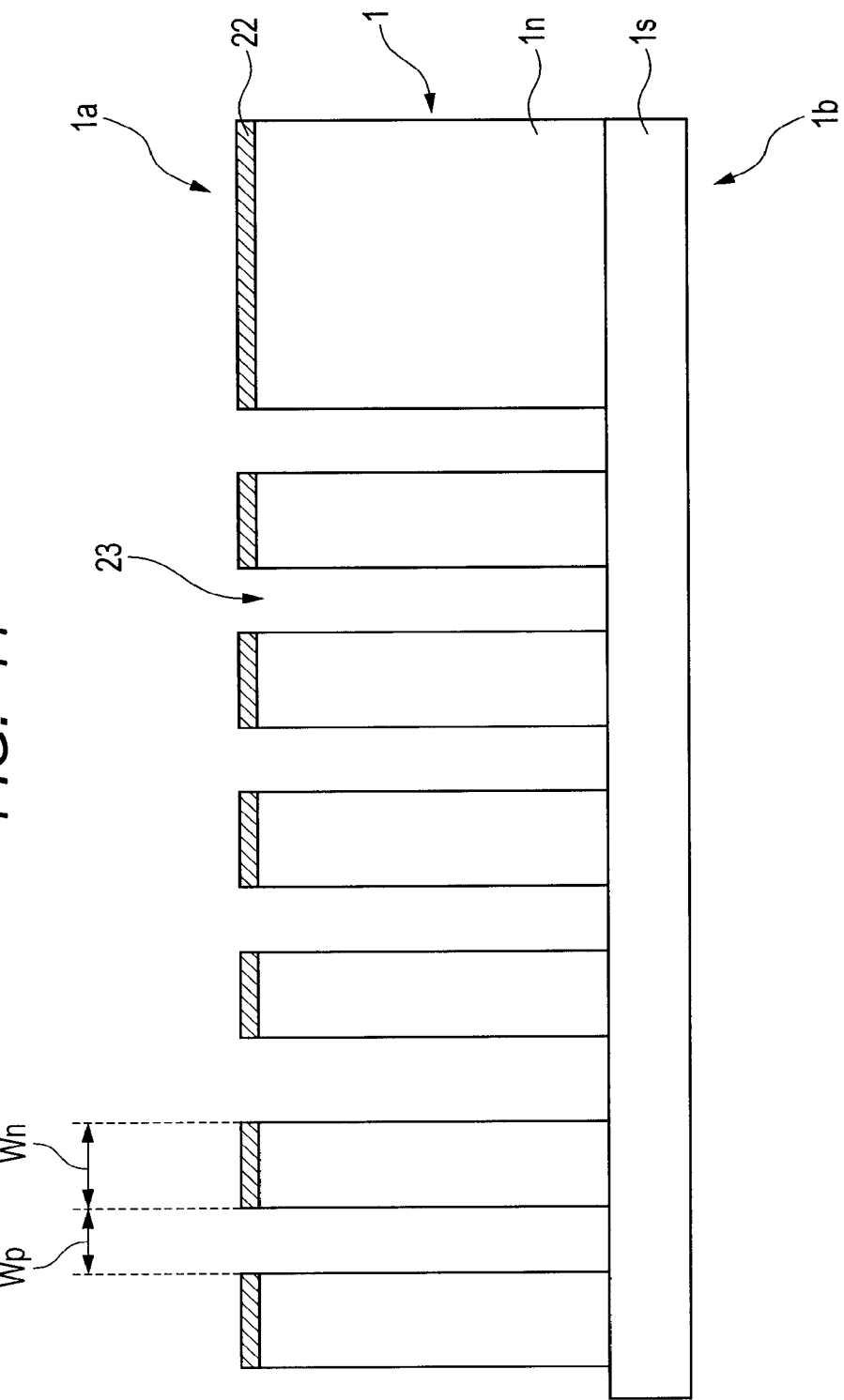
FIG. 11 is a device sectional view illustrating a process flow corresponding to the device section in FIG. 4 (p-type column groove dry etching step)
Figure 12:
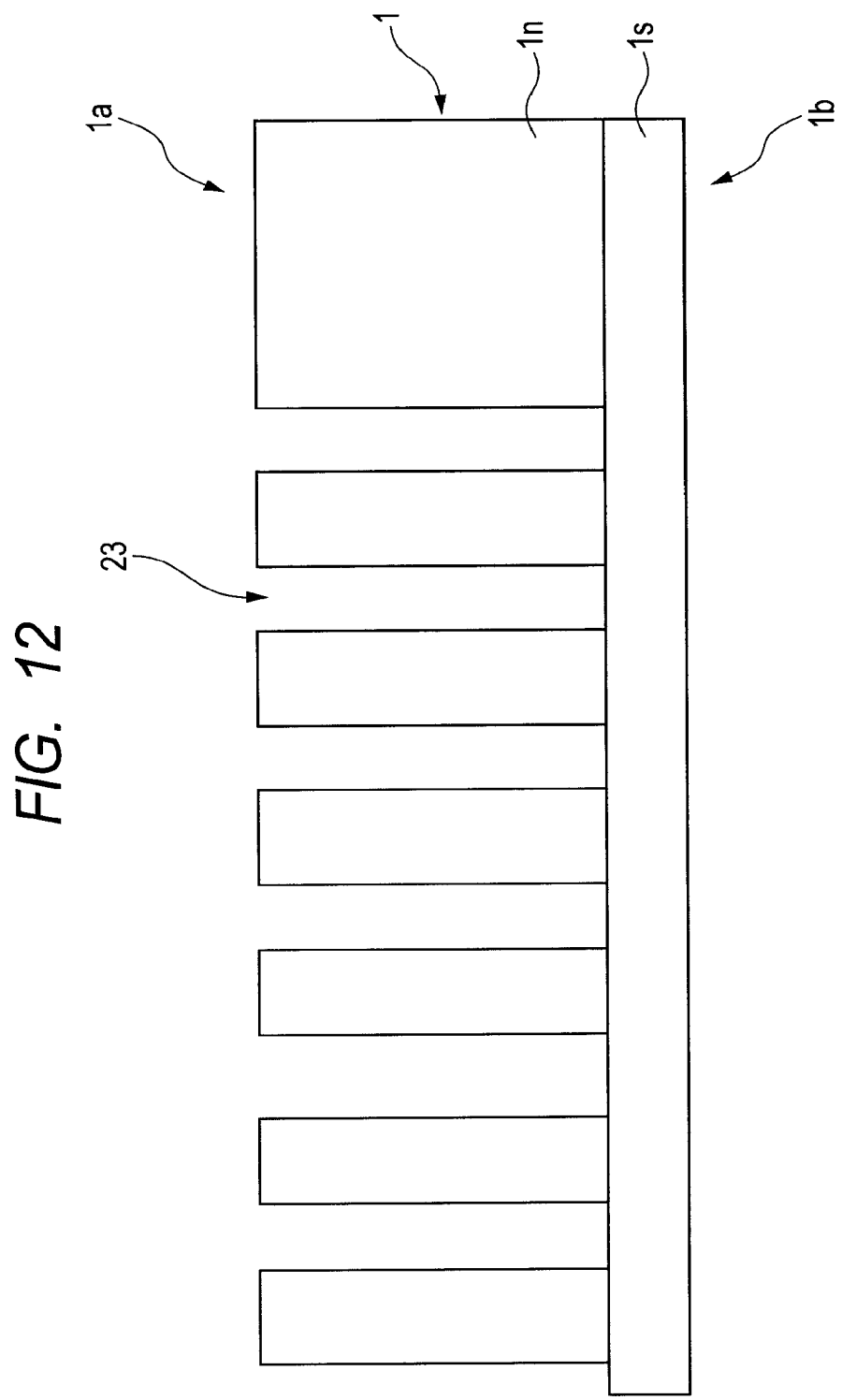
FIG. 12 is a device sectional view illustrating a process flow corresponding to the device section in FIG. 4 (step of removing hard mask for p-type column groove dry etching)
Figure 13:
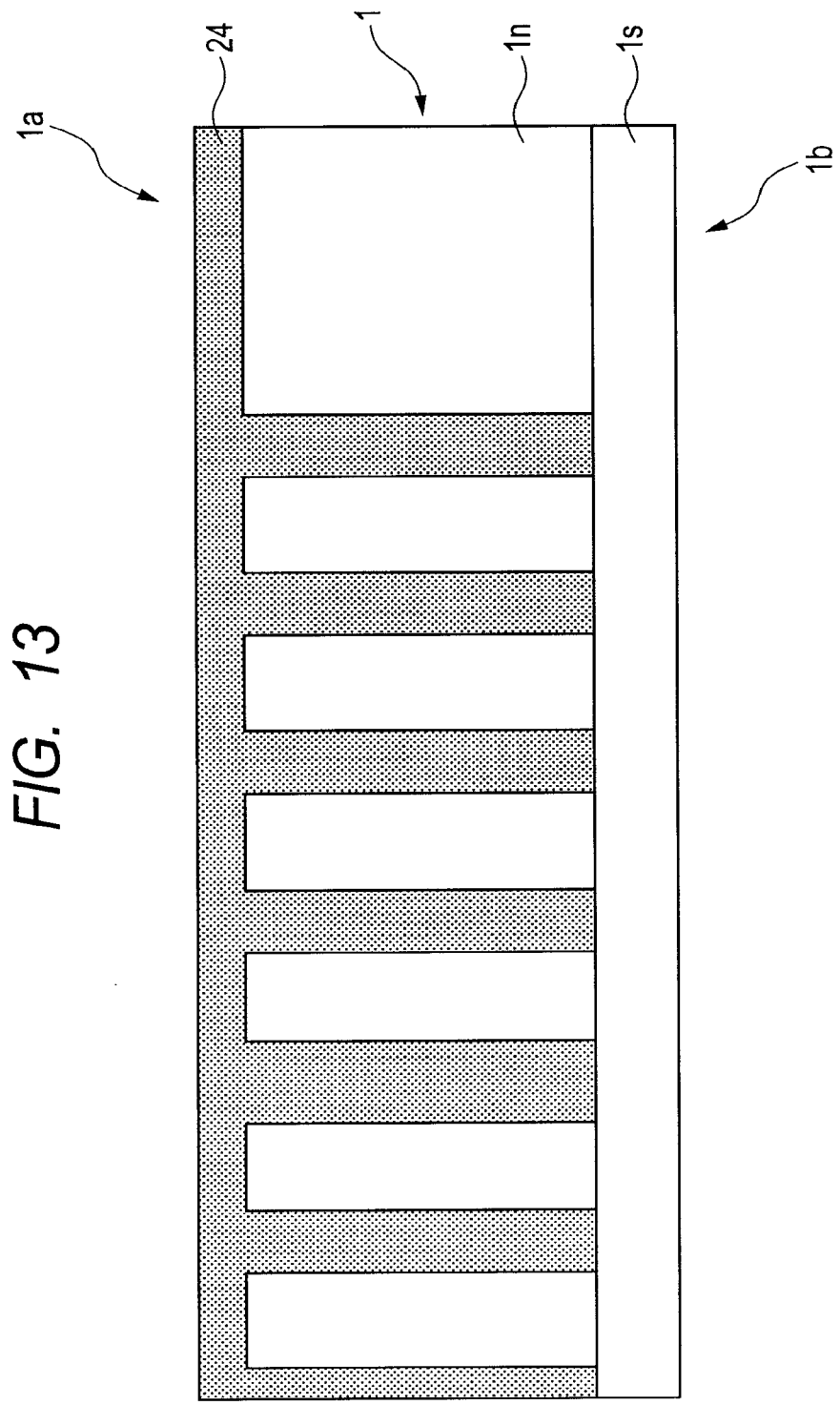
FIG. 13 is a device sectional view illustrating a process flow corresponding to the device section in FIG. 4 (epitaxy trench filling step)
Figure 14:
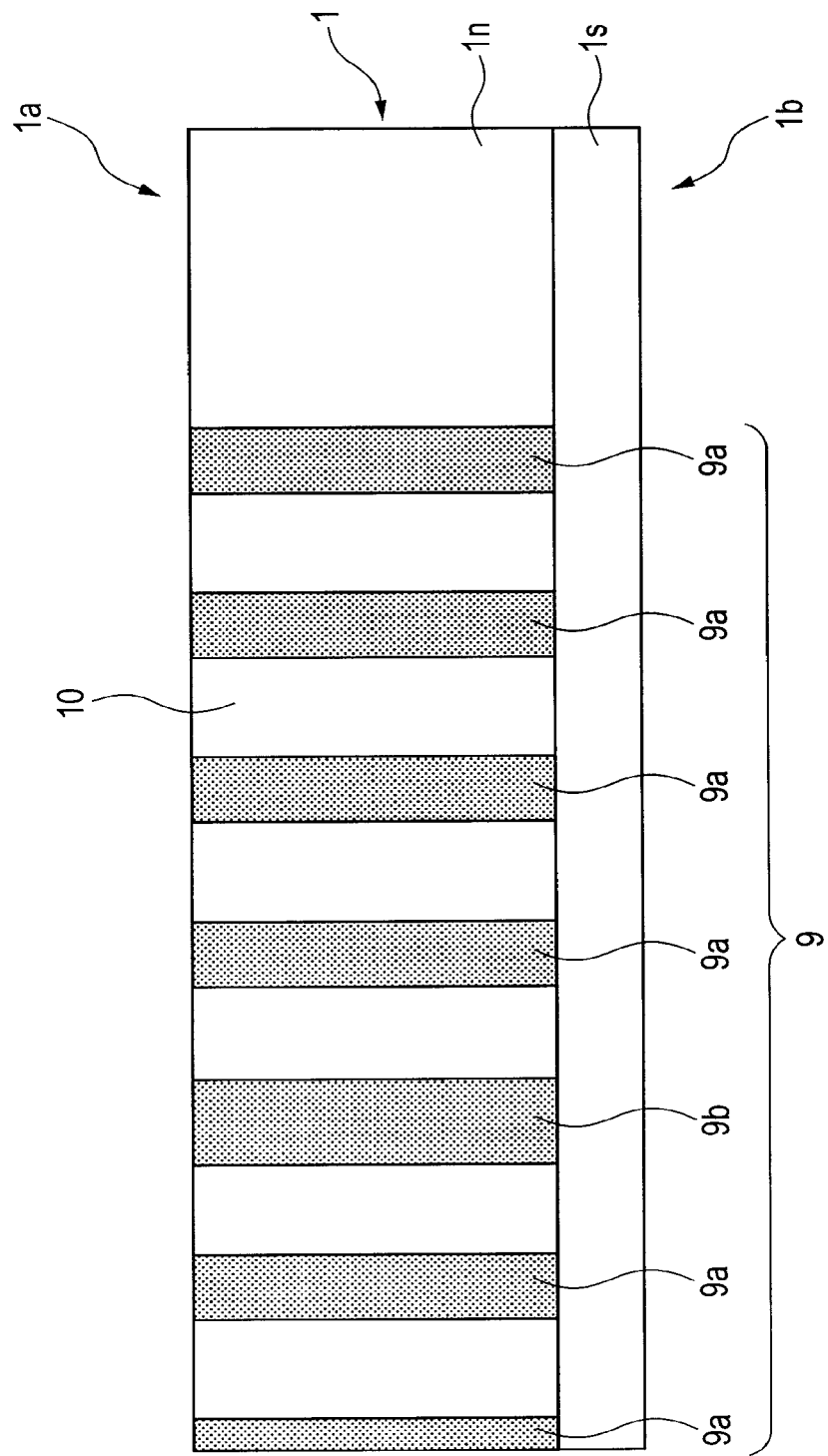
FIG. 14 is a device sectional view illustrating a process flow corresponding to the device section in FIG. 4 (planarization step)
Figure 15:
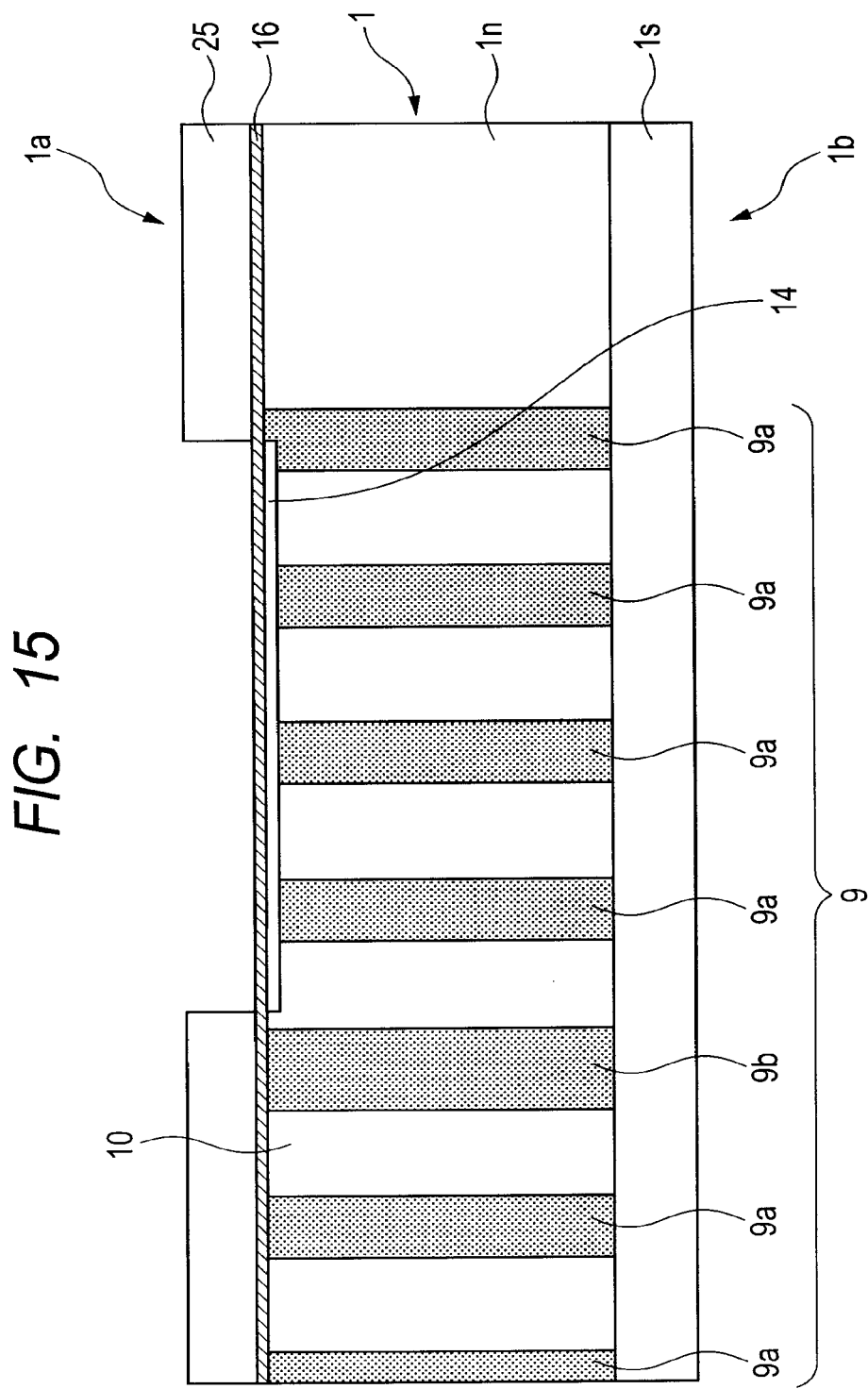
FIG. 15 is a device sectional view illustrating a process flow corresponding to the device section in FIG. 4 ($p^-$-type RESURF region introduction step)
Figure 16:
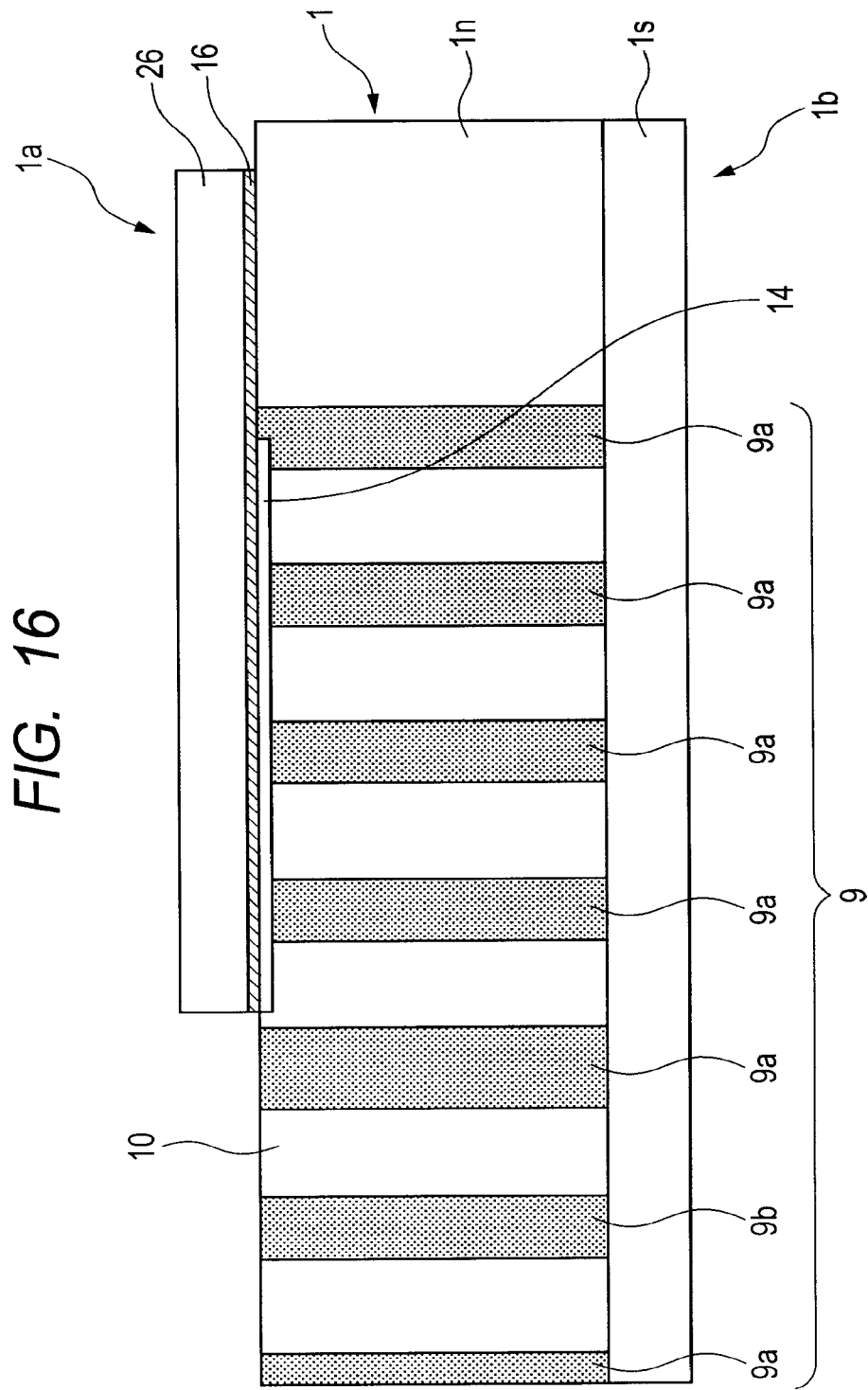
FIG. 16 is a device sectional view illustrating a process flow corresponding to the device section in FIG. 4 (field insulating film etching step)
Figure 17:
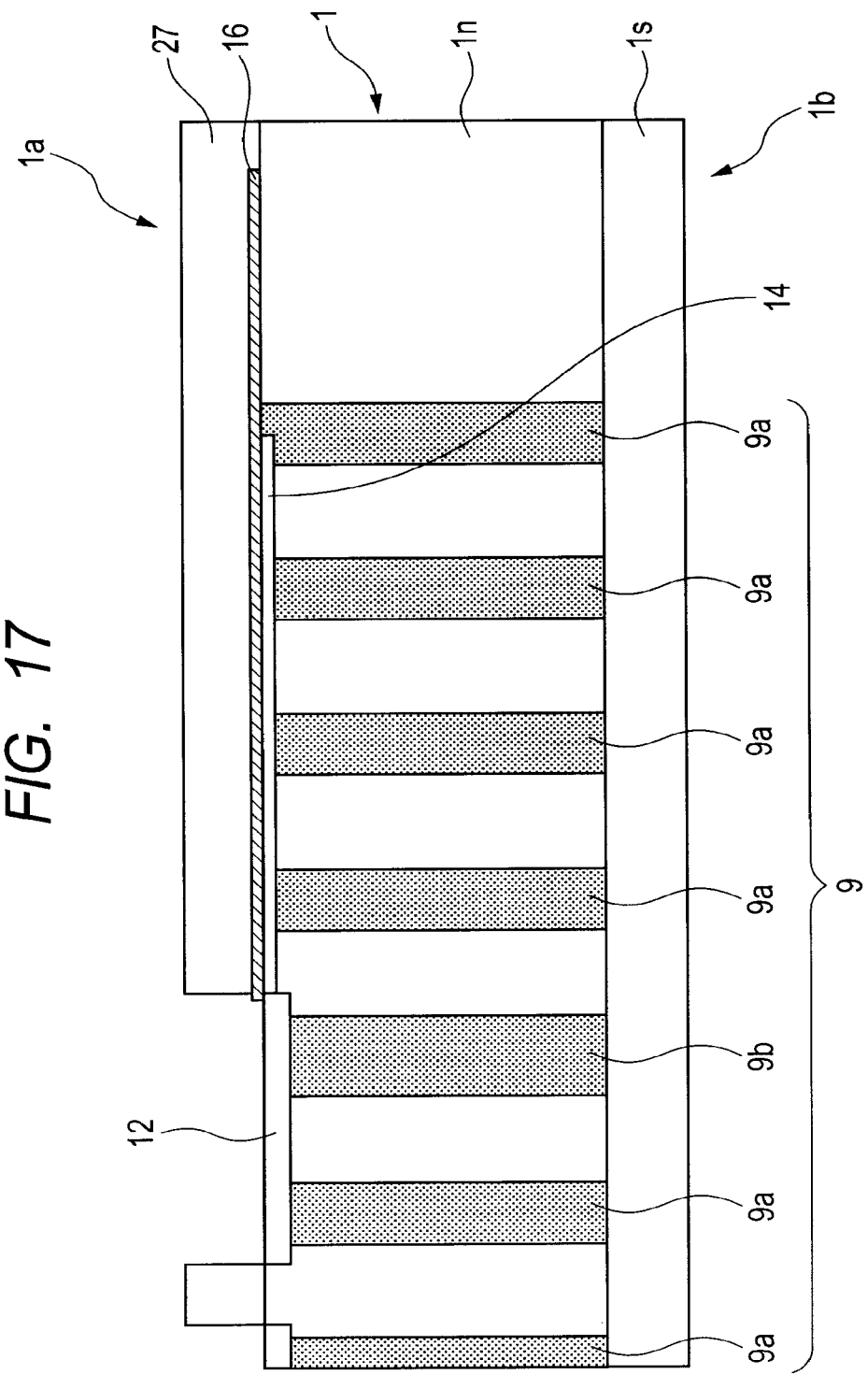
FIG. 17 is a device sectional view illustrating a process flow corresponding to the device section in FIG. 4 (p-type body region introduction step)
Figure 18:
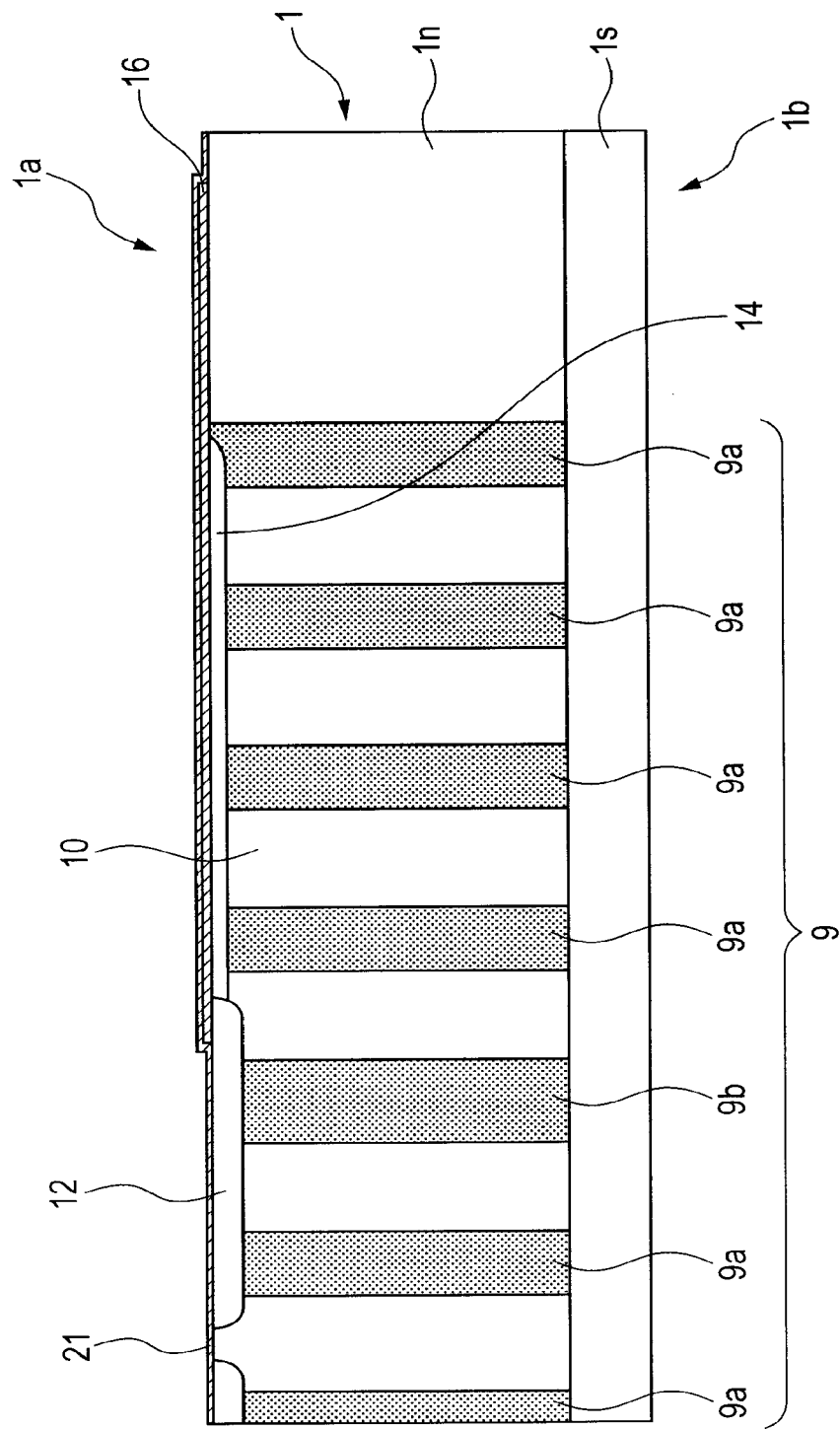
FIG. 18 is a device sectional view illustrating a process flow corresponding to the device section in FIG. 4 (gate oxidation step)
Figure 19:
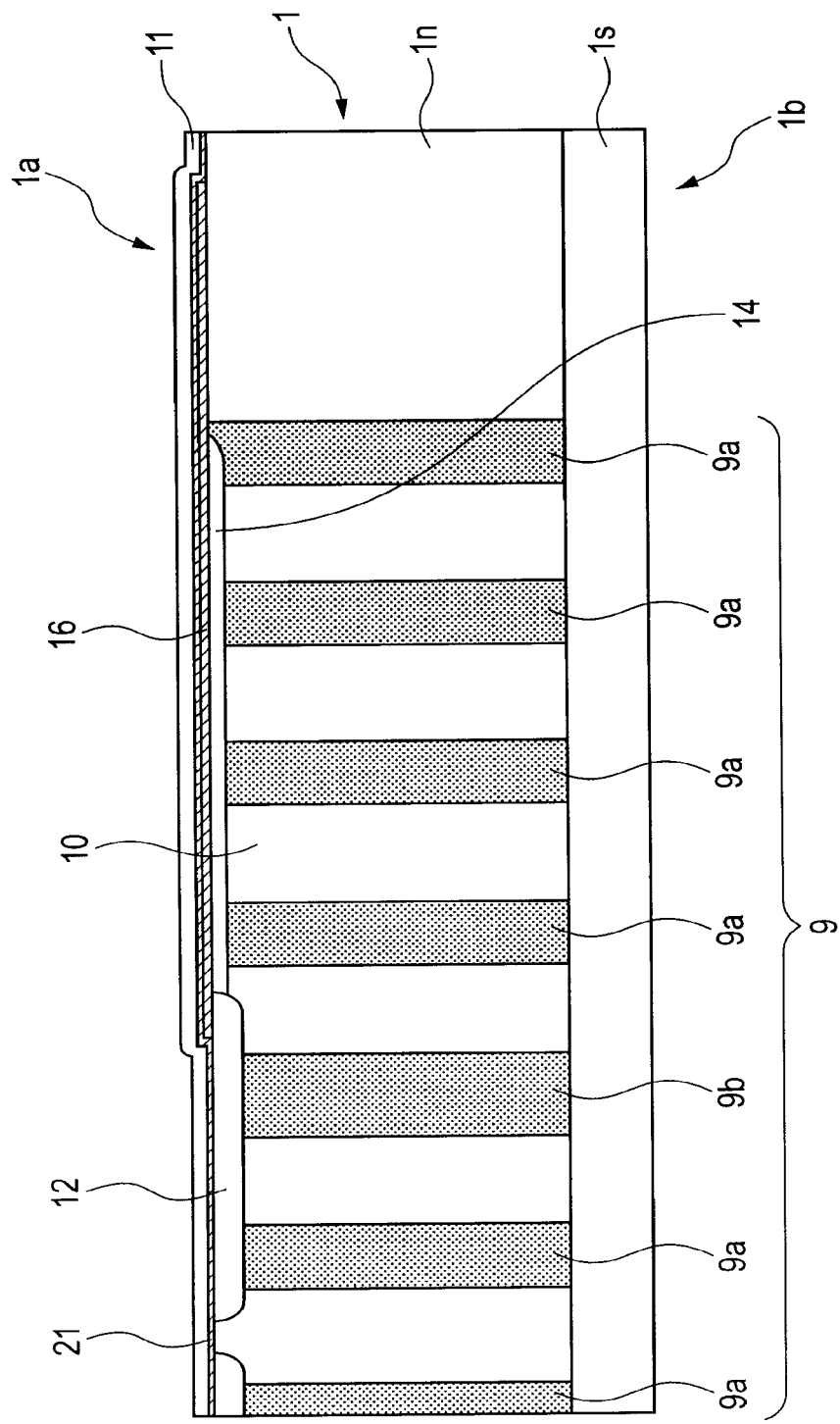
FIG. 19 is a device sectional view illustrating a process flow corresponding to the device section in FIG. 4 (gate polysilicon film formation step)
Figure 20:
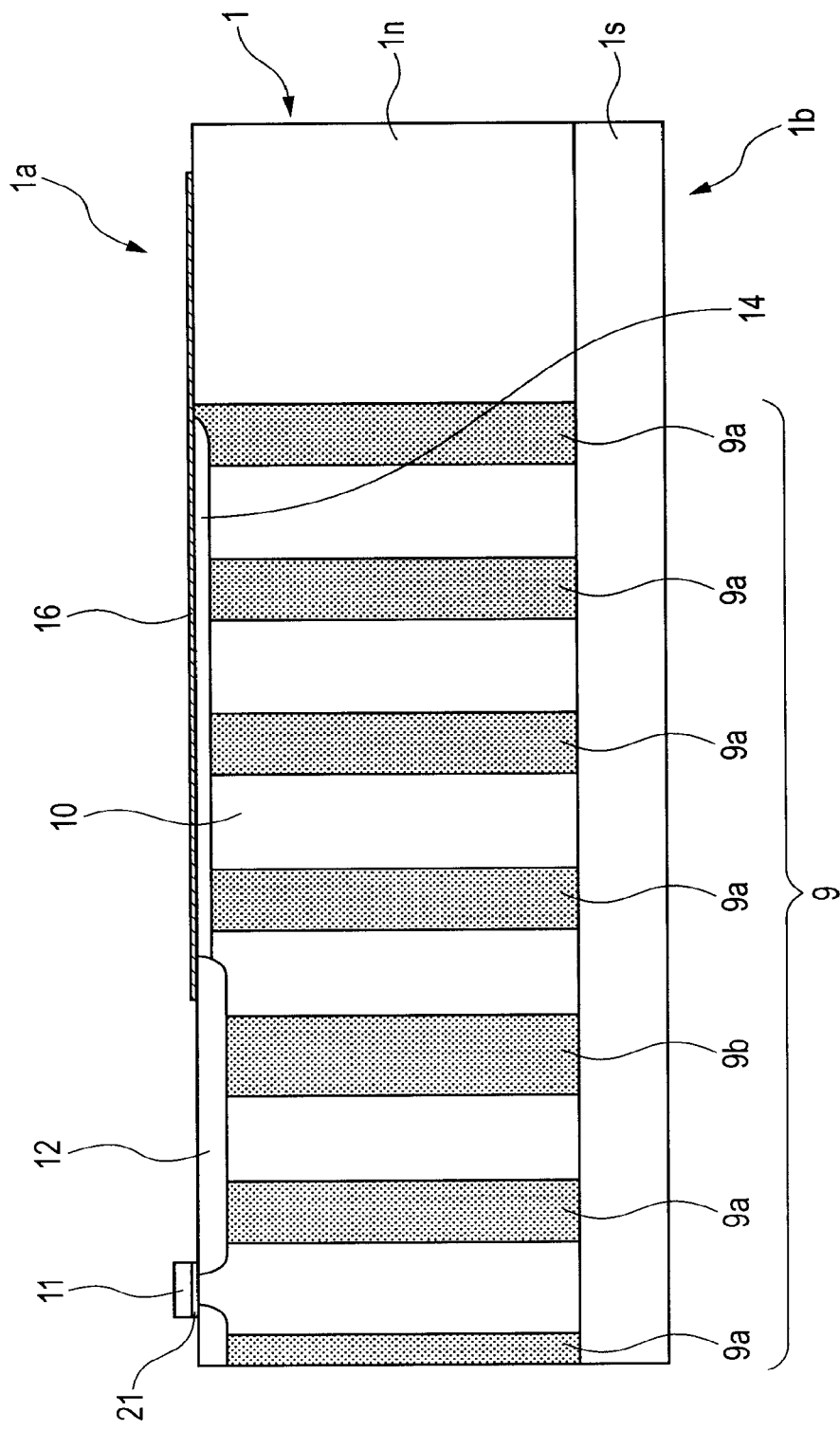
FIG. 20 is a device sectional view illustrating a process flow corresponding to the device section in FIG. 4 (gate polysilicon film patterning step)
Figure 21:
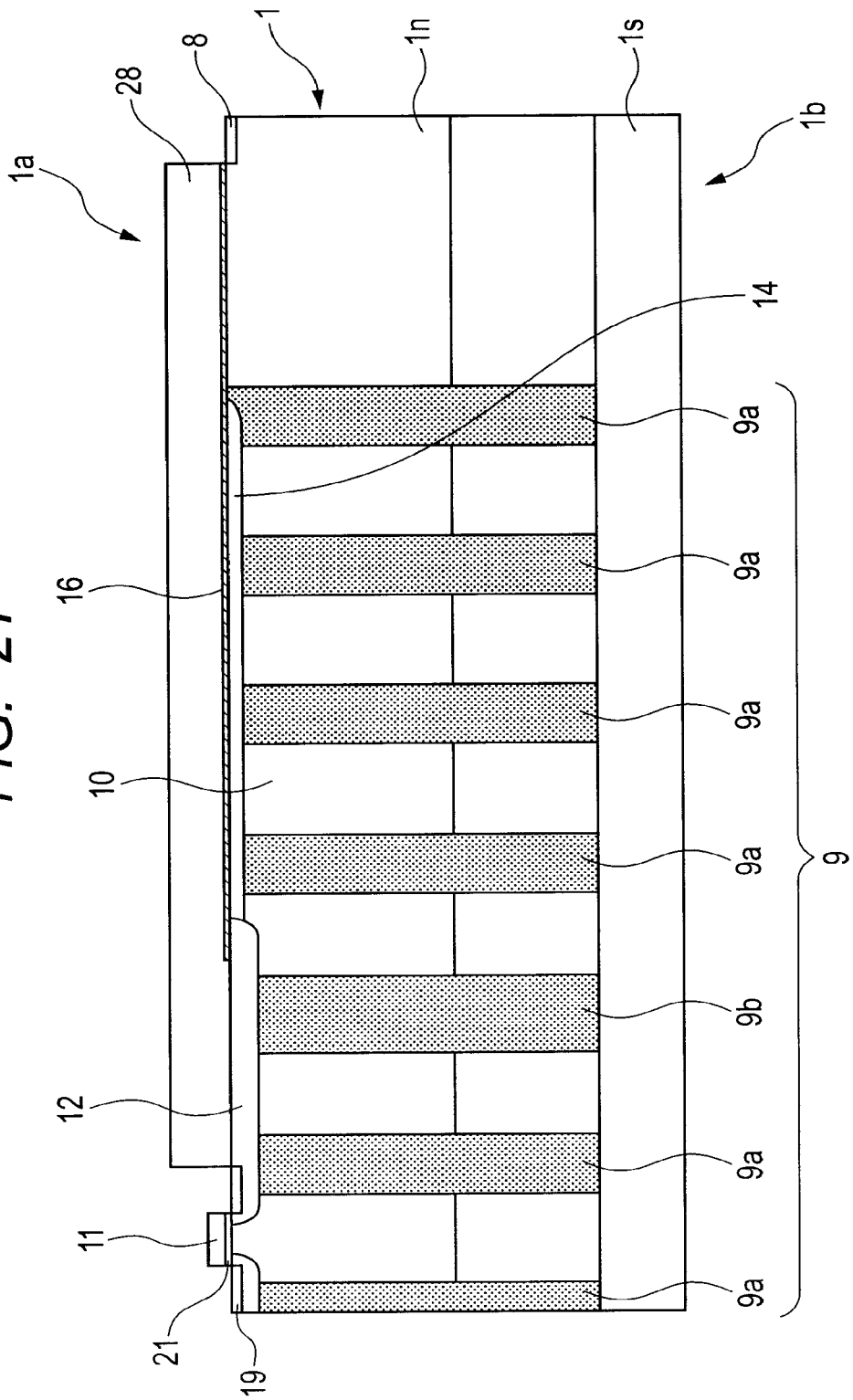
FIG. 21 is a device sectional view illustrating a process flow corresponding to the device section in FIG. 4 ($n^+$-type source region introduction step)
Figure 22:
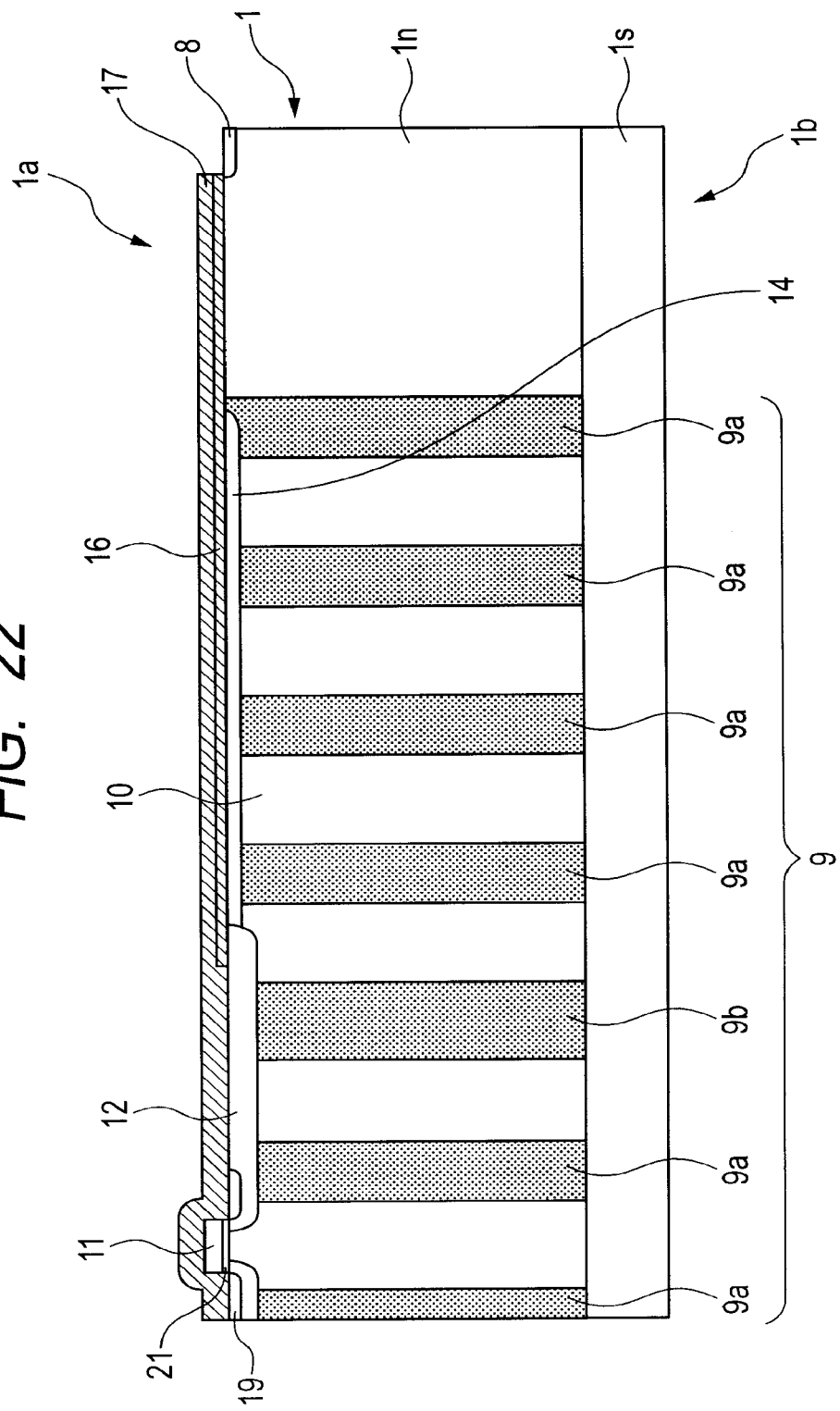
FIG. 22 is a device sectional view illustrating a process flow corresponding to the device section in FIG. 4 (interlayer insulating film formation step)
Figure 23:
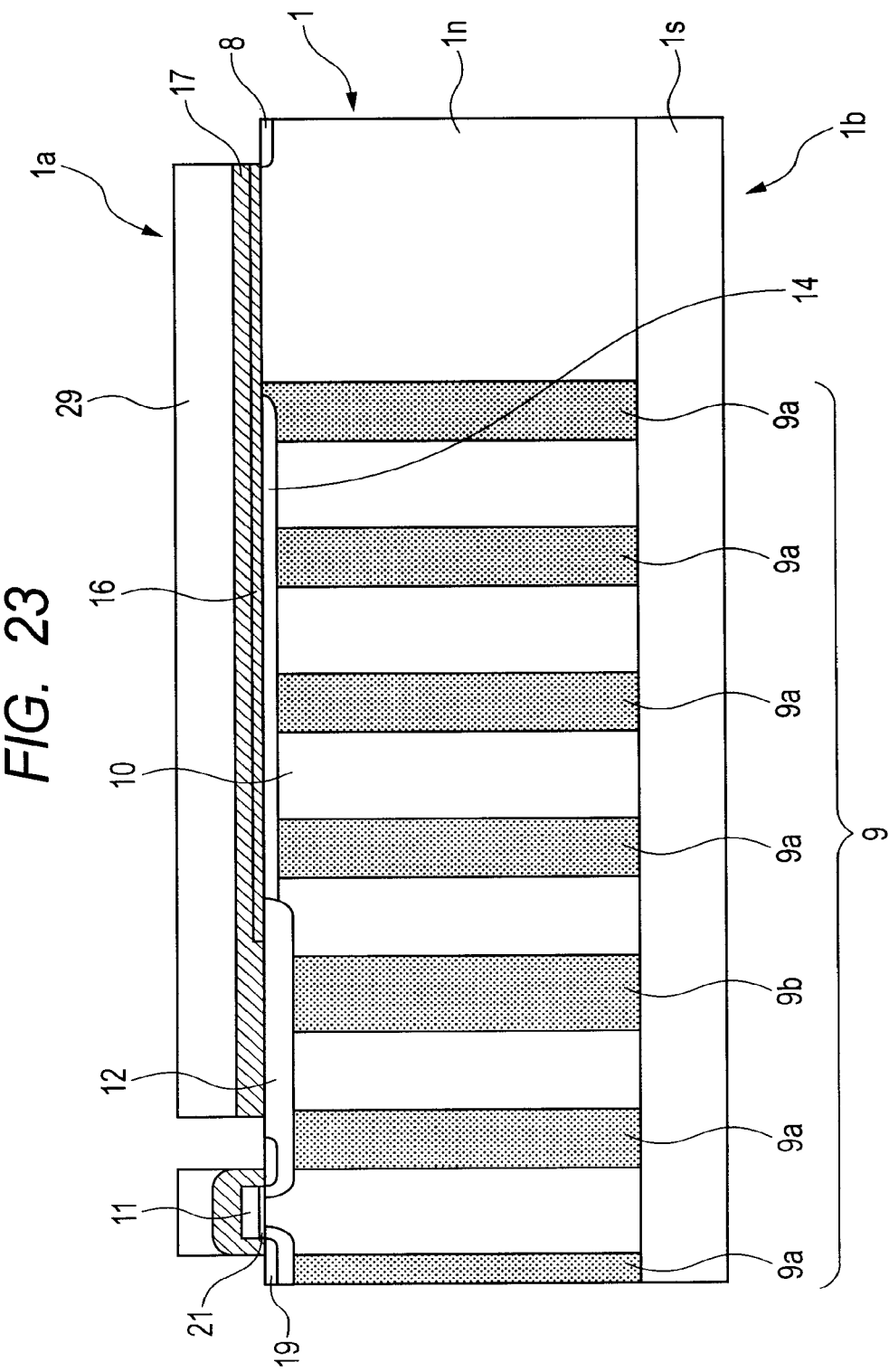
FIG. 23 is a device sectional view illustrating a process flow corresponding to the device section in FIG. 4 (contact hole formation step)
Figure 25:
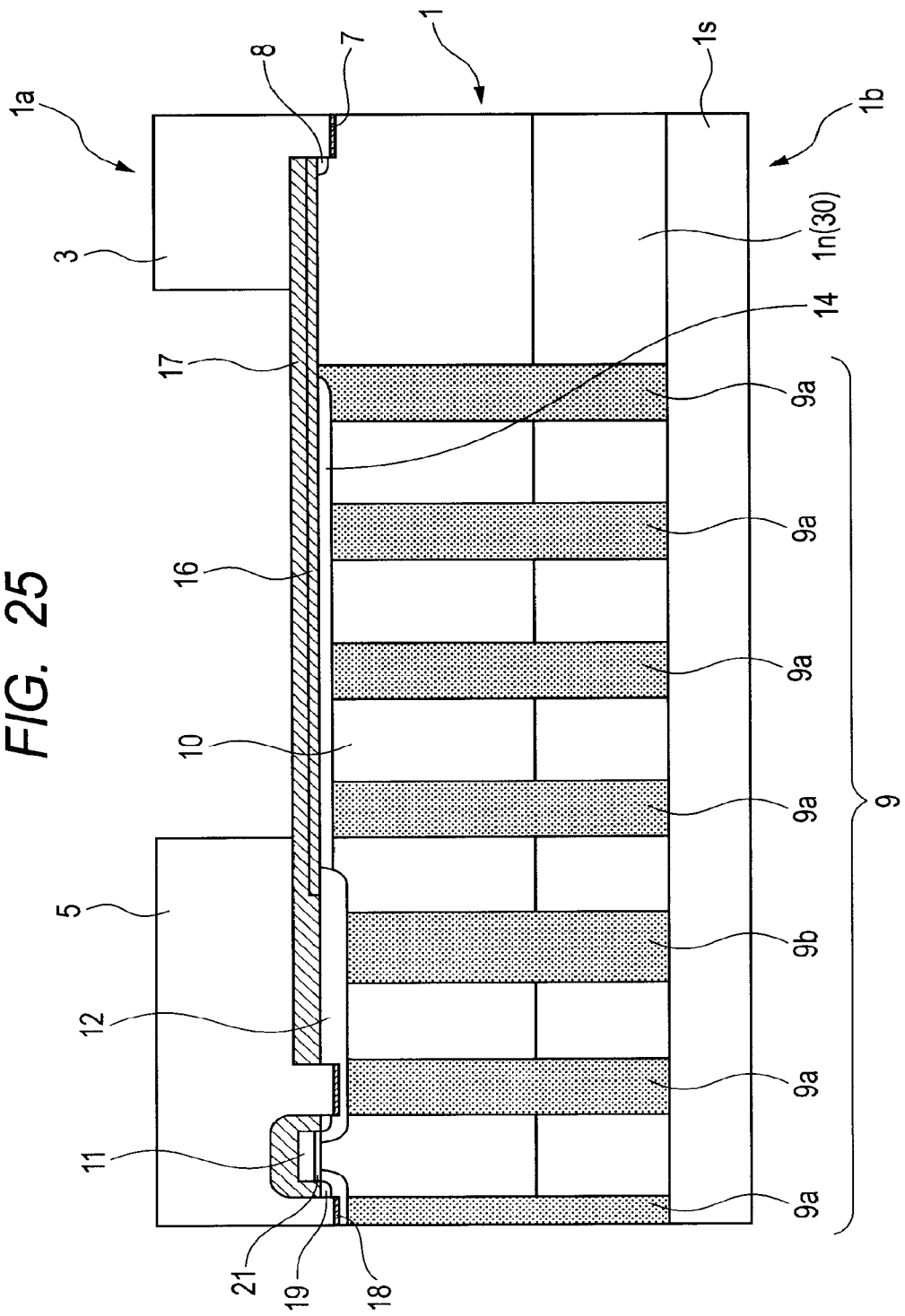
FIG. 25 is a device sectional view illustrating a process flow corresponding to the device section in FIG. 4 (aluminum metal electrode formation step)

FIG. 11 is a device sectional view illustrating a process flow corresponding to the device section in FIG. 4 (p-type column groove dry etching step). FIG. 12 is a device sectional view illustrating the process flow corresponding to the device section in FIG. 4 (step of removing hard mask for p-type column groove dry etching). FIG. 13 is a device sectional view illustrating the process flow corresponding to the device section in FIG. 4 (epitaxy trench filling step). FIG. 14 is a device sectional view illustrating the process flow corresponding to the device section in FIG. 4 (planarization step). FIG. 15 is a device sectional view illustrating the process flow corresponding to the device section in FIG. 4 (p−-type RESURF region introduction step). FIG. 16 is a device sectional view illustrating the process flow corresponding to the device section in FIG. 4 (field insulating film etching step). FIG. 17 is a device sectional view illustrating the process flow corresponding to the device section in FIG. 4 (p-type body region introduction step). FIG. 18 is a device sectional view illustrating the process flow corresponding to the device section in FIG. 4 (gate oxidation step). FIG. 19 is a device sectional view illustrating the process flow corresponding to the device section in FIG. 4 (gate polysilicon film formation step). FIG. 20 is a device sectional view illustrating the process flow corresponding to the device section in FIG. 4 (gate polysilicon film patterning step). FIG. 21 is a device sectional view illustrating the process flow corresponding to the device section in FIG. 4 (n+-type source region introduction step). FIG. 22 is a device sectional view illustrating the process flow corresponding to the device section in FIG. 4 (interlayer insulating film formation step). FIG. 23 is a device sectional view illustrating the process flow corresponding to the device section in FIG. 4 (contact hole formation step). FIG. is a device sectional view illustrating the process flow corresponding to the device section in FIG. 4 (p+-type body contact region introduction step). FIG. 25 is a device sectional view illustrating the process flow corresponding to the device section in FIG. 4 (aluminum metal electrode formation step). Description will be given to the wafer process (mainly by an epitaxy trench filling technique) in a manufacturing method for a semiconductor device in the first embodiment of the invention with reference to these drawings.

First, as illustrated in FIG. 11, a semiconductor wafer 1 in which an n-epitaxial layer 1n, 50 micrometers or so in thickness, doped with phosphorus is formed over an n$^+$-silicon single crystal substrate is doped with antimony is prepared. (Antimony is doped to the order of, for example, $10^{18}$ to $10^{19}$/cm$^3$.) (In this example, the n$^+$-silicon single crystal substrate 1s, for example, a 200φ-wafer. The wafer diameter may be 150φ, 300φ, or 450φ.) (In terms of device, the n-epitaxial layer in is a region to be a drift region and the concentration is, for example, $3\times10^{15}$/cm$^3$ or so in phosphorus concentration.) A hard mask film 22 for forming trenches for p-type columns comprised of, for example, P-TEOS (Plasma-Tetraethylorthosilicate) or the like is formed over the device surface 1a (main surface on the opposite side to the back surface 1b) of the semiconductor wafer 1. The width Wn of the n-type column region 10 at the patterning level is, for example, 6 micrometers or so and the width Wp of the ordinary p-type column region 9a is, for example, 4 micrometers or so. (That is, the pitch of the superjunction is 10 micrometers or so.) Subsequently, the n-epitaxial layer 1n and the like are subjected to anisotropic dry etching with the hard mask film 22 for forming trenches for p-type columns used as a mask. (The hard mask film 22 is, for example, a plasma TEOS film, a silicon nitride film, or a laminated film of them and an example of its thickness is 1.5 micrometers or so.) (An example of the gas atmosphere is a mixed atmosphere of Ar, SF$_6$, O$_2$, and the like and an example of the etching depth is 50 micrometers or so.) Trenches 23 for p-type columns are thereby formed.

Subsequently, the hard mask film 22 that became unnecessary is removed as illustrated in FIG. 12.

Subsequently, as illustrated in FIG. 13, burying epitaxial growth is carried out on the trenches 23 for p-type columns to form a p-type burying epitaxial layer 24. (The boron concentration is, for example, $5\times10^{15}$/cm$^3$ or so.) Examples of the source gas for burying epitaxial growth are silicon tetrachloride, trichlorosilane, dichlorosilane, and monosilane. An example of the preferable range of processing atmospheric pressure is 10 kPa to 110 kPa or so.

Subsequently, as illustrated in FIG. 14, the p-type burying epitaxial layer 24 located outside the trenches 23 for p-type columns (FIG. 13) is removed by a planarization step, for example, CMP (Chemical Mechanical Polishing). Then the front surface 1a of the semiconductor wafer 1 is planarized.

Subsequently, as illustrated in FIG. 15, a silicon oxide film 16 is formed over substantially the entire front surface 1a of the semiconductor wafer 1 by thermal oxidation. (The silicon oxide film 16 is a field oxide film and its thickness is, for example, 350 nm or so.) A resist film 25 for introducing a p$^-$-type RESURF region is formed thereover by lithography. Subsequently, a p$^-$-type surface RESURF region 14 is introduced by ion implantation with the resist film 25 for introduction a p$^-$-type RESURF region used as a mask. (The dopant is, for example, boron; the dose amount is, for example, $1\times10^{11}$ to $1\times10^{12}$/cm$^2$ or so; and the implantation energy is, for example, 200 keV or so.) Thereafter, the resist film 25 that became unnecessary is entirely removed.

Subsequently, as illustrated in FIG. 16, a resist film 26 for field insulating film processing is formed over the field oxide film 16 by lithography and using it as a mask, the edge portions, active cell region 6, and the like of the chip are exposed. Thereafter, the resist film 26 that became unnecessary is entirely removed.

Subsequently, as illustrated in FIG. 17, a resist film 27 for p-type body region introduction is formed over the front surface 1a of the semiconductor wafer 1 by lithography. Using this film as a mask, a p-type body region 12 is introduced by ion implantation (the dopant is boron). This ion implantation is carried out in two steps described below, for example. At the first step, implantation is carried out at, for example, 200 keV on the order of $10^{13}$/cm$^2$ and at the subsequent step, or the second step, implantation is carried out at, for example, 75 keV on the order of $10^{12}$/cm$^2$.

According to the non-self-alignment p-type body region introduction process used here, the portion to be a gate electrode has been already recessed to 1 micrometer or so at the time of doping. Therefore, it is possible to reduce the burden on the subsequent heat treatment. As a result, it is possible to reduce unwanted variation in the impurity distribution of the superjunction. However, as the result of the depth of the p-type body region 12 being reduced, breakdown voltage may be reduced as aside-effect. To avoid this problem, the ion implantation in the p-type body region 12 is carried out in two steps as mentioned above.

As mentioned above, the p-type body region 12 of the second conductivity type is introduced before the formation of a gate polysilicon film. Thus the introduced portion is not limited by the width or position of the gate and it can be introduced in the optimum position. This makes it possible to reduce the burden on the subsequent heat treatment and, in addition, use the subsequent heat treatment (including the formation of a gate polysilicon film and the like) in a shared manner. This non-self-alignment p-type body region introduction process is applicable to not only cases where the ordinary epitaxy layer as the base for superjunction formation is of single layer but also cases where it is of multilayer.

Subsequently, as illustrated in FIG. 18, agate oxide film 21 (for example, 50 to 200 nm or so in film thickness) is formed over the front surface 1a of the semiconductor wafer 1 by thermal oxidation (for example, wet oxidation at 950 degrees Celsius).

As illustrated in FIG. 19, a gate polysilicon film 11 (for example, 200 to 800 nm or so in film thickness) is formed over the gate oxide film 21 by, for example, low pressure CVD (Chemical Vapor Deposition). As wafer cleaning before gate oxidation, for example, wet cleaning using a first cleaning liquid and a second cleaning liquid can be applied. The first cleaning liquid is a liquid of ammonia:hydrogen peroxide:pure water=1:1:5 (volume ratio) and the second cleaning liquid is a liquid of hydrochloric acid:hydrogen peroxide:pure water=1:1:6 (volume ratio).

Subsequently, as illustrated in FIG. 20, the gate electrode 11 is patterned by dry etching.

Subsequently, as illustrated in FIG. 21, a resist film 28 for n$^+$-source region introduction is formed by lithography. Using this film as a mask, an n$^+$-source region 19, the n$^+$-type channel stopper region 8 of chip edge parts, and the like are introduced by ion implantation (for example, arsenic). (The dopant is, for example, arsenic; the dose amount is, for example, the order of $10^{15}$/cm$^2$ or so; and the implantation energy is, for example, 40 keV or so.) Thereafter, the resist film 28 that became unnecessary is entirely removed.

Subsequently, as illustrated in FIG. 22, a PSG (Phospho-Silicate-Glass) film 17 (interlayer insulating film) is formed over substantially the entire front surface 1a of the semiconductor wafer 1 by CVD or the like. (An SOG film may be stacked above and planarized.) As the interlayer insulating film 17, aside from the PSG film, BPSG, TEOS film, SiN film, others, or a composite film of them can be applied. An example of the total film thickness of the interlayer insulating film 17 is 900 nm or so.

Subsequently, as illustrated in FIG. 23, a resist film 29 for source contact hole formation is formed over the front surface 1a of the semiconductor wafer 1. Using this resist film as a mask, a source contact hole 20, a chip edge opening, and the like are formed by dry etching. Subsequently, the resist film 29 that became unnecessary is entirely removed.

Figure 24:
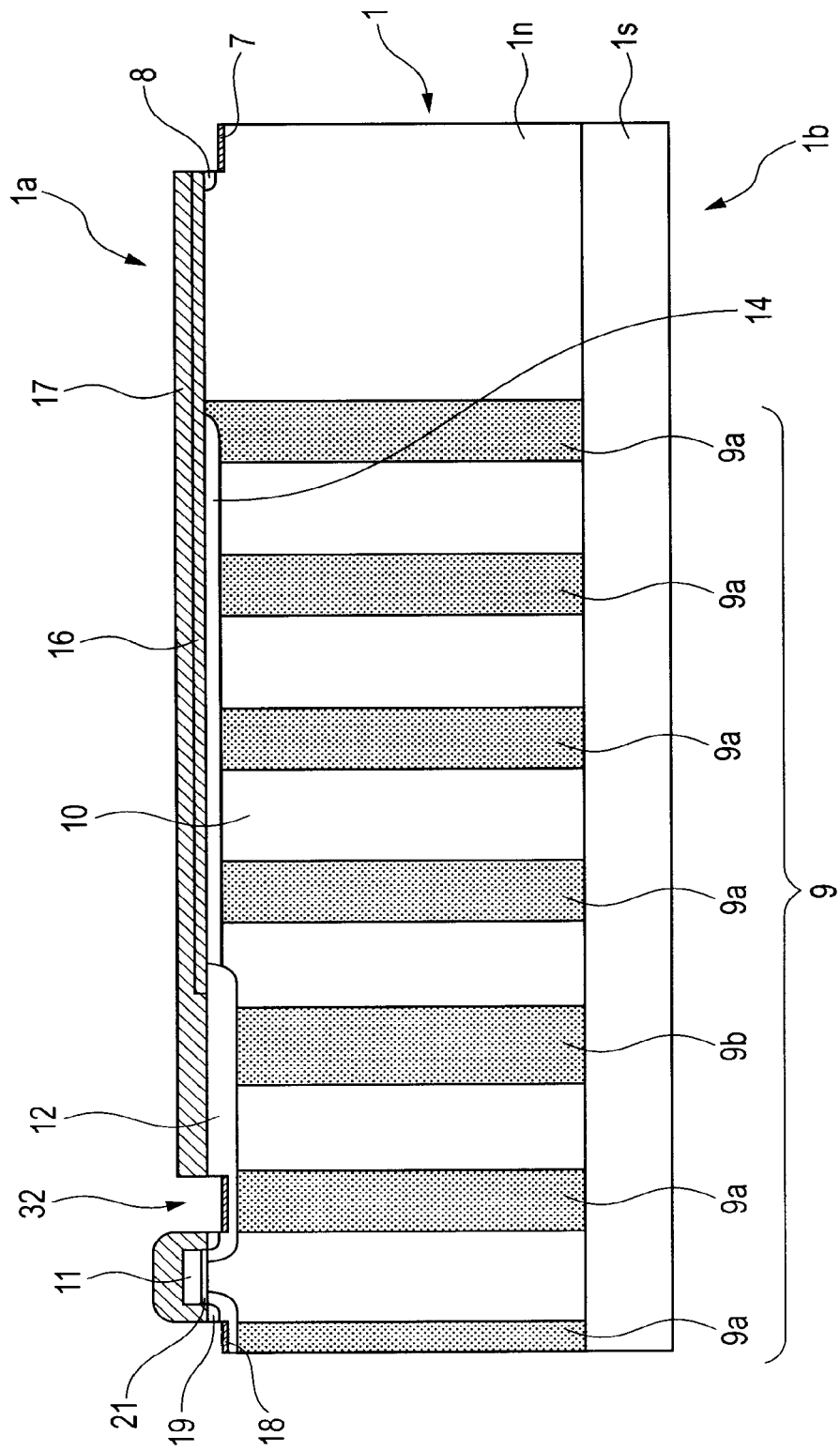
FIG. 24 is a device sectional view illustrating a process flow corresponding to the device section in FIG. 4 (p$^+$-type body contact region introduction step)

Subsequently, as illustrated in FIG. 24, the substrate front surface is etched (to, for example, the depth of 0.3 micrometers or so) by anisotropic dry etching using the patterned interlayer insulating film 17 as a mask to form a recess region 32. Subsequently, ion implantation is carried out in this recess region 32 to form the p$^+$-type body contact region 18 and the outermost peripheral p$^+$-type region 7. An example of the conditions for this ion implantation is as follows: dopant: BF$_2$; implantation energy: 30 keV or so; and dose amount: the order of $10^{15}$/cm$^2$.

Subsequently, as illustrated in FIG. 25, an aluminum metal layer is formed by sputtering or the like through a barrier metal film of TiW or the like and patterned. The metal source electrode 5, the guard ring electrode 3, and the like are thereby formed.

Thereafter, a final passivation film such as inorganic final passivation film or organic inorganic final passivation film is formed thereover if necessary and a pad opening and a gate opening are formed. As the final passivation film, the following measure may be taken aside from such a single-layer film as inorganic final passivation film or organic inorganic final passivation film: an organic inorganic final passivation film or the like is laminated over an inorganic final passivation film located below.

3. Description of a First Modification (Double Line Wide Column Type) to a Plan Layout of the Device Structure of a Power MOSFET as an Example of a Semiconductor Device in the First Embodiment of the Invention (Mainly FIG. 26 to FIG. 28)

In this section, description will be given to a modification to a plan layout in the embodiment described in sections above.

Figure 26:
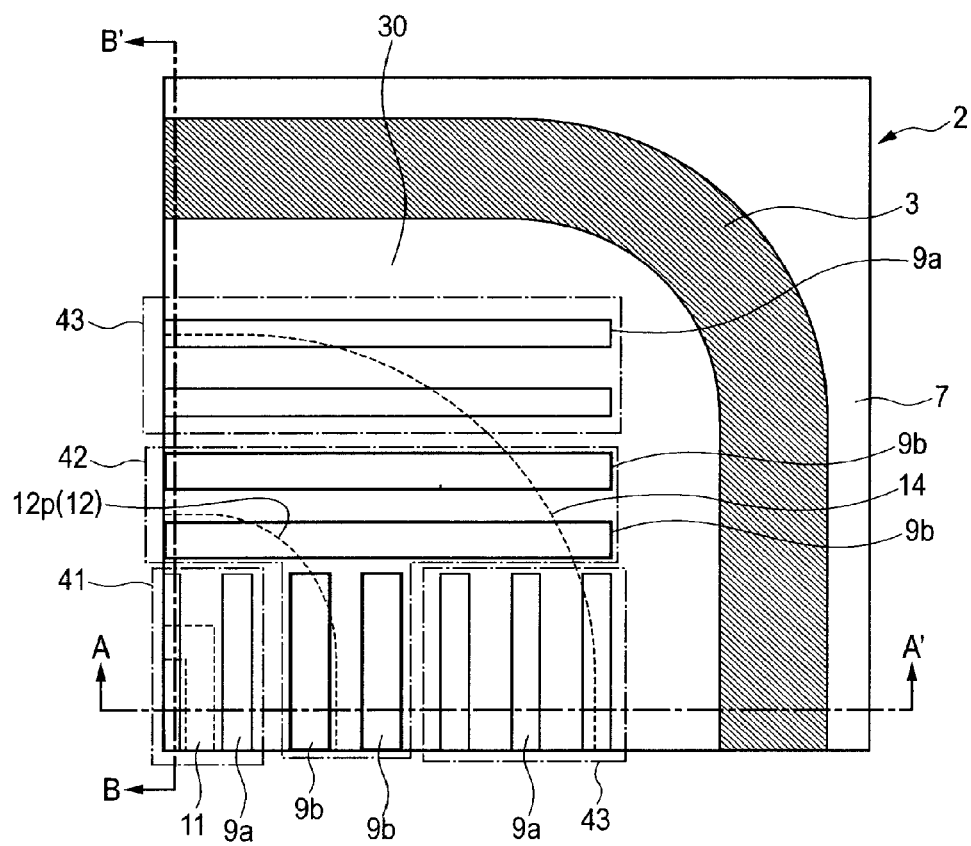
FIG. 26 is an enlarged plan view of the chip corner portion CR in FIG. 2 corresponding to FIG. 3, related to a first modification (double line wide column type) to a plan layout of the device structure of a power MOSFET as an example of a semiconductor device in the first embodiment of the invention.
Figure 27:
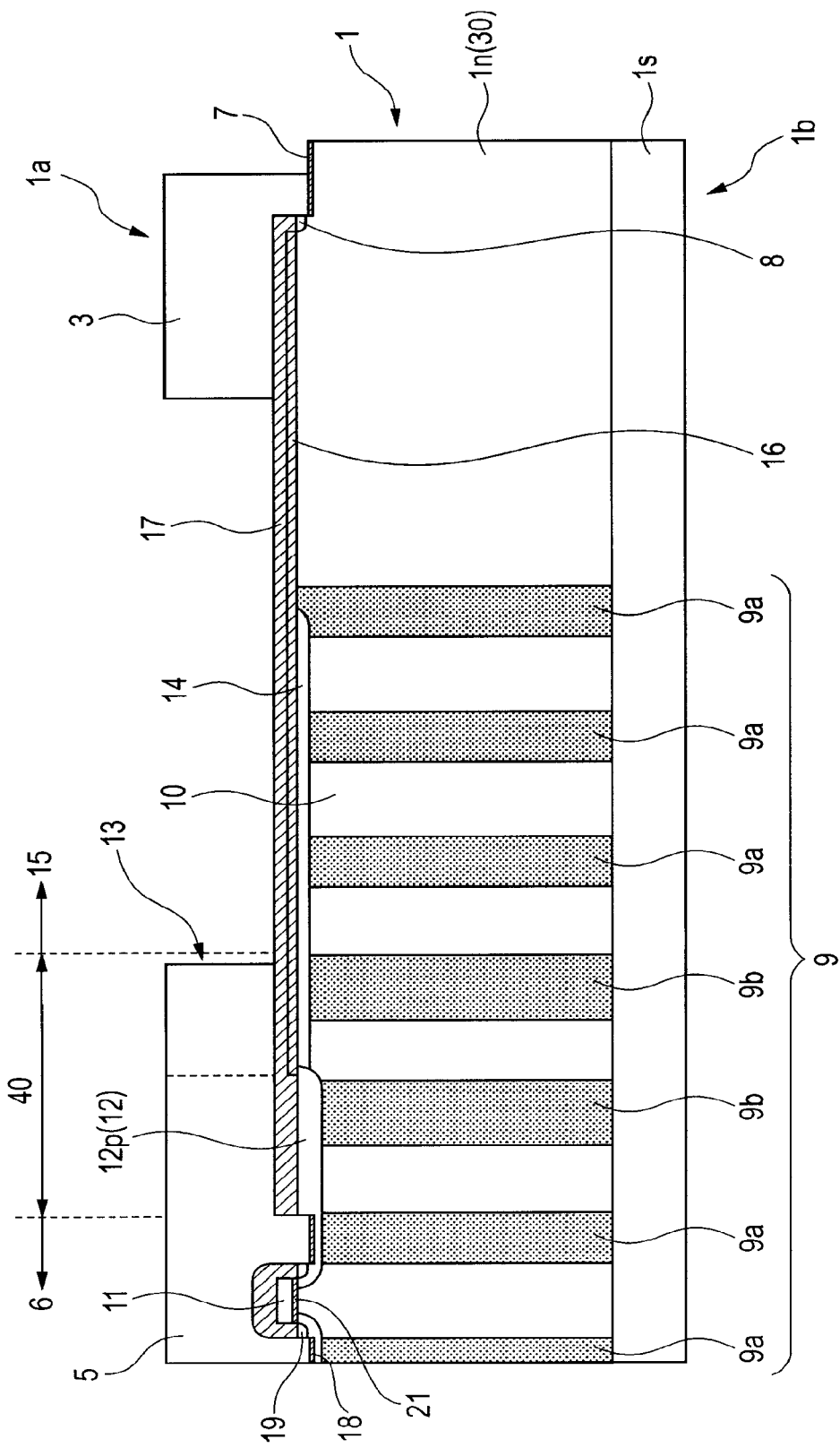
FIG. 27 is a device sectional view corresponding to the section taken along line A-A' of FIG. 26.
Figure 28:
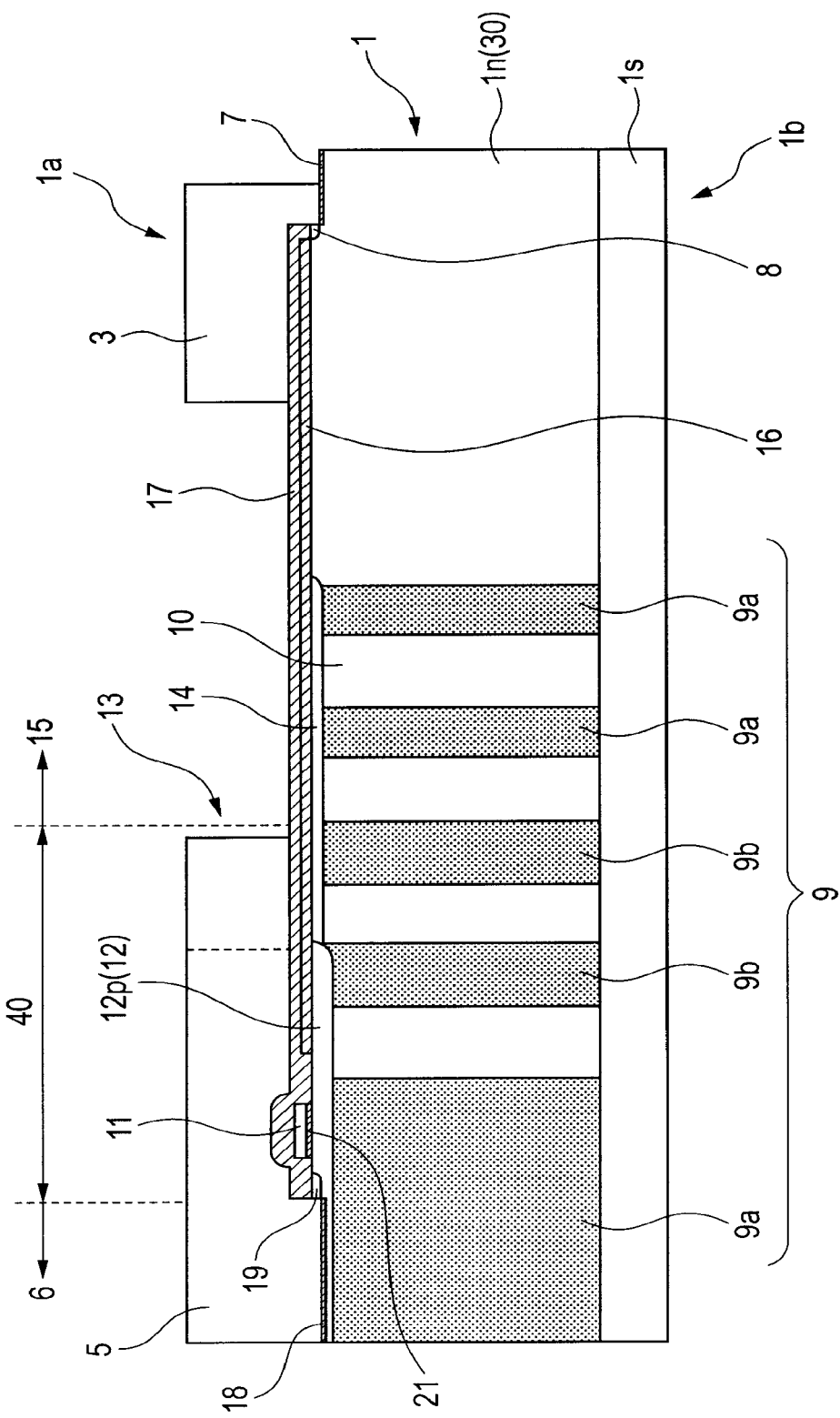
FIG. 28 is a device sectional view corresponding to the section taken along line B-B' of FIG. 26.

FIG. 26 (corresponding to FIG. 3) is an enlarged plan view of the chip corner portion CR in FIG. 2 corresponding to FIG. 3. This drawing relates to a first modification (double line wide column type) to a plan layout of the device structure of a power MOSFET as an example of a semiconductor device in the first embodiment of the invention. FIG. 27 (corresponding to FIG. 4) is a device sectional view corresponding to the section taken along line A-A' of FIG. 26. FIG. 28 (corresponding to FIG. 5) is a device sectional view corresponding to the section taken along line B-B' of FIG. 26. Description will be given to the first modification (double line wide column type) to a plan layout of the device structure of a power MOSFET as an example of a semiconductor device in the first embodiment of the invention with reference to these drawings.

As illustrated in FIG. 26 to FIG. 28, this modification is different in that the p-type column region 9b substantially surrounding the active cell region 6 and the first superjunction structure 41 is doubled. The modification is identical in the other respects.

4. Description of a Second Modification (Single Coupled Wide Column Type) to a Plan Layout of the Device Structure of a Power MOSFET as an Example of a Semiconductor Device in the First Embodiment of the Invention (Mainly FIG. 29)

In this section, description will be given to a modification to a plan layout in the embodiment described in sections above.

Figure 29:
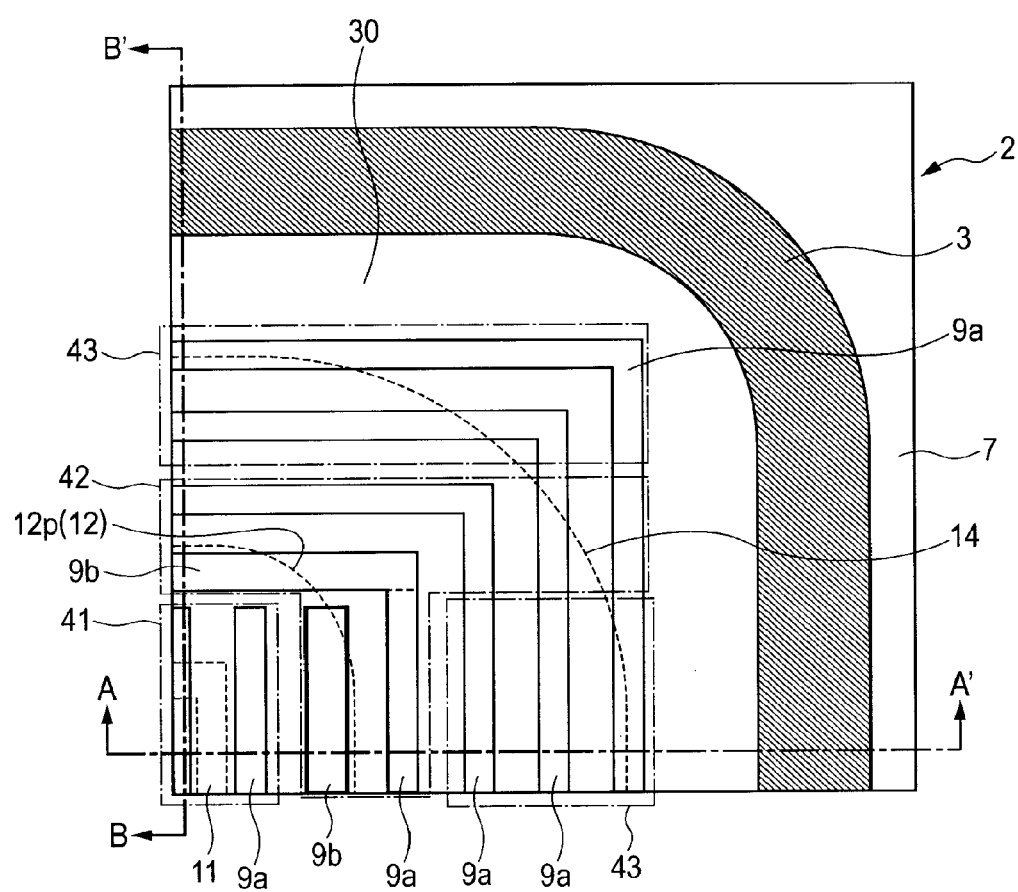
FIG. 29 is an enlarged plan view of the chip corner portion CR in FIG. 2 corresponding to FIG. 3, related to a second modification (single coupled wide column type) to a plan layout of the device structure of a power MOSFET as an example of semiconductor device in the first embodiment of the invention.

FIG. 29 is an enlarged plan view of the chip corner portion CR in FIG. 2 corresponding to FIG. 3. This drawing relates to a second modification (single coupled wide column type) to a plan layout of the device structure of a power MOSFET as an example of a semiconductor device in the first embodiment of the invention. Description will be given to the second modification (single coupled wide column type) to a plan layout of the device structure of a power MOSFET as an example of a semiconductor device in the first embodiment of the invention with reference to this drawing.

As illustrated in FIG. 29, this modification is different from the example in FIG. 3 in that the following are coupled to form multiple concentric rectangular frame-like bodies: some of the ordinary p-type column regions 9a comprising the second superjunction structure 42 and all of the ordinary p-type column regions 9a comprising the third superjunction structure 43. Therefore, the wide p-type column regions 9b above and below the active cell region 6 comprise each side of the innermost rectangular frame-like body.

5. Description of a Third Modification (Double Coupled Wide Column Type) to a Plan Layout of the Device Structure of a Power MOSFET as an Example of a Semiconductor Device in the First Embodiment of the Invention (Mainly FIG. 30)

In this section, description will be given to a modification to a plan layout in the embodiment described in sections above.

Figure 30:
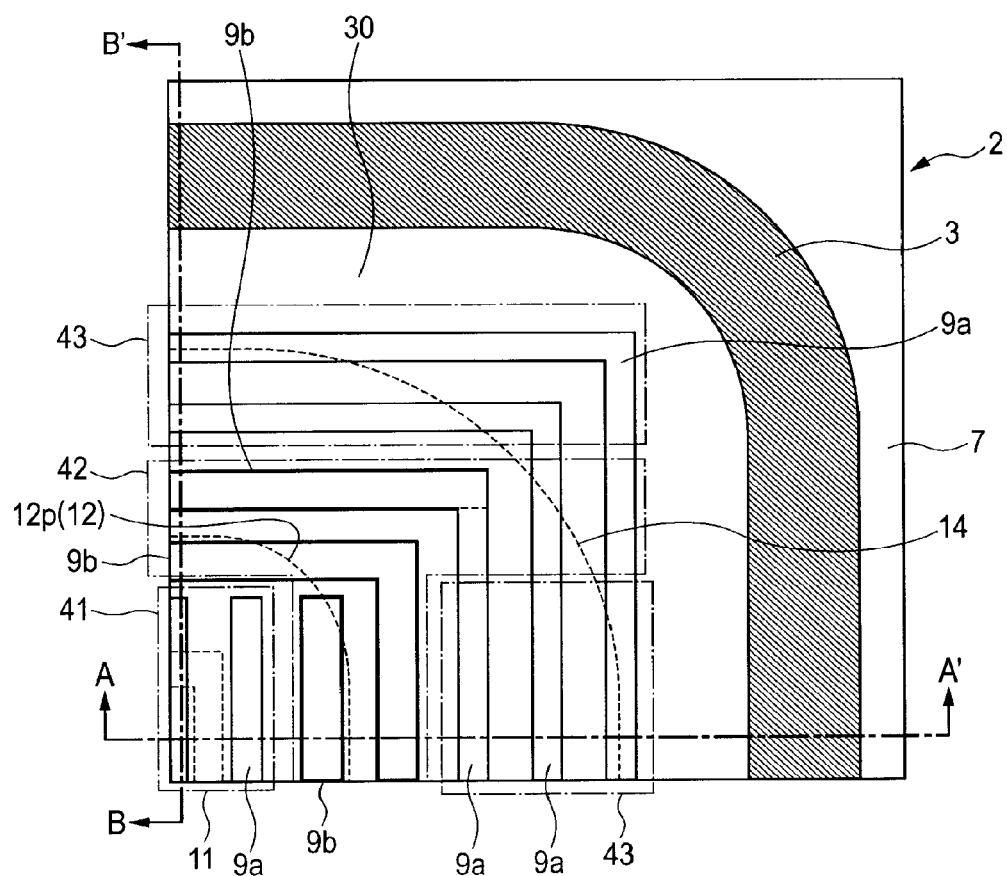
FIG. 30 is an enlarged plan view of the chip corner portion CR in FIG. 2 corresponding to FIG. 3, related to a third modification (double coupled wide column type) to a plan layout of the device structure of a power MOSFET as an example of a semiconductor device in the first embodiment of the invention.

FIG. 30 is an enlarged plan view of the chip corner portion CR in FIG. 2 corresponding to FIG. 3. This drawing relates to a third modification (double coupled wide column type) to a plan layout of the device structure of a power MOSFET as an example of a semiconductor device in the first embodiment of the invention. Description will be given to the third modification (double coupled wide column type) to a plan layout of the device structure of a power MOSFET as an example of a semiconductor device in the first embodiment of the invention.

As illustrated in FIG. 30, this modification is different from the example in FIG. 29 in that: the entire rectangular frame-like body comprising the second superjunction structure 42 is a wide p-type column region 9b; the upper and lower sides of the rectangular frame-like body located outside it are wide p-type column regions 9b; and they comprise a double coupled wide column as a whole. In this example, the rectangular frame-like p-type column region partly wide is formed by coupling together a wide p-type column region 9b and an ordinary p-type column region 9a. Therefore, the narrow parts of the rectangular frame-like p-type column region partly wide are substantially identical in width with the ordinary p-type column regions 9a comprising the first superjunction structure 41.

6. Description of a Fourth Modification (Single Break Line Wide Column Type) to a Plan Layout of the Device Structure of a Power MOSFET as an Example of a Semiconductor Device in the First Embodiment of the Invention (Mainly FIG. 31)

In this section, description will be given to a modification to a plan layout in the embodiment described in sections above.

Figure 31:
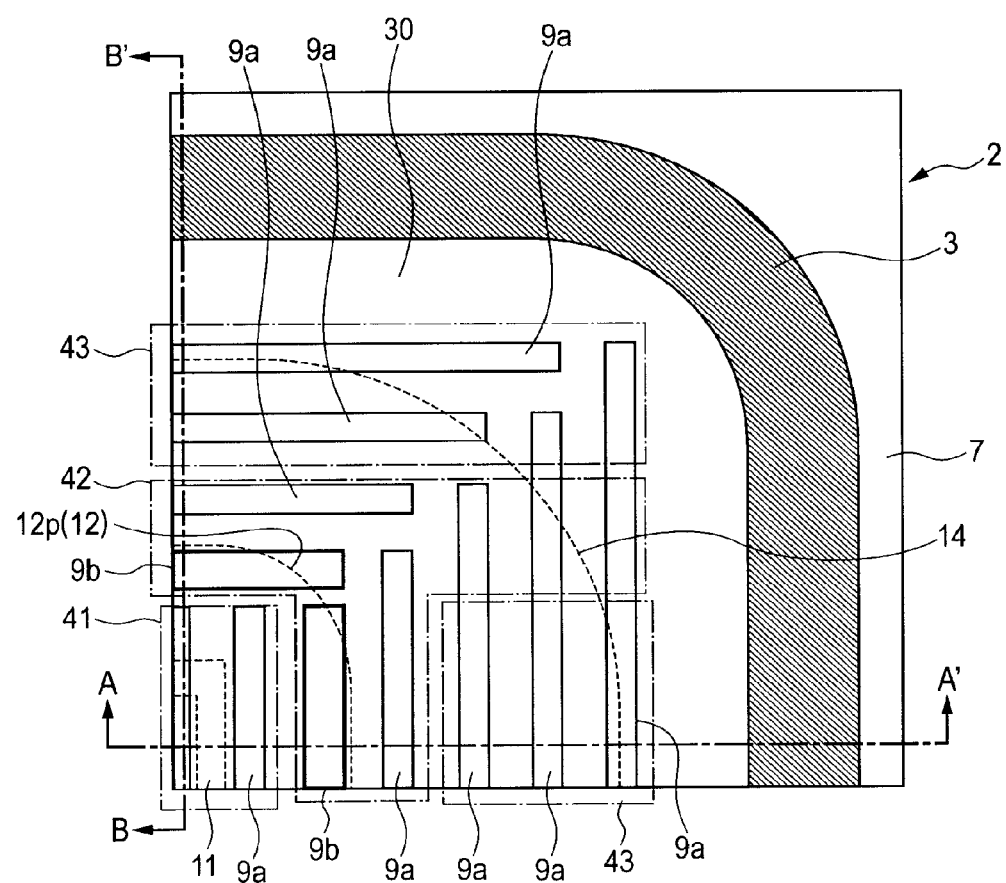
FIG. 31 is an enlarged plan view of the chip corner portion CR in FIG. 2 corresponding to FIG. 3, related to a fourth modification (single break line wide column type) to a plan layout of the device structure of a power MOSFET as an example of a semiconductor device in the first embodiment of the invention.

FIG. 31 is an enlarged plan view of the chip corner portion CR in FIG. 2 corresponding to FIG. 3. This drawing relates to a fourth modification (single break line wide column type) to a plan layout of the device structure of a power MOSFET as an example of a semiconductor device in the first embodiment of the invention. Description will be given to the fourth modification (single break line wide column type) to a plan layout of the device structure of a power MOSFET as an example of a semiconductor device in the first embodiment of the invention.

As illustrated in FIG. 31, this modification is different from the example in FIG. 3 in that the symmetric property of the chip corner portions is enhanced by taking the following measure: the lengths of the ordinary p-type column regions 9a and the wide p-type column regions 9b comprising the second superjunction structure 42 and the third superjunction structure 43 are adjusted. That is, the linear p-type column regions 9 (9a, 9b) are laid out by substantially symmetrically arranging them.

7. Description of a Fifth Modification (Single Break Line Wide Column Type with Auxiliary Column) to a Plan Layout of the Device Structure of a Power MOSFET as an Example of a Semiconductor Device in the First Embodiment of the Invention (Mainly FIG. 32)

In this section, description will be given to a modification to a plan layout in the embodiment described in sections above.

Figure 32:
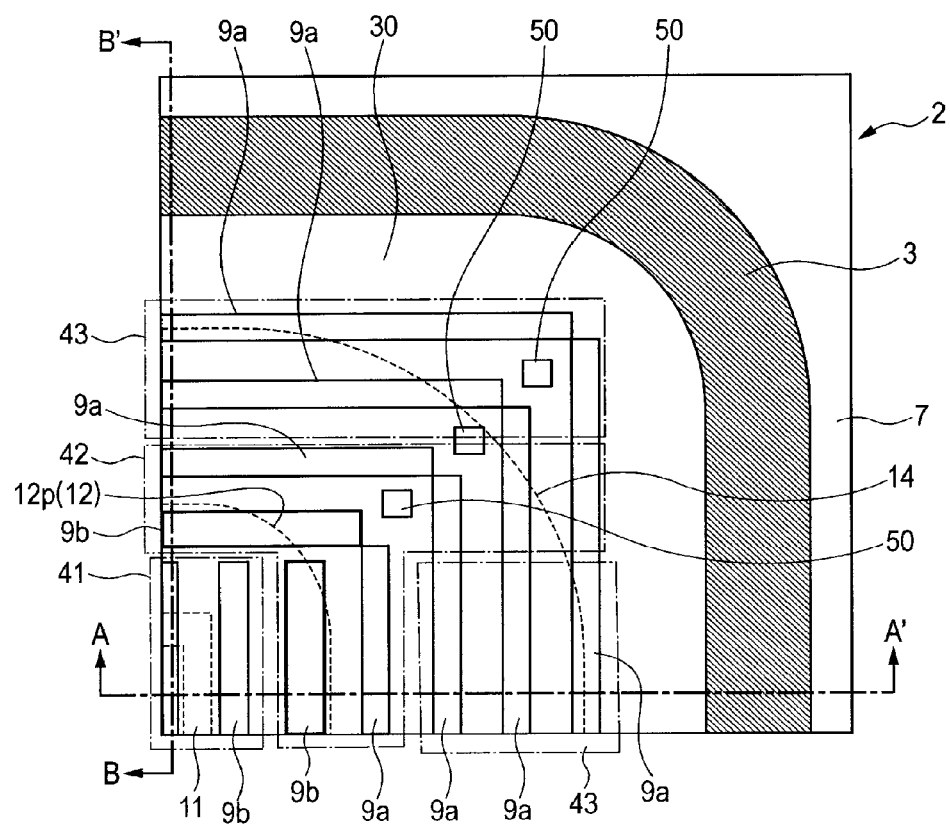
FIG. 32 is an enlarged plan view of the chip corner portion CR in FIG. 2 corresponding to FIG. 3, related to a fifth modification (single break line wide column type with auxiliary column) to a plan layout of the device structure of a power MOSFET as an example of a semiconductor device in the first embodiment of the invention.

FIG. 32 is an enlarged plan view of the chip corner portion CR in FIG. 2 corresponding to FIG. 3. This drawing relates to a fifth modification (single break line wide column type with auxiliary column) to a plan layout of the device structure of a power MOSFET as an example of a semiconductor device in the first embodiment of the invention. Description will be given to the fifth modification (single break line wide column type with auxiliary column) to a plan layout of the device structure of a power MOSFET as an example of a semiconductor device in the first embodiment of the invention.

As illustrated in FIG. 32, this modification is characterized in that: the corner portion of the rectangular frame-like body in FIG. 31 is cut and placed inside and the symmetrical property of the chip corner portion is further enhanced. (This makes it possible to maintain favorable charge balance at corner portions.)

8. Description of the Device Structure (Basic Structure: Single Partly High Concentration Column Type) of a Power MOSFET as an Example of a Semiconductor Device in a Second Embodiment of the Invention (Mainly, FIG. 33 and FIG. 35 to FIG. 37)

In Sections 8 to 10, description will be given to a device and the like formed by a multi-epitaxy process. This device and the like are different in the manufacturing process for superjunction structures and the attributes of extraordinary p-type column regions. However, they are substantially identical in other common cross section structures and the layout of p-type column regions. (In Sections 8 to 10, the extraordinary p-type column regions are p-type column regions 52p having concentration change due to ion implantation (or having change in width).)

Figure 33:
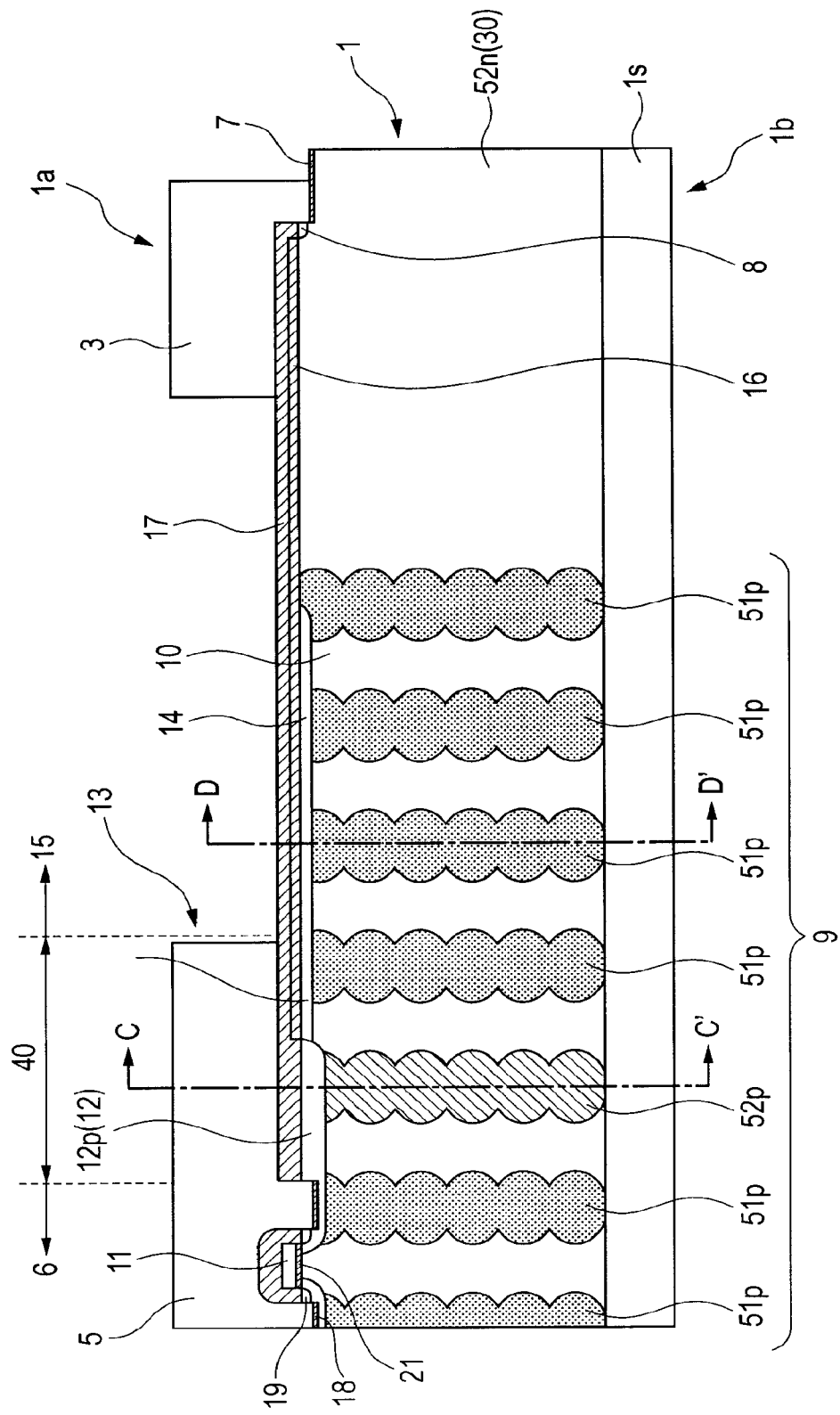
FIG. 33 is a device sectional view corresponding to the section taken along line A-A' of FIG. 3 corresponding to FIG. 4, related to the device structure (basic structure: single partly high concentration column type) of a power MOSFET as an example of a semiconductor device in a second embodiment of the invention.
Figure 35:
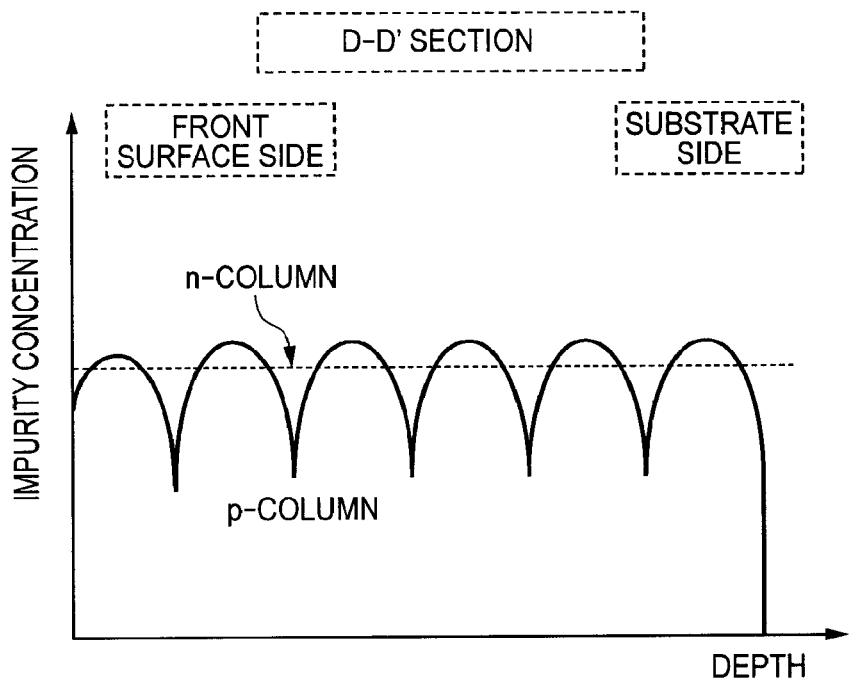
FIG. 35 is an impurity distribution chart of a p-type column region 51p uniform in concentration in the direction of depth related to the section taken along line D-D' of FIG. 33 or FIG. 34 (the impurity distribution of an adjacent n-type column region 10 is shown together for the purpose of comparison)
Figure 36:
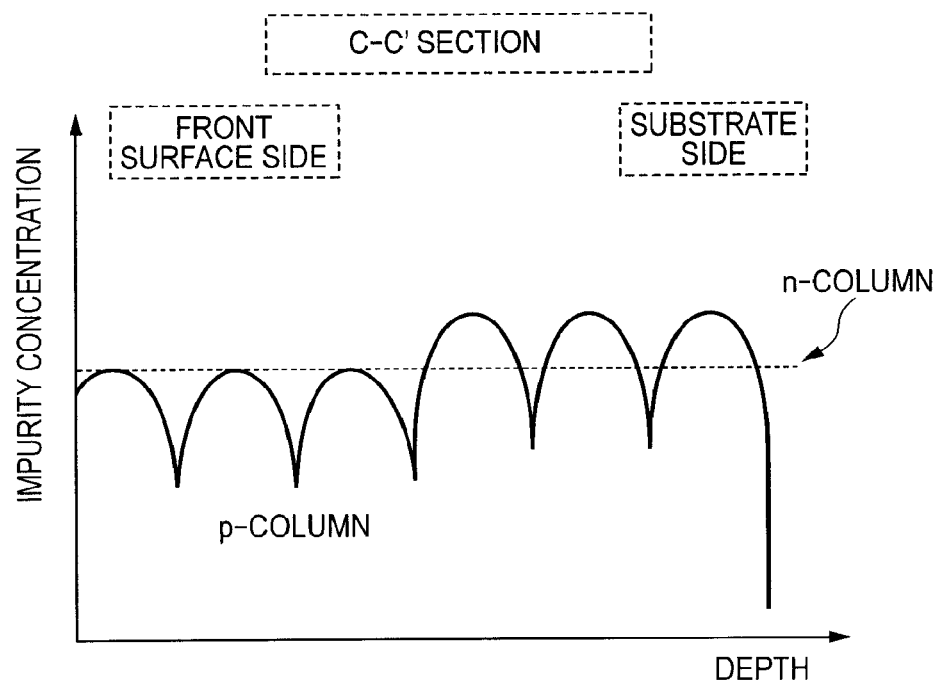
FIG. 36 indicates a first example (substantially stepwise distribution) of the impurity distribution chart of a p-type column region 52p partly high in concentration in the direction of depth related to the section taken along line C-C' of FIG. 33 or FIG. 34 (the impurity distribution of an adjacent n-type column region 10 is shown together for the purpose of comparison)
Figure 37:
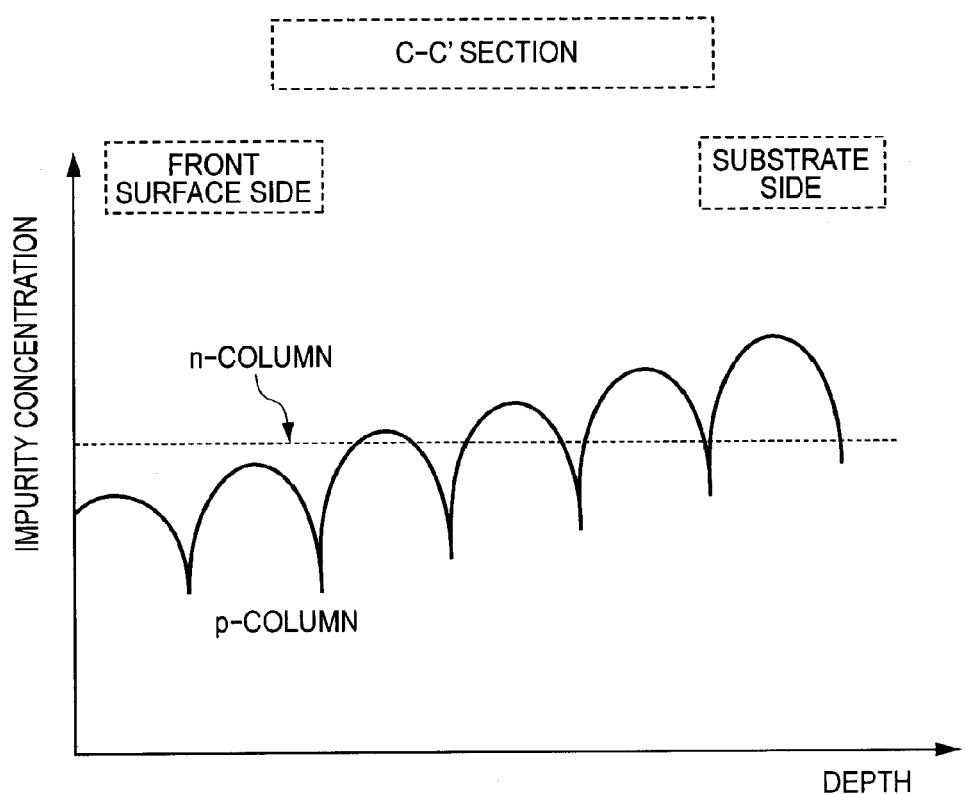
FIG. 37 indicates a second example (substantially monotone increasing) of the impurity distribution chart of a p-type column region 52p partly high in concentration in the direction of depth related to the section taken along line C-C' of FIG. 33 or FIG. 34 (the impurity distribution of an adjacent n-type column region 10 is shown together for the purpose of comparison)

FIG. 33 is a device sectional view corresponding to the section taken along line A-A' of FIG. 3 corresponding to FIG. 4. This drawing relates to the device structure (basic structure: single partly high concentration column type) of a power MOSFET as an example of a semiconductor device in the second embodiment of the invention. FIG. 35 is an impurity distribution chart of the p-type column region 51p uniform in concentration in the direction of depth related to the section taken along line D-D' of FIG. 33 or FIG. 34. (The impurity distribution of an adjacent n-type column region 10 is also shown for the purpose of comparison.) FIG. 36 is a first example (substantially stepwise distribution) of an impurity distribution chart of the p-type column region 52p partly high in concentration in the direction of depth related to the section taken along line C-C' of FIG. 33 or FIG. 34. (The impurity distribution of an adjacent n-type column region 10 is also shown for the purpose of comparison.) FIG. 37 is, a second example (substantially monotone increasing) of an impurity distribution chart of the p-type column region 52p partly high in concentration in the direction of depth related to the section taken along line C-C' of FIG. 33 or FIG. 34. (The impurity distribution of an adjacent n-type column region 10 is also shown for the purpose of comparison.) Description will be given to the device structure (basic structure: single partly high concentration column type) of a power MOSFET as an example of a semiconductor device in the second embodiment of the invention.

As illustrated in FIG. 33 (corresponding to FIG. 4), the device structure in the second embodiment corresponds to the basic structure of the first embodiment. It is different in the manufacturing process for superjunction structures and in that: as an extraordinary p-type column region, there is provided a p-type column region 52p partly higher in concentration than the ordinary-concentration p-type column regions 51p, not a wide p-type column region 9b. In this example, the p-type column region 51p and the p-type column region 52p are substantially identical in width. (This is the same with the example in FIG. 34.)

FIG. 35 shows the p-type impurity concentration distribution of the D-D' section (FIG. 33 or FIG. 34) of the p-type column region 51p portion uniform in concentration. (The n-type impurity concentration distribution of an adjacent n-type column region 10 is also shown for the purpose of comparison.) It is preferred that the p-type impurity concentration distribution of the C-C' section of the p-type column region 52p partly high in concentration in FIG. 33 or FIG. 34 should be as shown in FIG. 36 or FIG. 37. (The n-type impurity concentration distribution of an adjacent n-type column region 10 is also shown for the purpose of comparison.) That is, it desirable that the following should be implemented when the p-type column region 51p uniform in concentration of the active cell region 6 and the chip peripheral region 15 is at a reference concentration: the concentration of the lower part is higher than the reference concentration and the concentration of the upper part is lower than the reference concentration. This is intended to implement the following as shown in FIG. 6: the distribution of the total charge amount Qn of n-type columns and that of the total charge amount Qp of p-type columns are caused to intersect with each other in the internal region of the drift region 30; and the electric field strength is thereby maximized in the internal region away from the front surface. In multi-epitaxy techniques, upper and lower element columns are coupled together by diffusion. Therefore, when the lower part is at a high concentration as shown in FIG. 36 and FIG. 37, that brings about an advantage that the optimum distribution is more easily generated.

9. Description of a First Modification (Double High Concentration Column Type) to a Plan Layout of the Device Structure of a Power MOSFET as an Example of a Semiconductor Device in the Second Embodiment of the Invention (Mainly FIG. 34)

Figure 34:
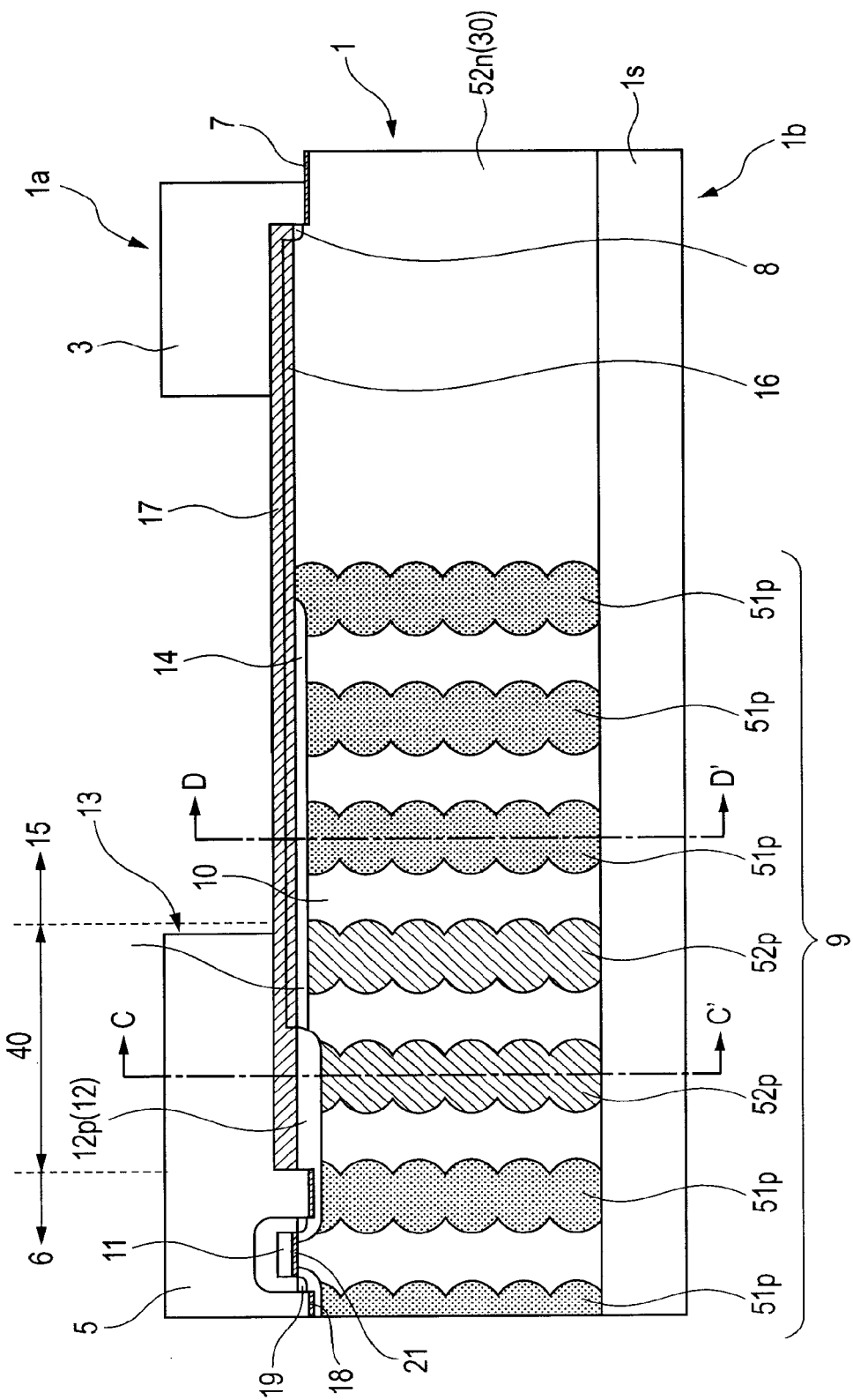
FIG. 34 is a device sectional view corresponding to the section taken along line A-A' of FIG. 3 corresponding to FIG. 4, related to a first modification (double partly high concentration column type) to a plan layout of the device structure of a power MOSFET as an example of a semiconductor device in the second embodiment of the invention.

FIG. 34 is a device sectional view corresponding to the section taken along line A-A' of FIG. 3 corresponding to FIG. 4. This drawing relates to a first modification (double partly high concentration column type) to a plan layout of the device structure of a power MOSFET as an example of a semiconductor device in the second embodiment of the invention. Description will be given to the first modification (double high concentration column type) to a plan layout of the device structure of a power MOSFET as an example of a semiconductor device in the second embodiment of the invention with reference to this drawing.

As illustrated in FIG. 34 (corresponding to FIG. 4), the device structure of the second embodiment (first modification) corresponds to the structure of the first embodiment illustrated in FIG. 26 to FIG. 28. It is different in the manufacturing process for superjunction structures and in that: as an extraordinary p-type column region, there is provided a p-type column region 52p partly higher in concentration than the p-type column region 51p uniform in concentration, not a wide p-type column region 9b. This embodiment is exactly the same as in Section 9 in the other respects and the description thereof will not be repeated.

In the description up to this point, cases where extraordinary columns (for example, partly high-concentration column type, wide column, and the like) are singly or doubly arranged have been taken as examples. They may be so structured that the number of them is larger depending on the relation with dimensions, needless to add.

10. Description of the Wafer Process (Mainly by a Multi-Epitaxy Technique) in a Manufacturing Method for a Semiconductor Device in the Second Embodiment of the Invention (Basic Structure Taken as an Example) (Mainly FIG. 38 to FIG. 41 and FIG. 70 to FIG. 73)

In this section, description will be given to process steps corresponding to the structure in FIG. 33. These process steps are basically the same for the structure in FIG. 34 and other structures. The process steps in FIG. 14 to FIG. 25 are basically the same as the process steps in FIG. 41 and the following drawings. Therefore, only a difference will be described here. Concrete description will be given with the impurity profile in FIG. 37 taken as an example. The impurity profile may be that in FIG. 36 or those obtained by turning these impurity profiles upside down. However, the impurity profiles shown in FIG. 36 and FIG. 37 bring about an advantage of stable process.

(1) Multiple Implantation Technique (Mainly FIG. 38 to FIG. 41)

Figure 41:
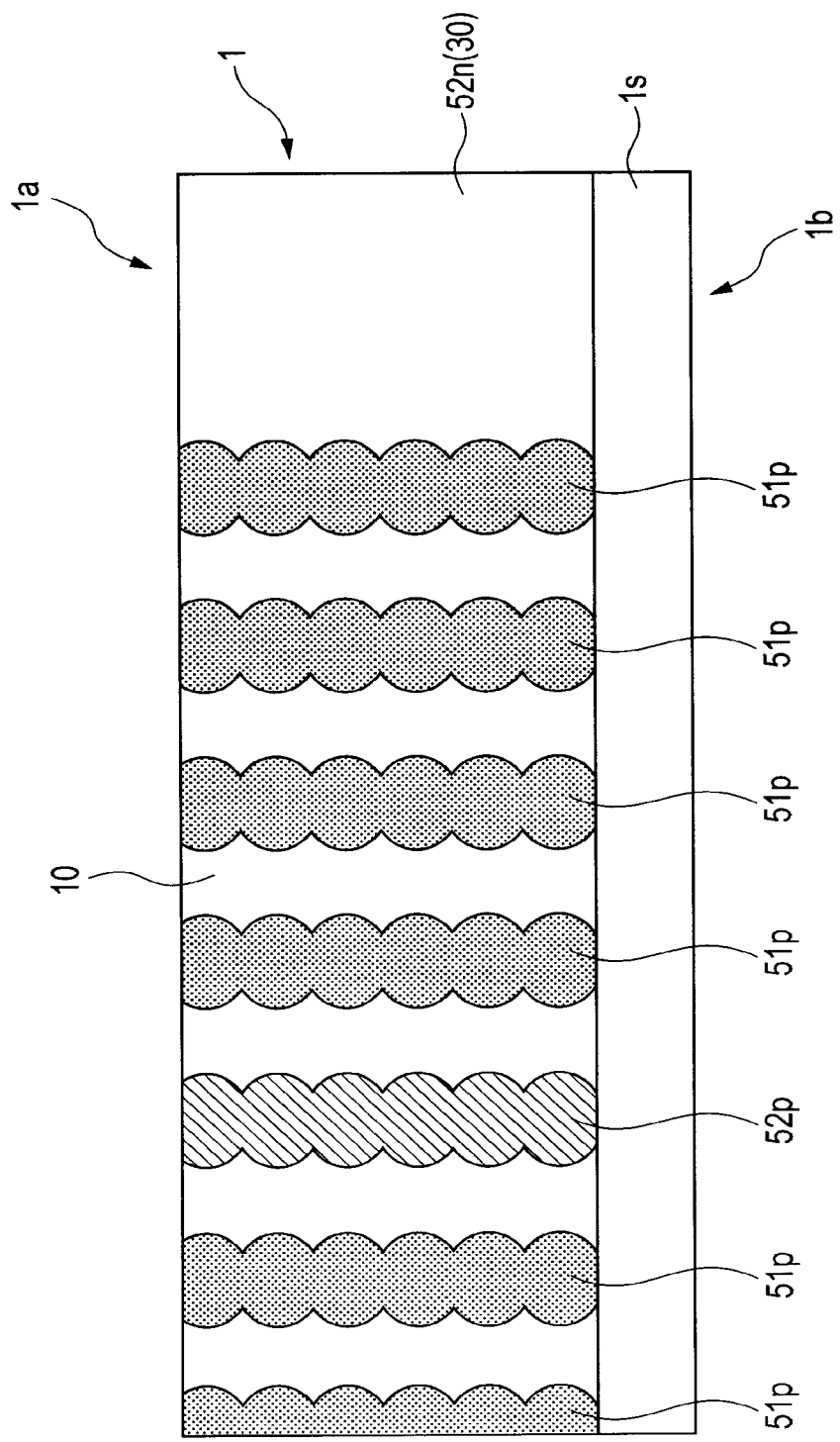
FIG. 41 illustrates a device section in the wafer process (mainly by a multi-epitaxy technique) in a manufacturing method for a semiconductor device in the second embodiment of the invention (the basic structure in FIG. 33 is taken as an example) (at the time of multi-epitaxial growth by multi-epitaxy technique and the completion of final ion implantation)

FIG. 38 illustrates a device section in the wafer process (mainly by a multi-epitaxy technique) in a manufacturing method for a semiconductor device (the basic structure in FIG. 33 taken as an example) in the second embodiment of the invention (step of forming first-tier n-type silicon epitaxial layer in multi-epitaxial growth). FIG. 39 illustrates a device section in the wafer process (mainly by a multi-epitaxy technique) in a manufacturing method for a semiconductor device (the basic structure in FIG. 33 taken as an example) in the second embodiment of the invention (step #1 of p-type impurity implantation in first-tier n-type silicon epitaxial layer in multi-epitaxial growth). FIG. 40 illustrates a device section in the wafer process (mainly by a multi-epitaxy technique) in a manufacturing method for a semiconductor device (the basic structure in FIG. 33 taken as an example) in the second embodiment of the invention (step #2 of p-type impurity implantation in first-tier n-type silicon epitaxial layer in multi-epitaxial growth). FIG. 41 illustrates a device section in the wafer process (mainly by a multi-epitaxy technique) in a manufacturing method for a semiconductor device (the basic structure in FIG. 33 taken as an example) in the second embodiment of the invention (at the time of multi-epitaxial growth by a multi-epitaxy technique and the completion of final ion implantation). Description will be given to the wafer process (mainly by a multi-epitaxy technique) in a manufacturing method for a semiconductor device (basic structure taken as an example) in the second embodiment of the invention with reference to these drawings.

First, as illustrated in FIG. 38, a first-tier n-type silicon epitaxial layer 51n1 by multi-epitaxial growth, for example, 8 micrometers or so is formed on the front surface 1a side of an n+-type single crystal silicon wafer 1s.

Subsequently, as illustrated in FIG. 39, a resist film 53 for ion implantation is applied to the first-tier n-type silicon epitaxial layer 51n1 and is patterned by lithography. Using the patterned resist film 53 for ion implantation as a mask, impurity ions corresponding to ordinary concentration is implanted in the first-tier p-type column region 51p1 of ordinary concentration and the first-tier p-type column region 52p1 of high concentration (first ion implantation). Thereafter, the resist film 53 for ion implantation that became unnecessary is removed. Subsequently, a resist film 54 for ion implantation is applied to the first-tier n-type silicon epitaxial layer 51n1 again and is patterned by lithography. Using the patterned resist film 54 for ion implantation as a mask, impurity ions equivalent to the difference between the concentration corresponding to the first-tier p-type column region 52p1 of high concentration and the first-tier p-type column region 51p1 of ordinary concentration are implanted (second ion implantation). Thereafter, the resist film 54 for ion implantation that became unnecessary is removed.

Subsequently, similarly to FIG. 38, a second-tier n-type silicon epitaxial layer is formed and a resist film pattern 53 is formed thereover. Similarly to FIG. 39, the first ion implantation is carried out and the pattern is replaced with the resist film pattern 54 again as illustrated in FIG. 40. Then the second ion implantation is carried out. To obtain such an impurity profile as shown in FIG. 37 at this time, an amount smaller than the dose amount in the second ion implantation for the first tier is implanted.

This repetitive process is repeated more than once (for example, six times) to obtain such a structure as illustrated in FIG. 41. In FIG. 41, the n-type silicon epitaxial layer 52n at the time of completion of multi-epitaxial growth corresponds to the n-type column regions 10 in FIG. 14.

This state is equivalent to the state in FIG. 14; therefore, the following process steps are the same as those in FIG. 14 and the following drawings.

(2) Implantation Width Varying Technique (Mainly FIG. 70 to FIG. 73)

The difference between this example and the example in (1) above is described below. In the example in (1), ion implantation is carried out in two steps for each multi-epitaxy layer. In this example, meanwhile, ion implantation is carried out once for each multi-epitaxy layer. Instead, the dose amount is changed by changing the area of openings in a resist pattern for ion implantation in extraordinary columns. The former is advantageous to the accurate control of dose amount and the latter brings about an advantage of a halved number of times of ion implantation.

Figure 70:
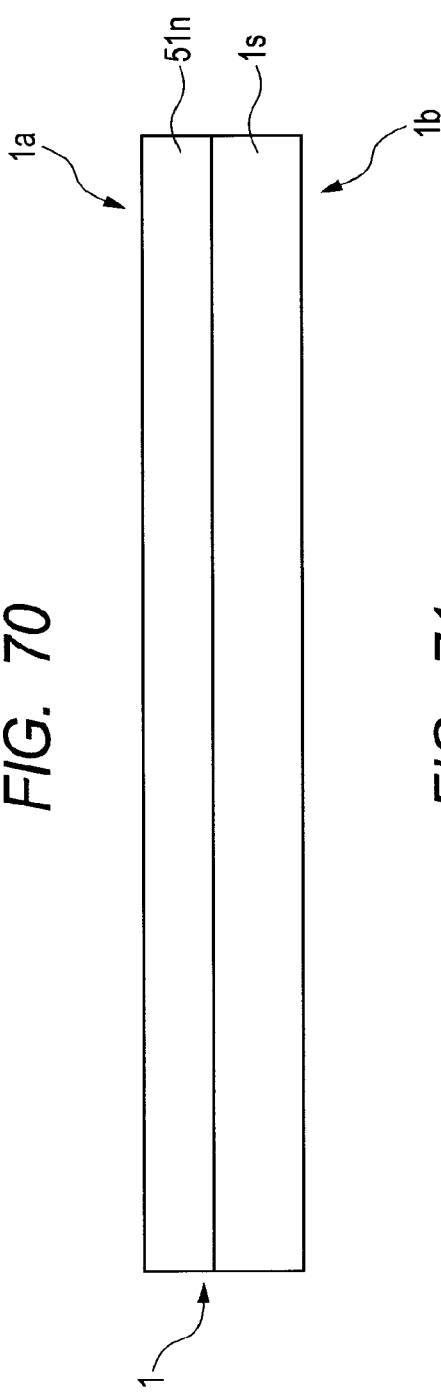
FIG. 70 illustrates a device section in the wafer process (mainly by a multi-epitaxy technique) in a manufacturing method (modification) for a semiconductor device in the second embodiment of the invention (the basic structure in FIG. 33 and the doping profile in FIG. 37 are taken as an example) (step of forming first-tier n-type silicon epitaxial layer in multi-epitaxial growth)
Figure 71:
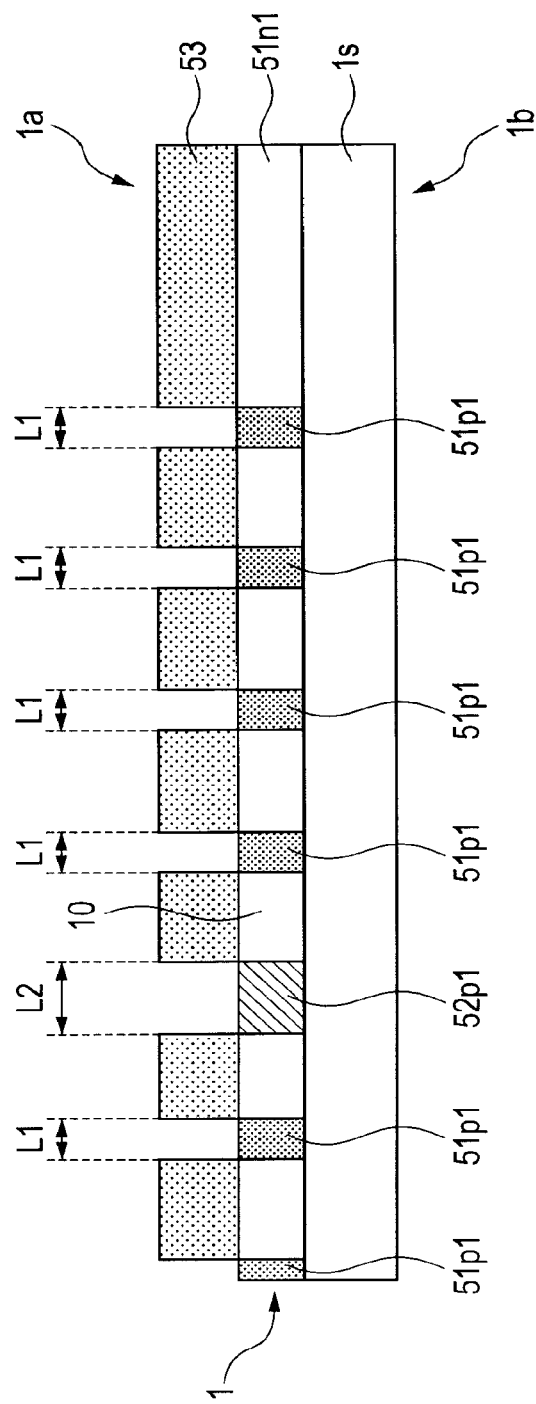
FIG. 71 is illustrates a device section in the wafer process (mainly by a multi-epitaxy technique) in a manufacturing method (modification) for a semiconductor device in the second embodiment of the invention (the basic structure in FIG. 33 and the doping profile in FIG. 37 are taken as an example) (step #1 of implanting p-type impurity in first-tier n-type silicon epitaxial layer in multi-epitaxial growth)
Figure 72:
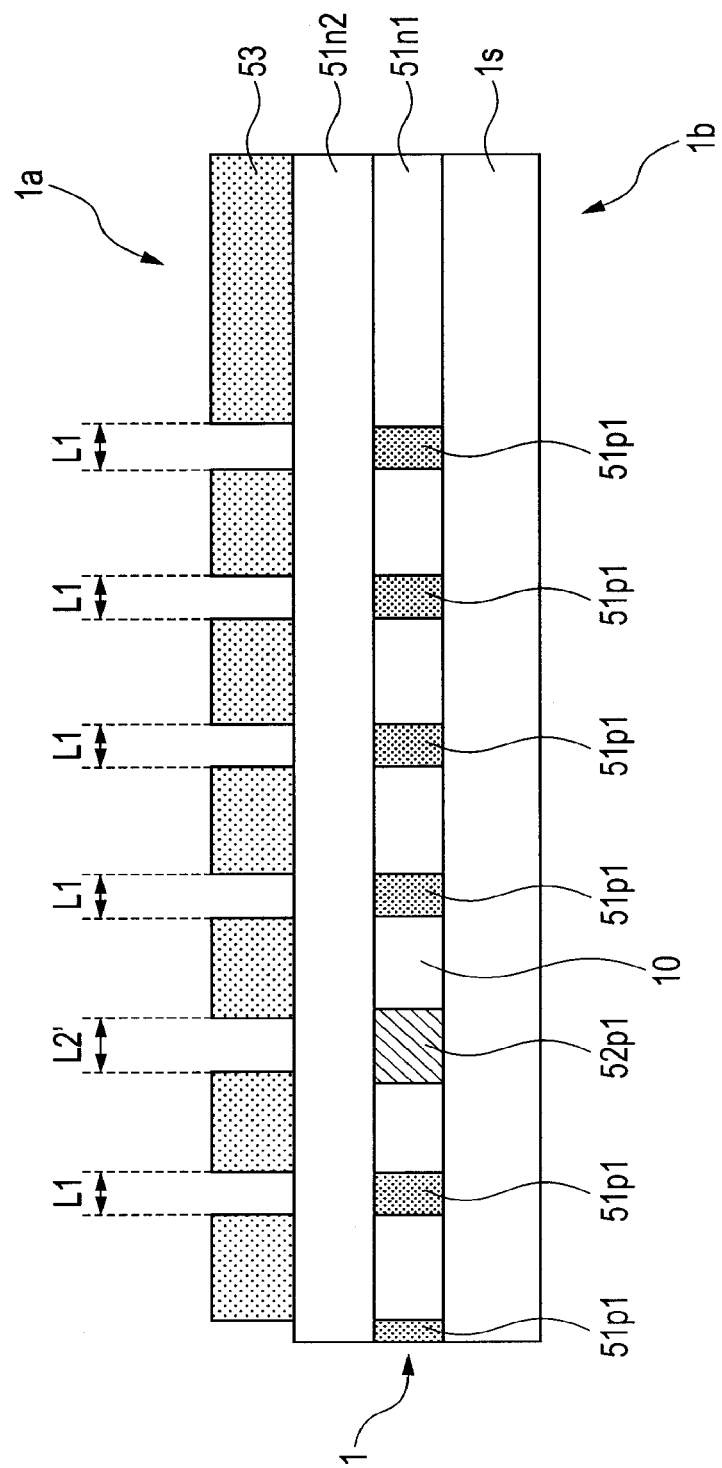
FIG. 72 illustrates a device section in the wafer process (mainly by a multi-epitaxy technique) in a manufacturing method (modification) for a semiconductor device in the second embodiment of the invention (the basic structure in FIG. 33 and the doping profile in FIG. 37 are taken as an example) (step of forming resist pattern for p-type impurity implantation in second-tier n-type silicon epitaxial layer in multi-epitaxial growth)
Figure 73:
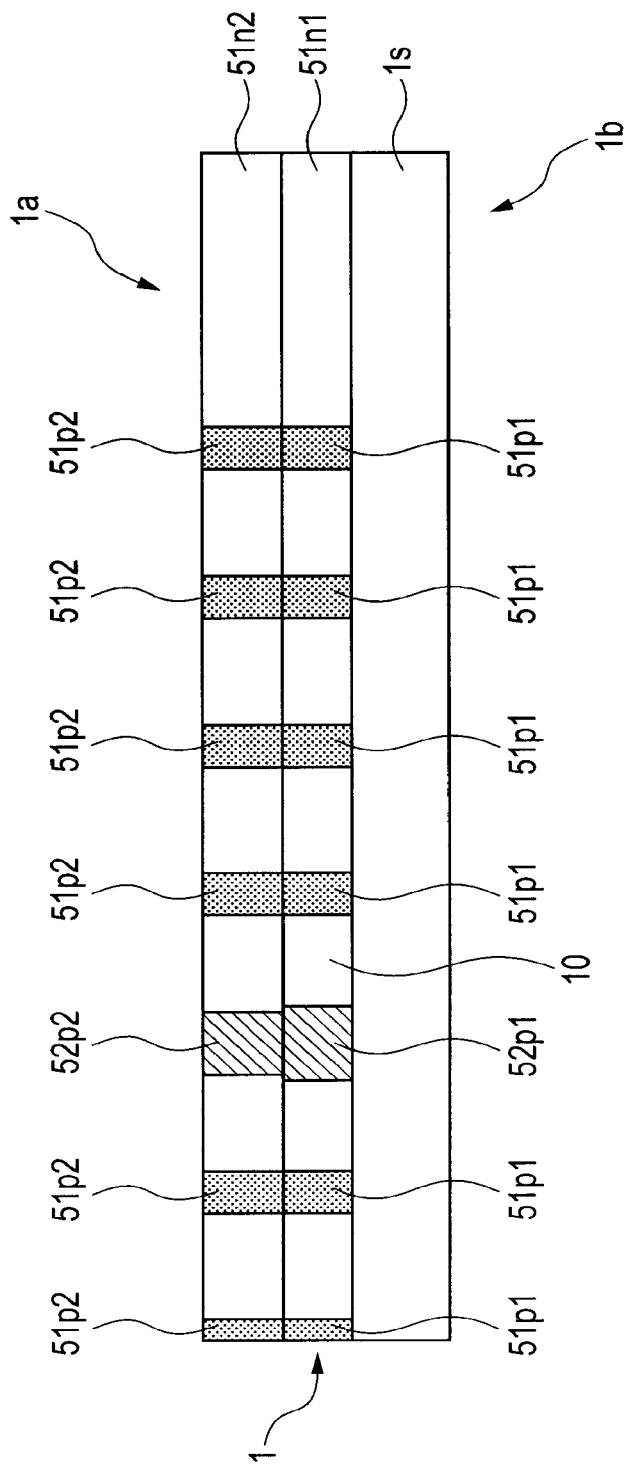
FIG. 73 illustrates a device section in the wafer process (mainly by a multi-epitaxy technique) in a manufacturing method (modification) for a semiconductor device in the second embodiment of the invention (the basic structure in FIG. 33 and the doping profile in FIG. 37 are taken as an example) (at the time of completion of p-type impurity implantation in second-tier n-type silicon epitaxial layer in multi-epitaxial growth and resist removal).

FIG. 70 illustrates a device section in the wafer process (mainly by a multi-epitaxy technique) in a manufacturing method (modification) for a semiconductor device in the second embodiment of the invention (step of forming first-tier n-type silicon epitaxial layer in multi-epitaxial growth). (The basic structure in FIG. 33 and the doping profile in FIG. 37 are taken as an example.) FIG. 71 illustrates a device section in the wafer process (mainly by a multi-epitaxy technique) in a manufacturing method (modification) for a semiconductor device in the second embodiment of the invention (step #1 of p-type impurity implantation in first-tier n-type silicon epitaxial layer in multi-epitaxial growth). (The basic structure in FIG. 33 and the doping profile in FIG. 37 are taken as an example.) FIG. 72 illustrates a device section in the wafer process (mainly by a multi-epitaxy technique) in a manufacturing method (modification) for a semiconductor device in the second embodiment of the invention (step of forming resist pattern for p-type impurity implantation in second-tier n-type silicon epitaxial layer in multi-epitaxial growth). (The basic structure in FIG. 33 and the doping profile in FIG. 37 are taken as an example.) FIG. 73 illustrates a device section in the wafer process (mainly by a multi-epitaxy technique) in a manufacturing method (modification) for a semiconductor device in the second embodiment of the invention (at the time of completion of p-type impurity implantation in second-tier n-type silicon epitaxial layer in multi-epitaxial growth and resist removal). (The basic structure in FIG. 33 and the doping profile in FIG. 37 are taken as an example.)

First, the processing illustrated in FIG. 70 is carried out similarly to (1) above. That is, a first-tier n-type silicon epitaxial layer 51n1 by multi-epitaxial growth, for example, 8 micrometers or so is formed on the front surface 1a side of the n+-type single crystal silicon wafer 1s.

Subsequently, as illustrated in FIG. 71, a resist film 53 for ion implantation is applied to the first-tier n-type silicon epitaxial layer 51n1 and is patterned by lithography. At this time, the opening width L2 of an opening for ion implantation for the extraordinary p-type column is made larger than the opening width L1 of an opening for ion implantation for the ordinary p-type column.

Subsequently, using the patterned resist film 53 for ion implantation as a mask, impurity ions corresponding to ordinary concentration is implanted in the first-tier p-type column region 51p1 of ordinary concentration and the first-tier p-type column region 52p1 of high concentration. Thereafter, the resist film 53 for ion implantation that became unnecessary is removed.

Subsequently, the processing illustrated in FIG. 72 is carried out. That is, a second-tier n-type silicon epitaxial layer 51n2 is formed similarly to FIG. 71; a resist film pattern 53 is formed thereover; ion implantation is carried out similarly to FIG. 71; and the resist film 53 that became unnecessary is removed. Thus the state illustrated in FIG. 73 is established. At this time, the opening width L2' of an opening for ion implantation for the extraordinary p-type column is so set that the following is implemented: it is larger than the opening width L1 of an opening for ion implantation for the ordinary p-type column and slightly smaller than the opening width L2 (FIG. 71) of an opening for ion implantation for the extraordinary p-type column. As a result, the following dose amount of the wide second-tier p-type column region 52p2 in ion implantation is obtained: a dose amount larger than the dose amount of the second-tier p-type column region 51p2 uniform in concentration in ion implantation and slightly smaller than the dose amount of the wide first-tier p-type column region 52p1 in ion implantation.

This repetitive process is repeated more than once (for example, six times) to obtain such a structure as illustrated in FIG. 41.

11. Description of a Modification (Trench Gate) to the Gate Structure of a Power MOSFET as an Example of a Semiconductor Device (Basic Structure and the Like) in the First Embodiment of the Invention (Mainly FIG. 43)

In this section, a trench gate will be described as a modification to the gate structure of the first embodiment. It is believed that trench vertical power MOSFETs having a superjunction are effective mainly to devices with a source-drain breakdown voltage of 100 volts to 300 volts or so. In the following description, therefore, devices with a source-drain breakdown voltage of 200 volts or so will be taken as an example.

Figure 43:
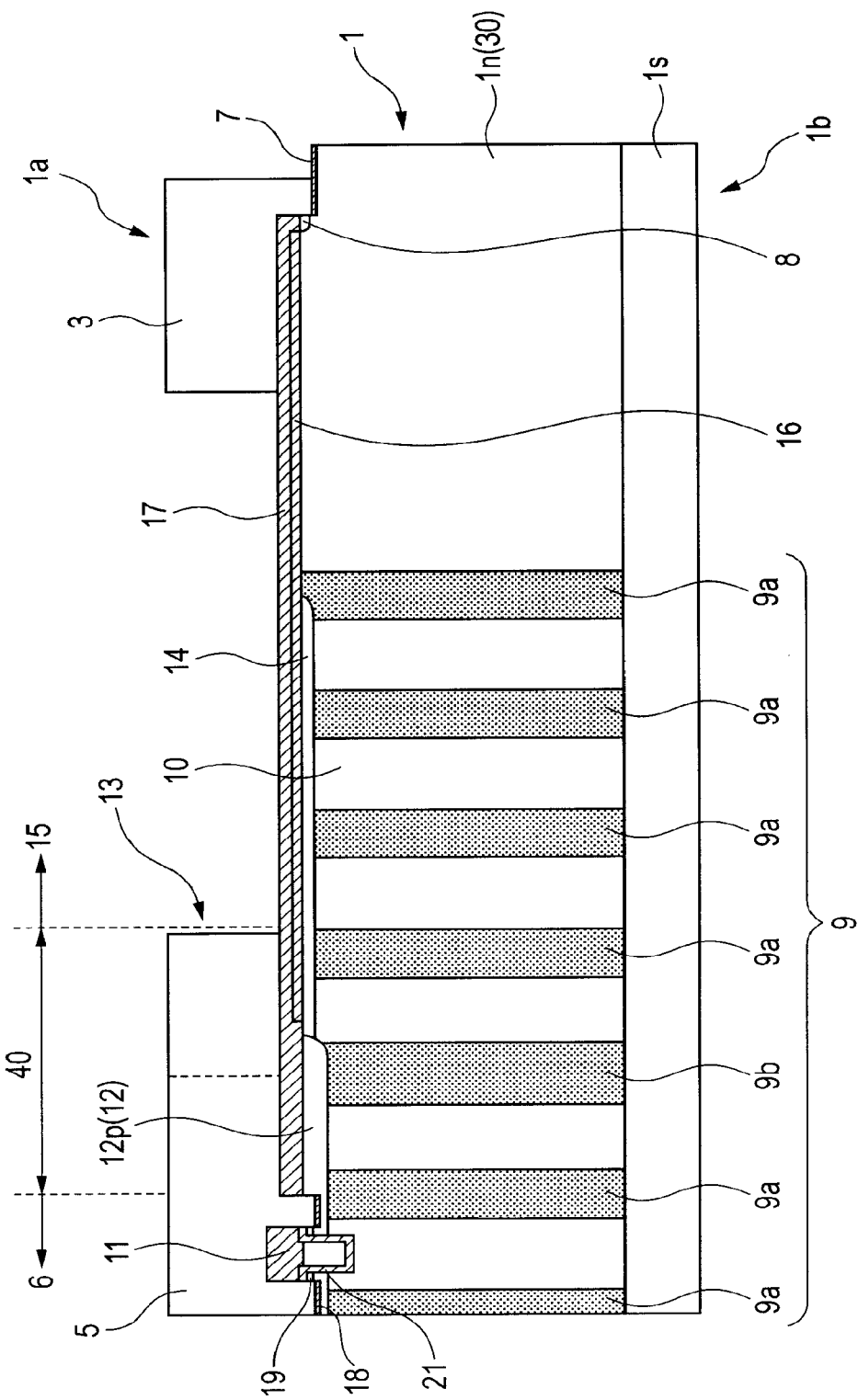
FIG. 43 is a device sectional view corresponding to the section taken along line A-A' of FIG. 3 corresponding to FIG. 4, related to a modification (trench gate) to the gate structure of a power MOSFET as an example of a semiconductor device (basic structure and the like) in the first embodiment of the invention.

FIG. 43 is a device sectional view corresponding to the section taken along line A-A' of FIG. 3 corresponding to FIG. 4. This drawing relates to a modification (trench gate) to the gate structure of a power MOSFET as an example of a semiconductor device (basic structure and the like) in the first embodiment of the invention. Description will be given to the modification (trench gate) to the gate structure of a power MOSFET as an example of a semiconductor device (basic structure and the like) in the first embodiment of the invention with reference to this drawing.

In this example, as illustrated in FIG. 43, a linear polysilicon gate electrode 11 is buried in a gate trench (linear groove for gate) with a gate insulating film 21 in between. This trench gate structure brings about an advantage that low on resistance can be easily achieved as compared with planar structures. Meanwhile, it is disadvantageous in achieving a source-drain breakdown voltage on the order of 500 to 600 volts as compared with planar structures.

The elements other than the gate portion are the same as described up to this point in relation to the first embodiment and the description thereof will not be repeated.

12. Description of the Device Structure (n/n-Multilayer Ordinary Epitaxy Type) of a Power MOSFET as an Example of a Semiconductor Device in the Third Embodiment of the Invention (Mainly FIG. 42, FIG. 44, and FIG. 45)

In the above examples, the source-drain breakdown voltage of a device is enhanced and other like purposes are accomplished by taking the following measure: the width of extraordinary p-type column regions 9b, 52p in an end area of the active cell region 6 or the concentration thereof is increased to locally operate charge balance; and electric field concentration is thereby prevented from occurring in a surface region in proximity to such extraordinary p-type column regions 9b, 52p. In the example described below, the source-drain breakdown voltage of a device is enhanced and other like purposes are accomplished by taking the following measure: based mainly on an epitaxy trench filling technique, an n-type silicon epitaxial layer 1n (ordinary epitaxy layer or base epitaxy layer) as a base for forming a superjunction is multi-stratified. Description will be given to a method for this.

Figure 42:
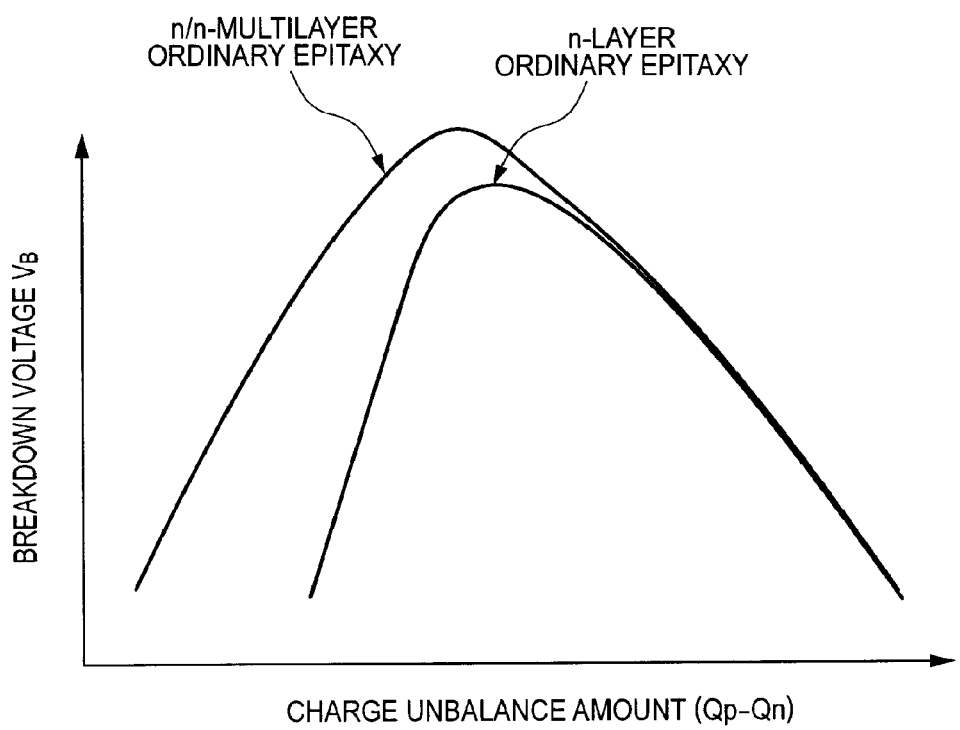
FIG. 42 is an explanatory drawing schematically illustrating the relation between breakdown voltage and charge unbalance observed in case of the n-type epitaxial structure (n/n-multilayer ordinary epitaxy structure) in FIG. 44 and a common single ordinary epitaxial structure.
Figure 44:
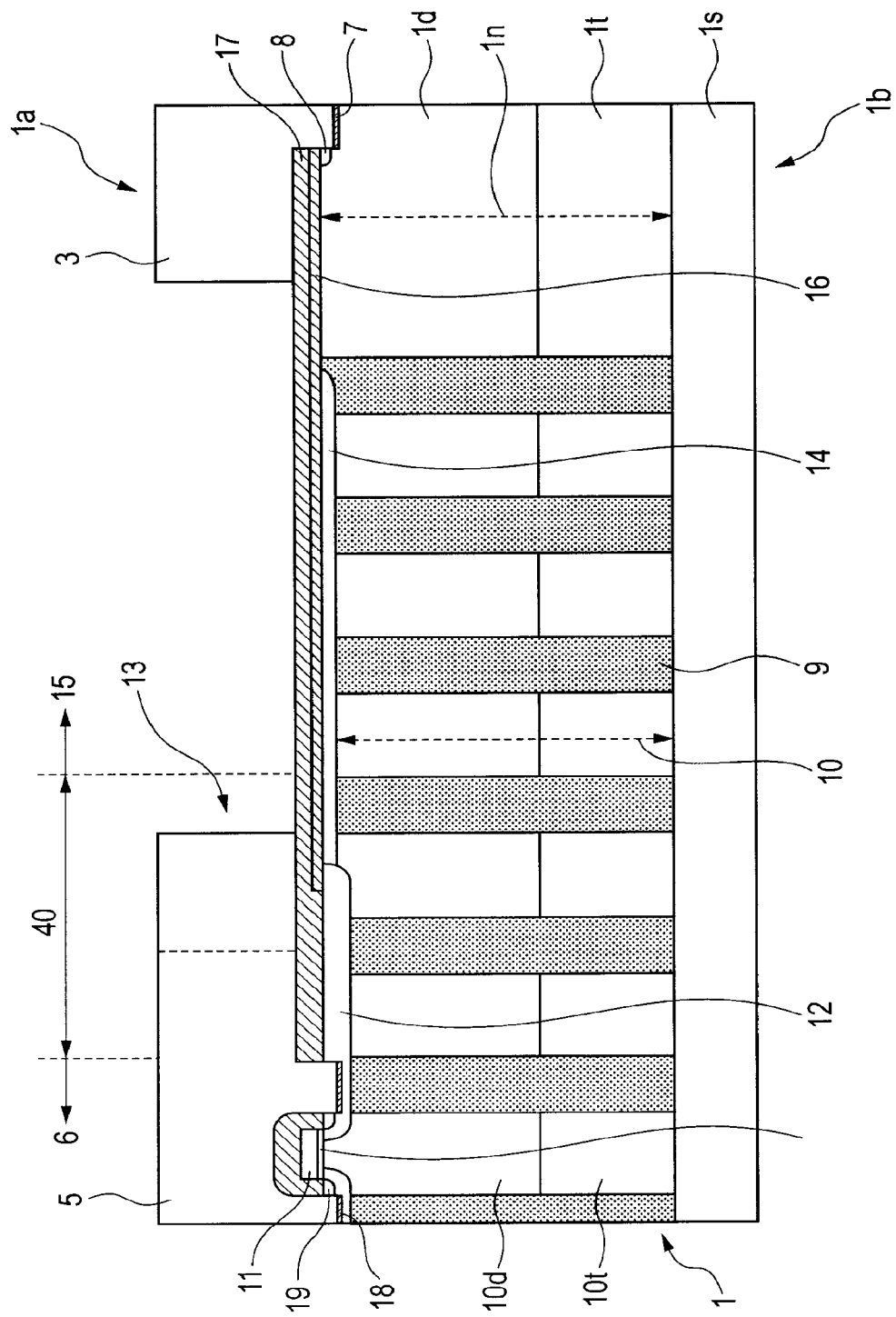
FIG. 44 is a device sectional view corresponding to the section taken along line A-A' of FIG. 3 corresponding to FIG. 4, related to the device structure (n/n-multilayer ordinary epitaxy type) of a power MOSFET of a semiconductor device in a third embodiment of the invention.
Figure 45:
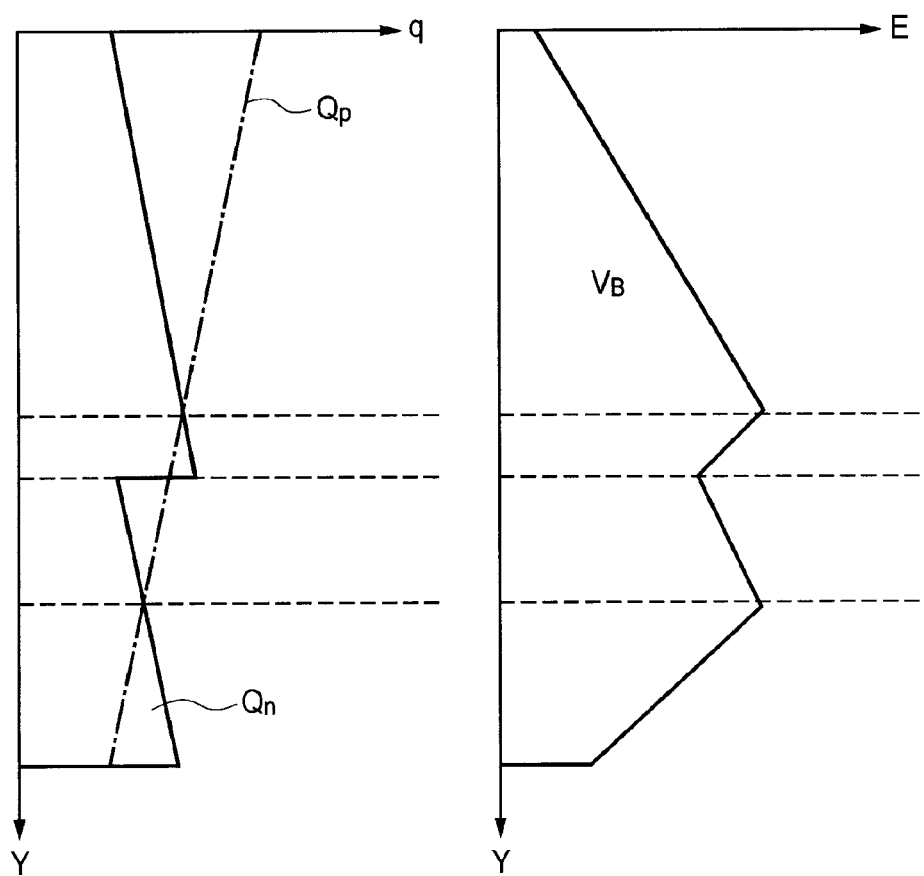
FIG. 45 is an explanatory drawing illustrating the relation between charge balance in the direction of depth and breakdown voltage in the superjunction in FIG. 44.

FIG. 44 is a device sectional view corresponding to the section taken along line A-A' of FIG. 3 corresponding to FIG. 4. This drawing relates to the device structure (n/n-multilayer ordinary epitaxy type) of a power MOSFET as an example of a semiconductor device in the third embodiment of the invention. FIG. 45 is an explanatory drawing showing the relation between charge balance in the direction of depth and breakdown voltage in the superjunction in FIG. 44. FIG. 42 is an explanatory drawing schematically illustrating the relation between breakdown voltage and charge unbalance observed in case of the n-type epitaxial structure (n/n-multilayer ordinary epitaxy structure) in FIG. 44 and a common single ordinary epitaxial structure. Description will be given to the device structure (n/n-multilayer ordinary epitaxy type) of a power MOSFET as an example of a semiconductor device in the third embodiment of the invention with reference to these drawings.

FIG. 44 is a device sectional view corresponding to the section taken along line A-A' of FIG. 3. As illustrated in FIG. 44, the semiconductor substrate 1 in which this device is formed is obtained by forming the following epitaxy layer over an n+-type single crystal silicon substrate is (on the back surface 1b side of the semiconductor substrate 1): a two-layer ordinary epitaxy layer 1n comprised of an n-type lower silicon epitaxial layer 1t and an n-type upper silicon epitaxial layer 1d. Therefore, an n-type upper column region 10d comprising an n-type upper column region 10 is part of the n-type upper silicon epitaxial layer 1d; and similarly, an n-type lower column region lot comprising an n-type column region 10 is part of the n-type lower silicon epitaxial layer 1*t*. A field insulating film 16 and a gate insulating film 21 are provided on the front surface 1*a* side of the semiconductor substrate 1 and a polysilicon gate electrode 11 is provided over the gate insulating film 21. An interlayer insulating film 17 is provided so that it covers the field insulating film 16 and the polysilicon gate electrode 11. In the surface region on the front surface 1*a* side of the semiconductor substrate 1, there is provided an n$^+$-type source region 19 formed in a self-aligned manner with respect to the polysilicon gate electrode 11. (An n$^+$-type channel stopper region 8 is usually formed at the same time as this step.) In the surface region on the front surface 1*a* side of the semiconductor substrate 1, there is provided a p$^+$-type body contact region 18 in correspondence with a contact hole formed in the interlayer insulating film 17 in the vicinity of the polysilicon gate electrode 11. The outermost peripheral p$^+$-type region 7 is usually formed at the same time as this step. Further, a guard ring 3, a source metal electrode 5, and the like comprised of a barrier metal film, an aluminum metal electrode film, or the like are formed over the interlayer insulating film 17. The area ranging from the outer half part of the p-type body region 12*p*(12) at an end of the active cell region 6 to the outer end portion of a field plate part 13 is the intermediate region 40. The area located outside the above area is the cell peripheral region 15.

FIG. 45 illustrates the electrical structure of the semiconductor substrate 1 in the superjunction structure in FIG. 44. In FIG. 45, the area on the left side indicates charge distribution (half pitch of a cycle period) and the area located on the right side indicates electric field strength distribution. (The electric field strength distribution is equivalent to the absolute values of electric field strength in proximity to the border between a p-type column region 9 and an n-type column region 10 and in proximity to its extended line.) As indicated in FIG. 45, in actuality, the width of the p-type column region 9 is often in a tapered shape and it is slightly reduced as it goes downward. Conversely, the width of an n-type column region 10 is often in a tapered shape and is slightly reduced as it goes upward. As a result, the distribution of donor and the distribution of acceptor in the minimum symmetrical unit region (left side of FIG. 45) between the following vertical center planes is as shown on the left side of FIG. 45: the vertical center plane of the p-type column region 9 as a symmetry plane and the vertical center plane of the n-type column region 10 in proximity thereto. (The area of the portion surrounded by the polygonal line and the y-axis is equivalent to the total quantity Qn of donor and the total quantity Qp of acceptor.) That is, it is understood that there are two points at which charge balance can be accurately held. In correspondence therewith, two maximum points (apexes) appear in the distribution of electric field strength E in correspondence with these two points as shown on the right side of FIG. 45. For this reason, the source-drain breakdown voltage $V_B$ (the area surrounded by the polygonal line and the y-axis) can be enhanced as compared with cases where there is one apex (that is, cases where the n-type column region 10 is comprised of one concentration region).

This will be considered with respect to the outer end portion of the active cell region 6 or the intermediate region 40. Multiple points at which charge balance is held are formed in the interior portion, not in the front surface, without fail; therefore, electric field concentration in the surface region can be avoided. FIG. 42 illustrates the relation between local charge balance and source-drain breakdown voltage based on comparison of a case of ordinary single epitaxial layer structure with a case of two-layer structure in this example. As shown in FIG. 42, the structure described in this section delivers high breakdown voltage over a relatively wide charge unbalance range.

13. Description of a Manufacturing Process (Mainly by an Epitaxy Trench Filling Technique) for the Device Structure (n/n-Multilayer Ordinary Epitaxy Type) of a Power MOSFET as an Example of a Semiconductor Device in the Third Embodiment of the Invention (Mainly FIG. 46 to FIG. 60)

In this section, description will be given to a substantial part of wafer process with the device section in FIG. 44 taken as an example. This process can also be applied to device structures described in the following sections substantially without change, except some differences.

Figure 46:
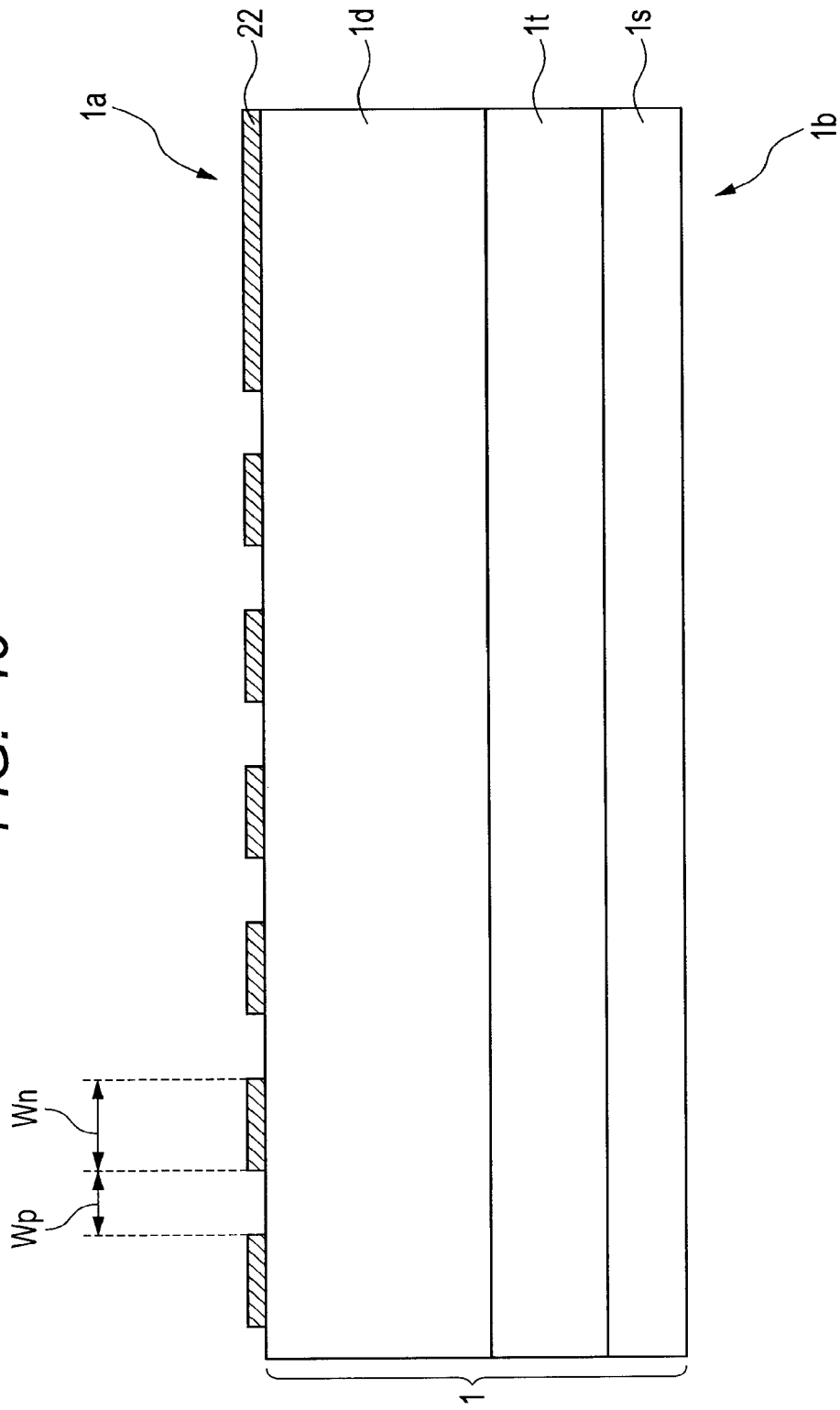
FIG. 46 is a device sectional view corresponding to the section taken along line A-A' of FIG. 3 corresponding to FIG. 4, illustrating a manufacturing process (mainly by an epitaxy trench filling technique) related to the device structure (n/n-multilayer ordinary epitaxy type) of a power MOSFET as an example of a semiconductor device in the third embodiment of the invention (step of patterning hard mask film for forming p-type column groove)
Figure 47:
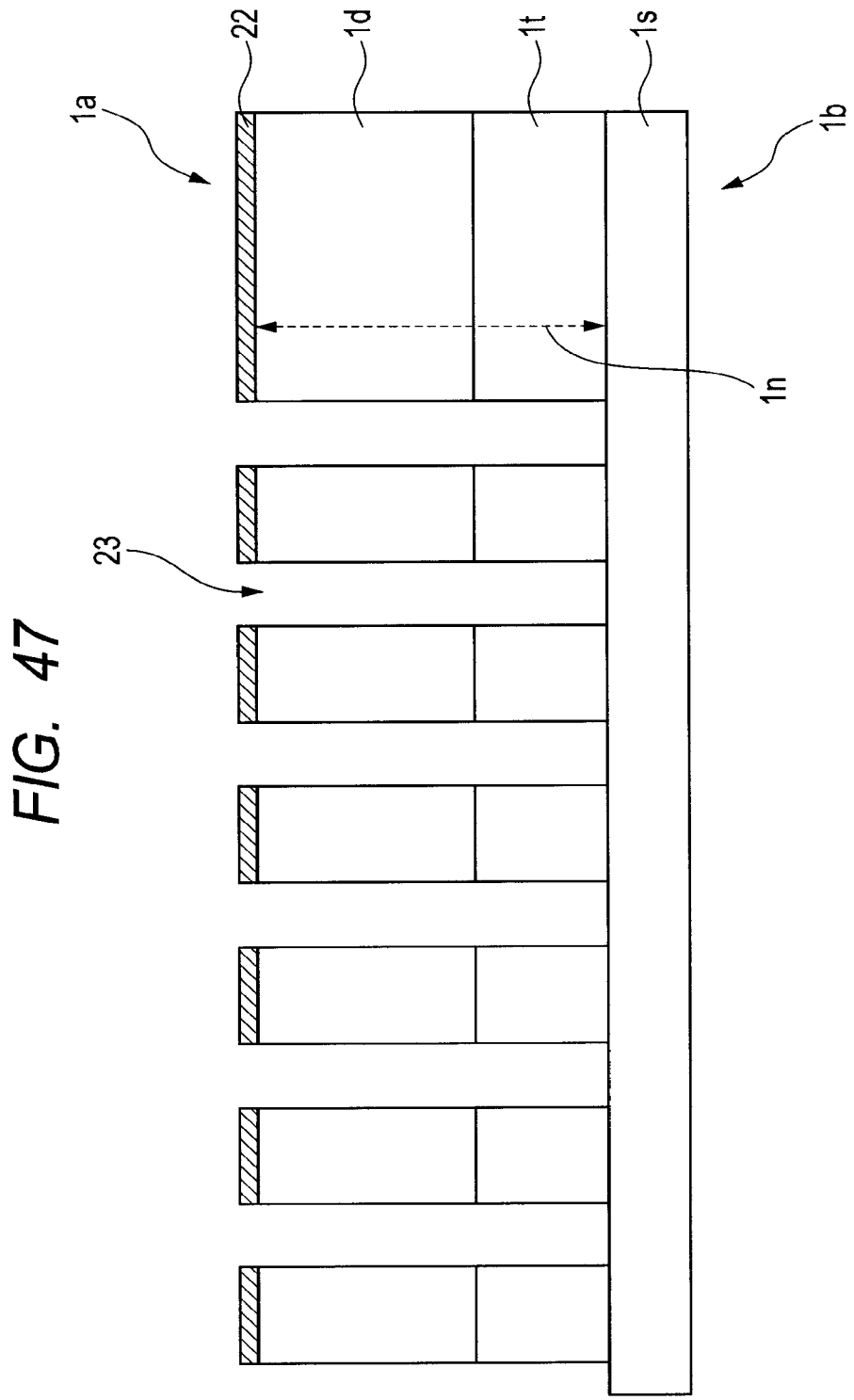
FIG. 47 is a device sectional view corresponding to the section taken along line A-A' of FIG. 3 corresponding to FIG. 4, illustrating a manufacturing process (mainly by an epitaxy trench filling technique) related to the device structure (n/n-multilayer ordinary epitaxy type) of a power MOSFET as an example of a semiconductor device in the third embodiment of the invention (p-type column groove etching step)
Figure 48:
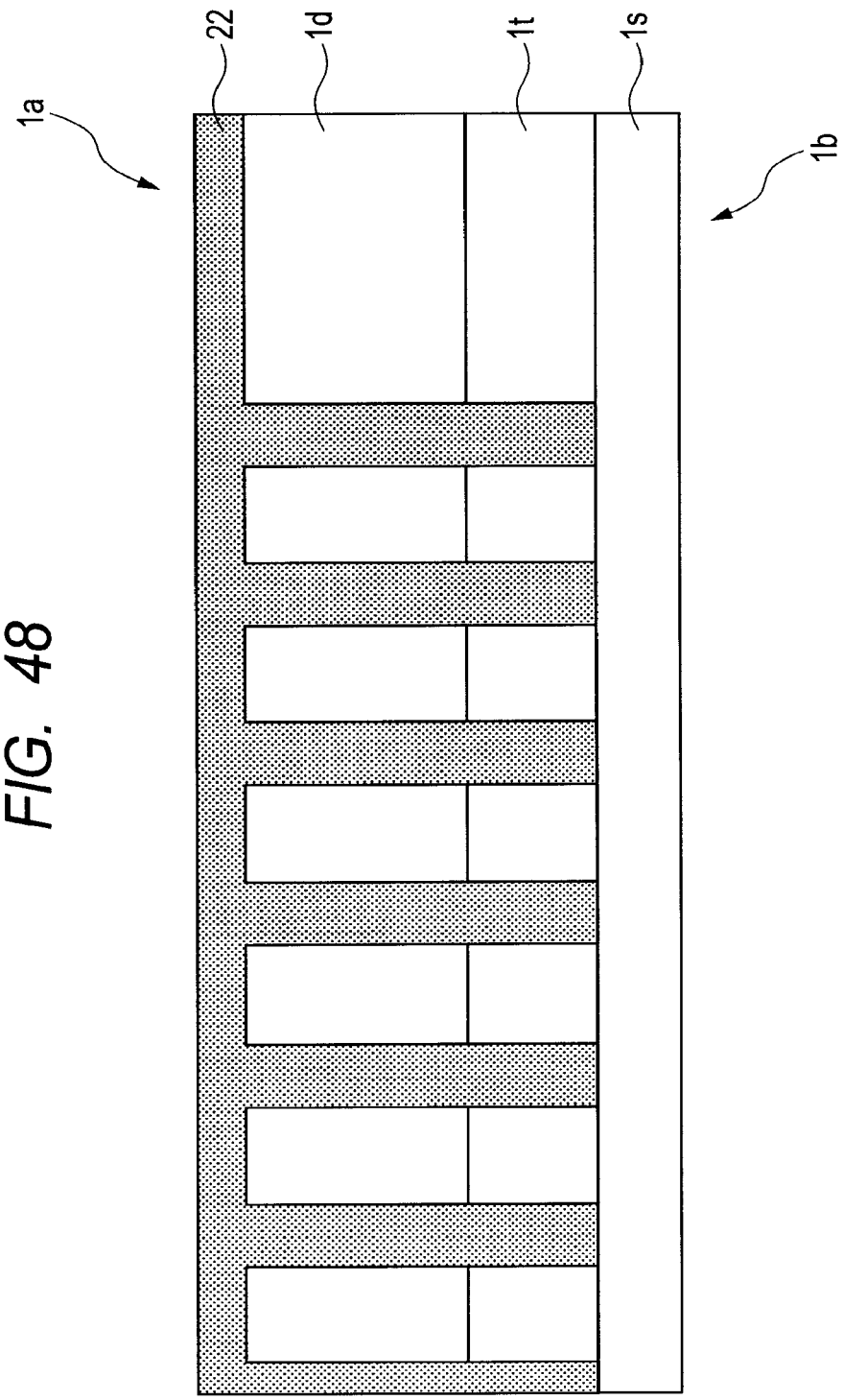
FIG. 48 is a device sectional view corresponding to the section taken along line A-A' of FIG. 3 corresponding to FIG. 4, illustrating a manufacturing process (mainly by an epitaxy trench filling technique) related to the device structure (n/n-multilayer ordinary epitaxy type) of a power MOSFET as an example of a semiconductor device in the third embodiment of the invention (epitaxy trench filling step)
Figure 49:
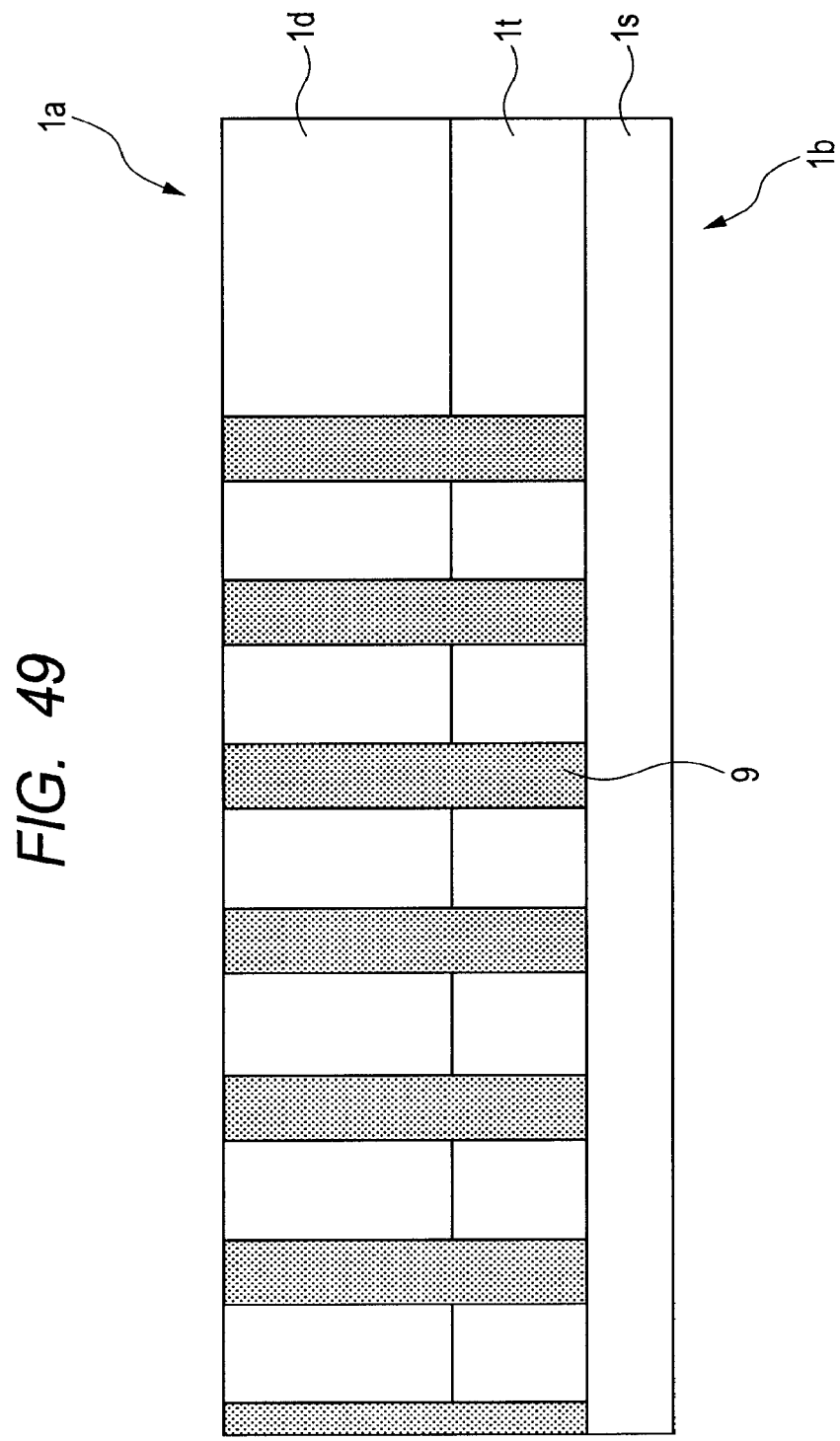
FIG. 49 is a device sectional view corresponding to the section taken along line A-A' of FIG. 3 corresponding to FIG. 4, illustrating a manufacturing process (mainly by an epitaxy trench filling technique) related to the device structure (n/n-multilayer ordinary epitaxy type) of a power MOSFET as an example of a semiconductor device in the third embodiment of the invention (planarization step)
Figure 50:
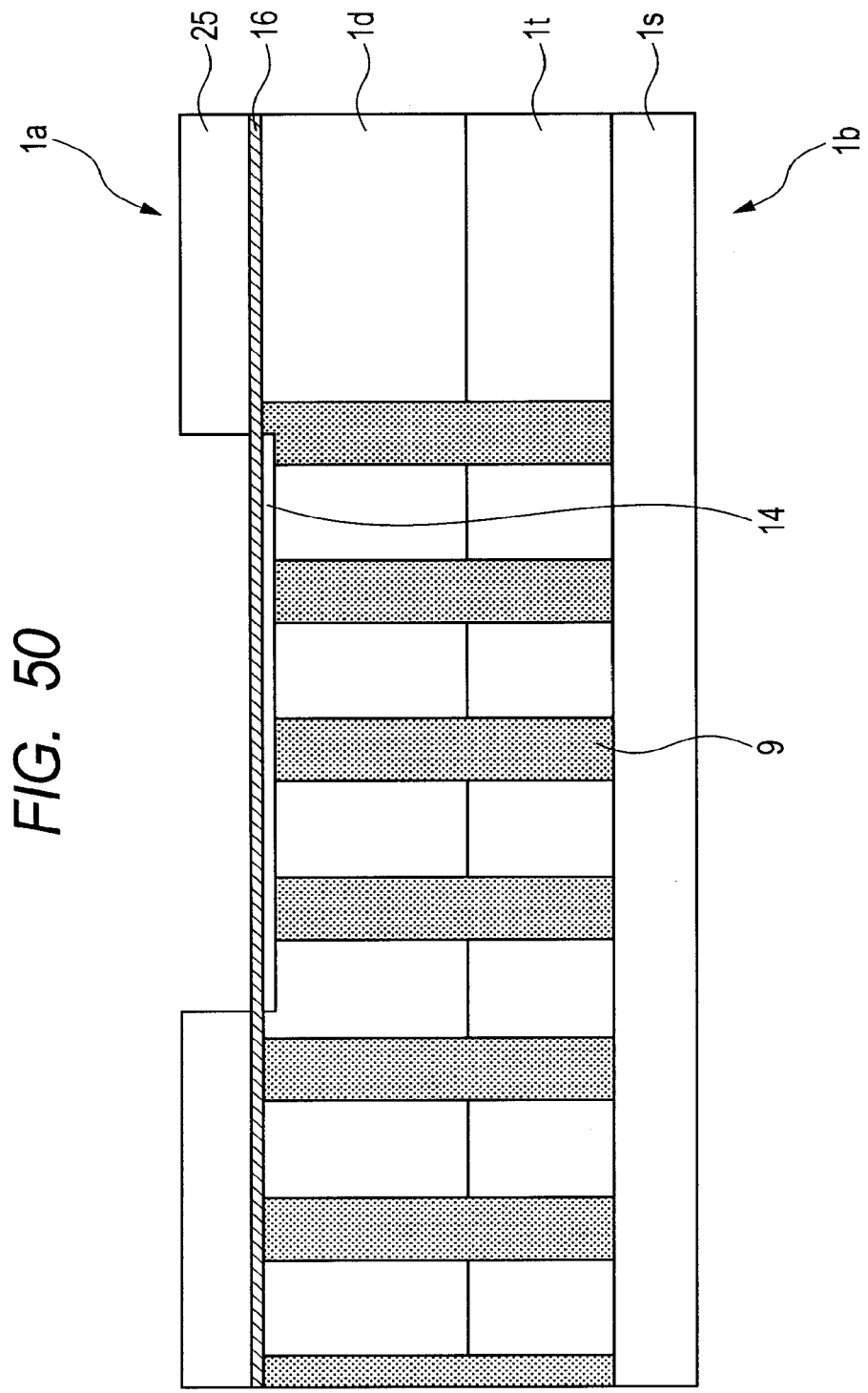
FIG. 50 is a device sectional view corresponding to the section taken along line A-A' of FIG. 3 corresponding to FIG. 4, illustrating a manufacturing process (mainly by an epitaxy trench filling technique) related to the device structure (n/n-multilayer ordinary epitaxy type) of a power MOSFET as an example of a semiconductor device in the third embodiment of the invention ($p^-$-type RESURF region introduction step)
Figure 51:
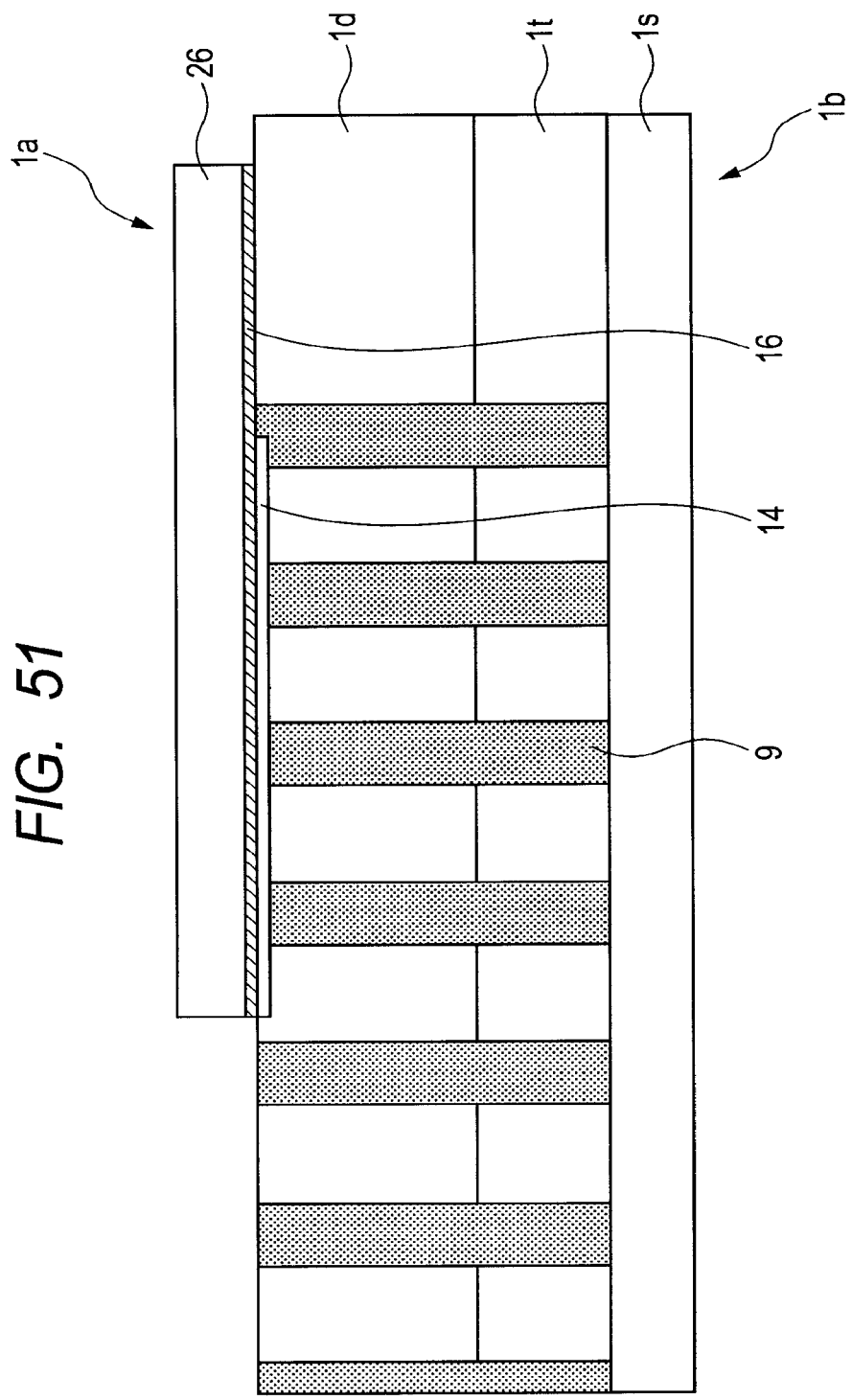
FIG. 51 is a device sectional view corresponding to the section taken along line A-A' of FIG. 3 corresponding to FIG. 4, illustrating a manufacturing process (mainly by an epitaxy trench filling technique) related to the device structure (n/n-multilayer ordinary epitaxy type) of a power MOSFET as an example of a semiconductor device in the third embodiment of the invention (field insulating film etching step)
Figure 52:
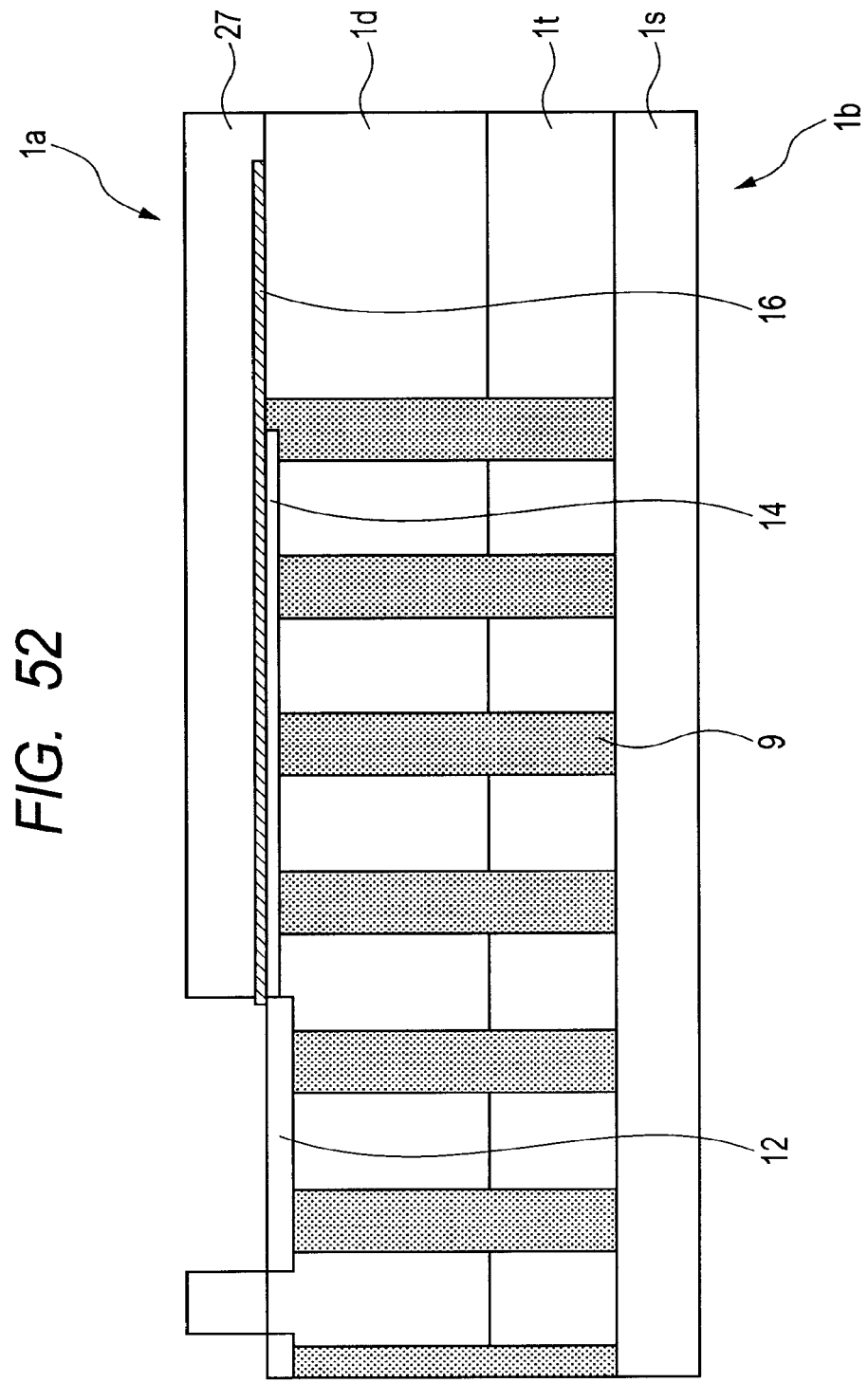
FIG. 52 is a device sectional view corresponding to the section taken along line A-A' of FIG. 3 corresponding to FIG. 4, illustrating a manufacturing process (mainly by an epitaxy trench filling technique) related to the device structure (n/n-multilayer ordinary epitaxy type) of a power MOSFET an example of a semiconductor device in the third embodiment of the invention (p-type body region introduction step)
Figure 53:
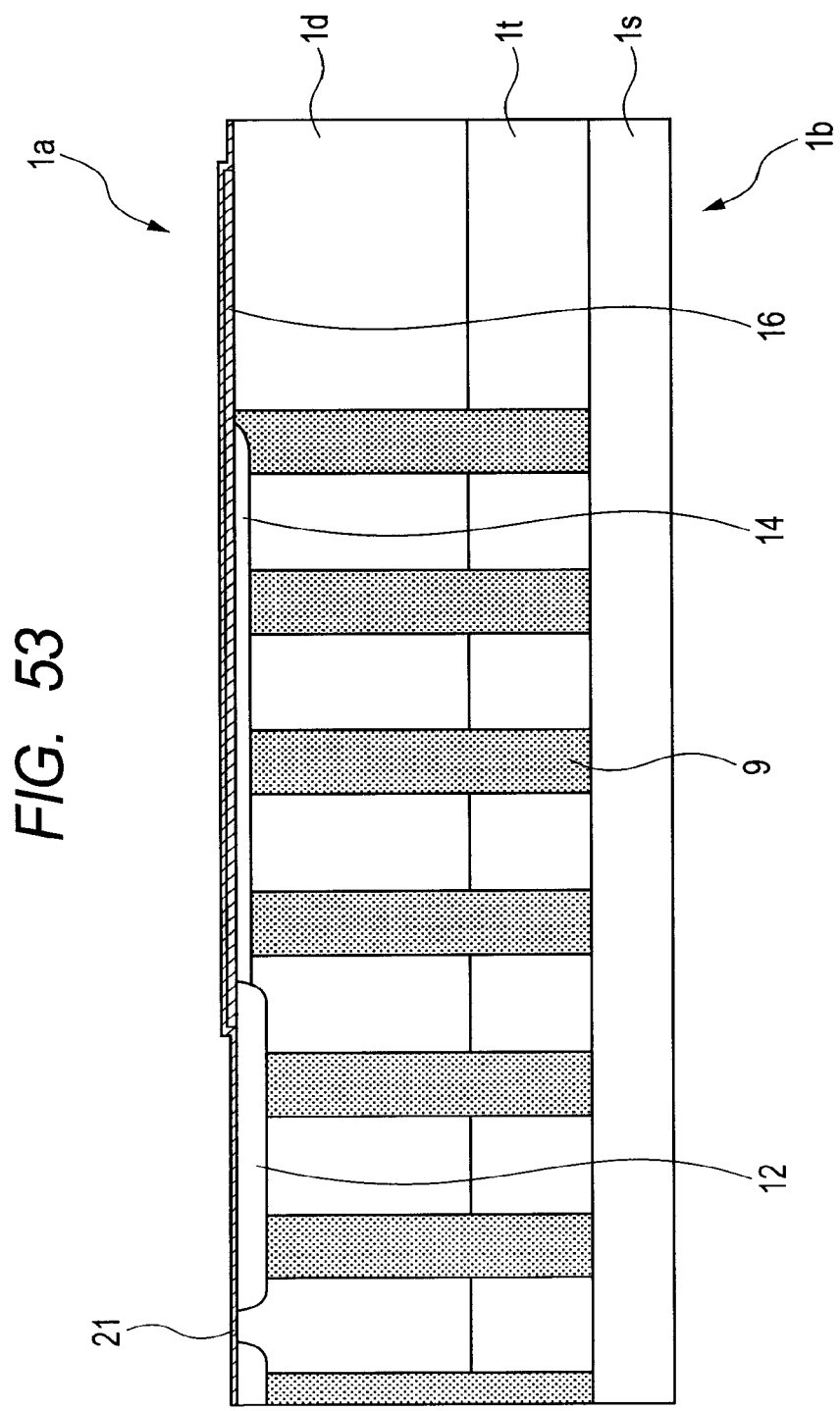
FIG. 53 is a device sectional view corresponding to the section taken along line A-A' of FIG. 3 corresponding to FIG. 4, illustrating a manufacturing process (mainly by an epitaxy trench filling technique) related to the device structure (n/n-multilayer ordinary epitaxy type) of a power MOSFET as an example of a semiconductor device in the third embodiment of the invention (gate oxidation step)
Figure 54:
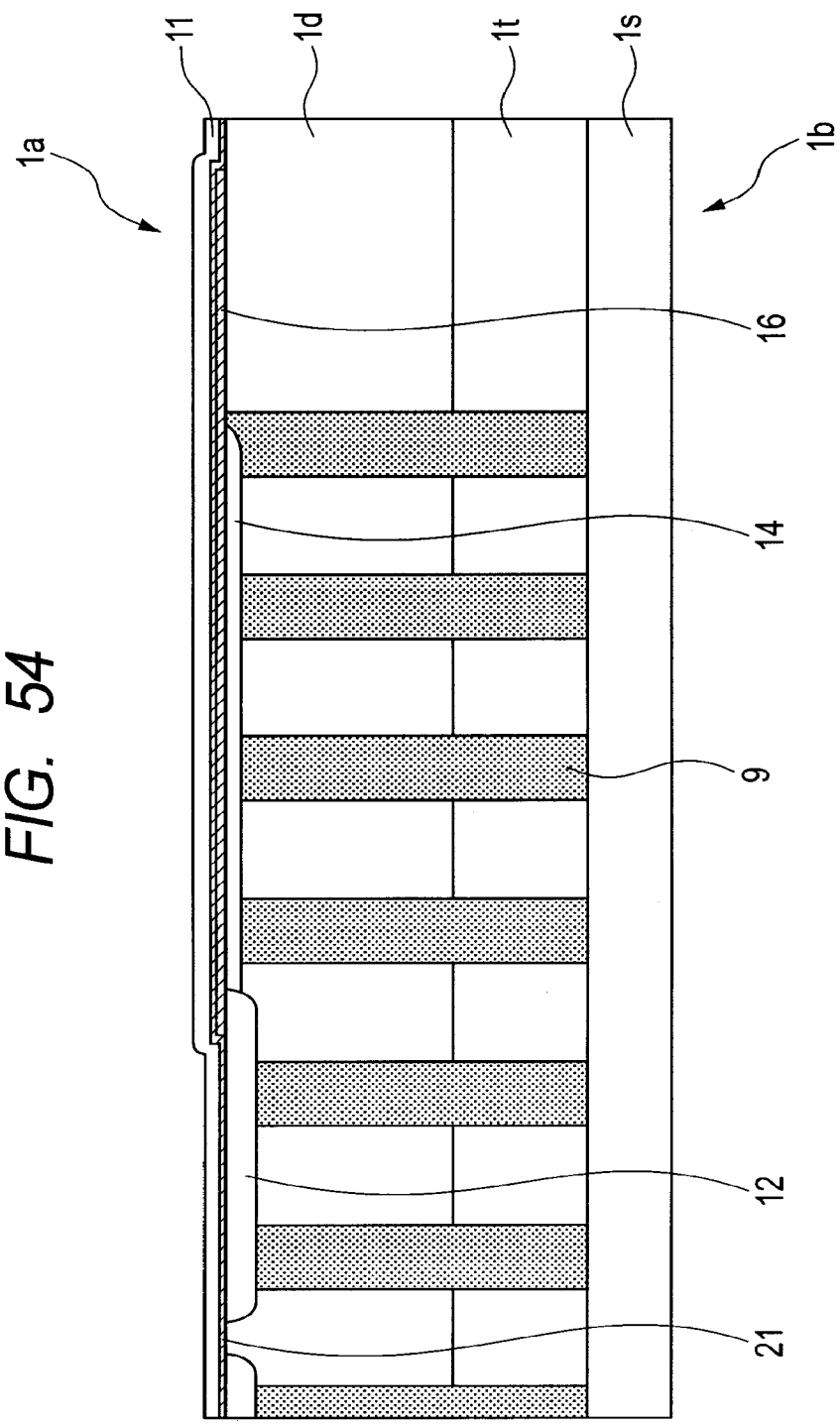
FIG. 54 is a device sectional view corresponding to the section taken along line A-A' of FIG. 3 corresponding to FIG. 4, illustrating a manufacturing process (mainly by an epitaxy trench filling technique) related to the device structure (n/n-multilayer ordinary epitaxy type) of a power MOSFET as an example of semiconductor device in the third embodiment of the invention (gate polysilicon film formation step)
Figure 55:
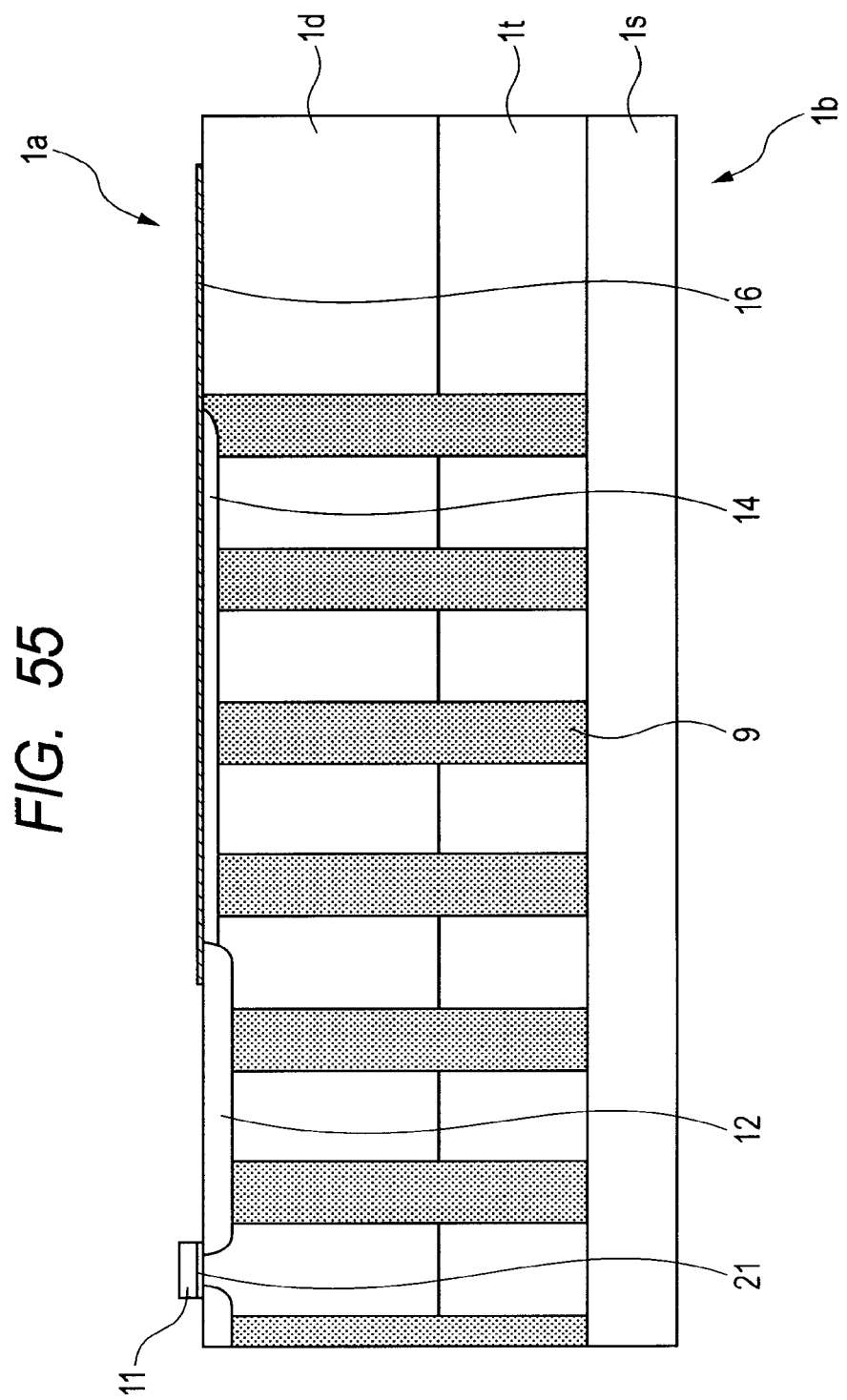
FIG. 55 is a device sectional view corresponding to the section taken along line A-A' of FIG. 3 corresponding to FIG. 4, illustrating a manufacturing process (mainly by an epitaxy trench filling technique) related to the device structure (n/n-multilayer ordinary epitaxy type) of a power MOSFET as an example of a semiconductor device in the third embodiment of the invention (gate polysilicon film patterning step)
Figure 56:
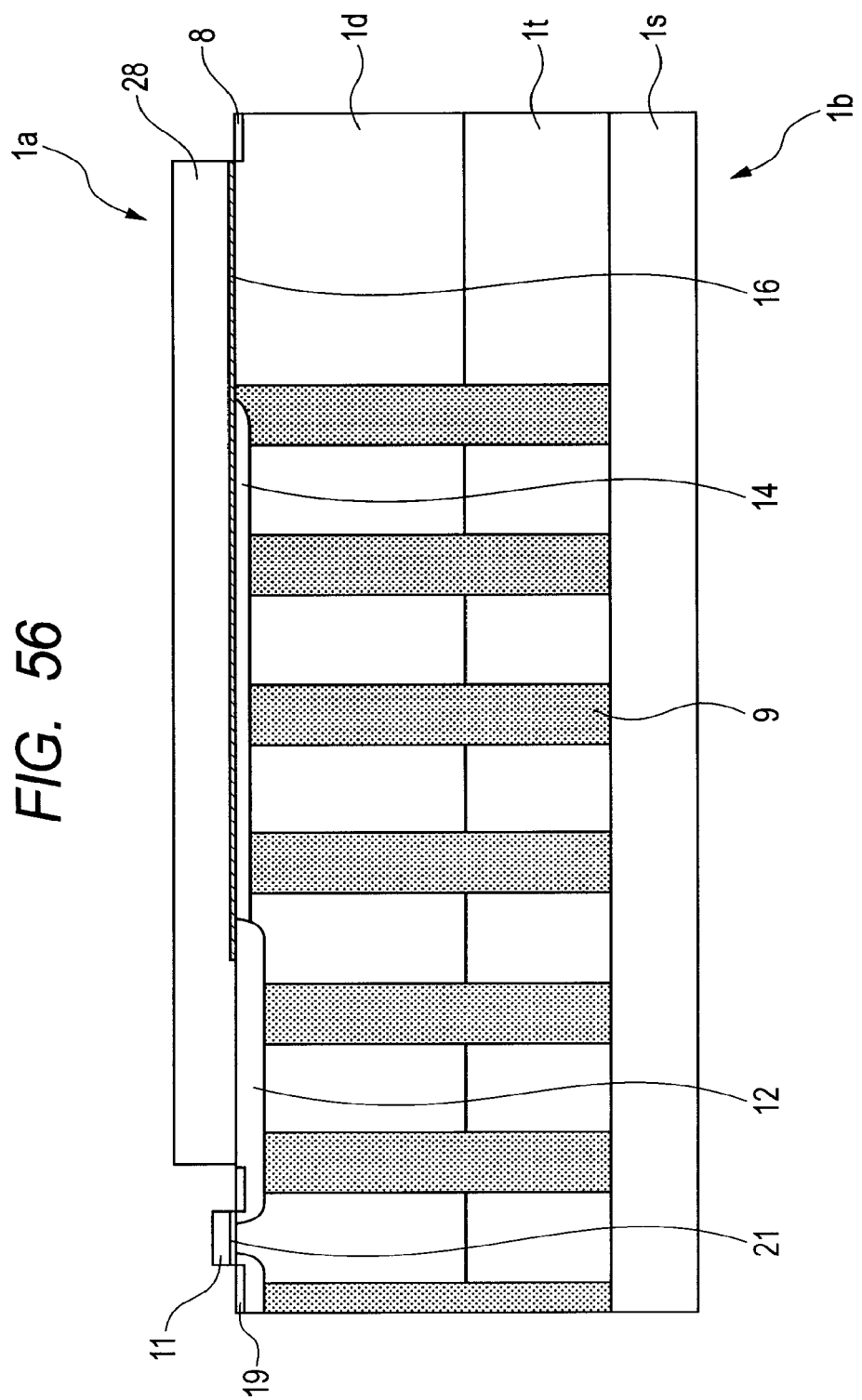
FIG. 56 is a device sectional view corresponding to the section taken along line A-A' of FIG. 3 corresponding to FIG. 4, illustrating a manufacturing process (mainly by an epitaxy trench filling technique) related to the device structure (n/n-multilayer ordinary epitaxy type) of a power MOSFET as an example of semiconductor device in the third embodiment of the invention ($n^+$-type source region introduction step)
Figure 57:
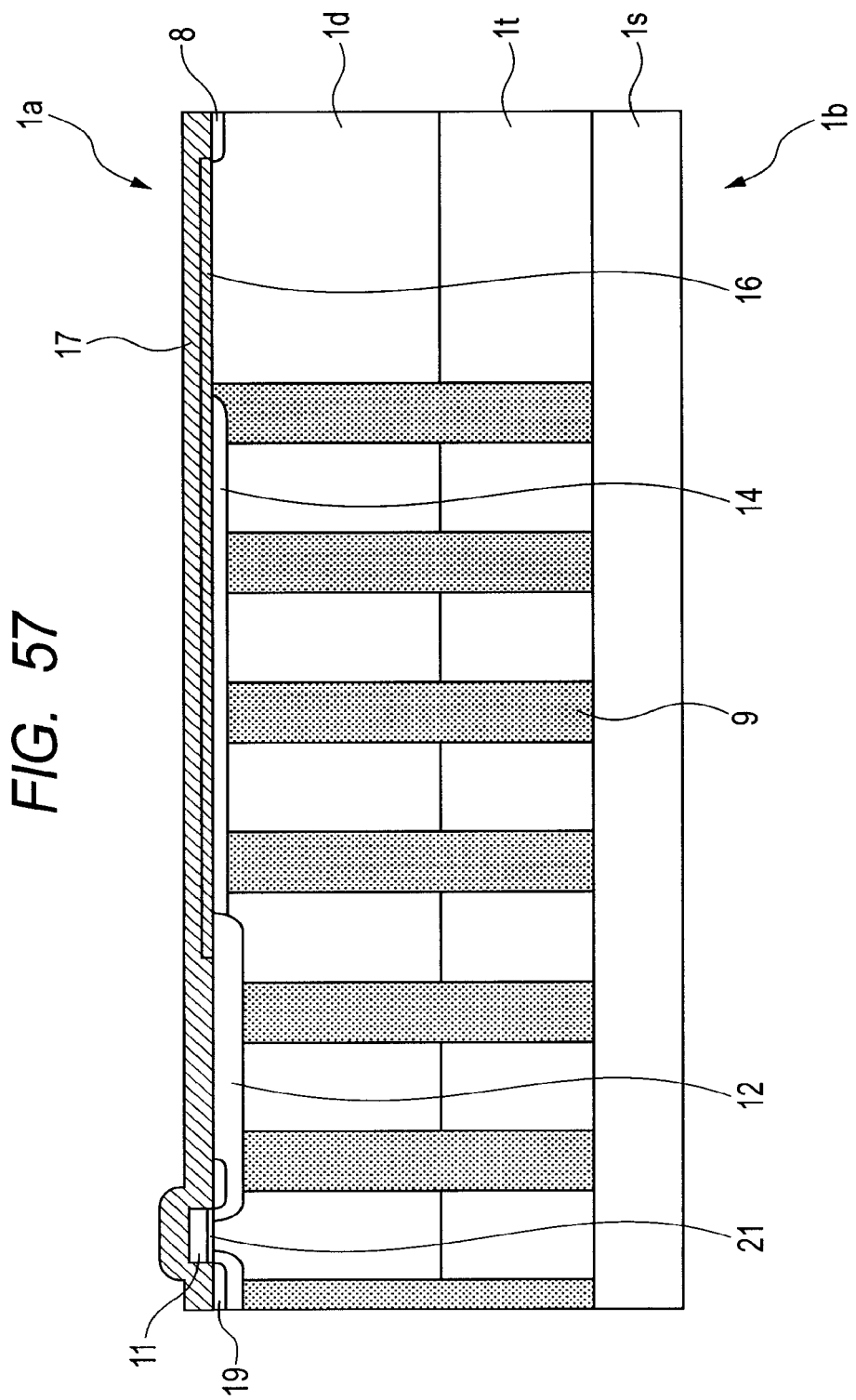
FIG. 57 is a device sectional view corresponding to the section taken along line A-A' of FIG. 3 corresponding to FIG. 4, illustrating a manufacturing process (mainly by an epitaxy trench filling technique) related to the device structure (n/n-multilayer ordinary epitaxy type) of a power MOSFET as an example of a semiconductor device in the third embodiment of the invention (interlayer insulating film formation step)
Figure 58:
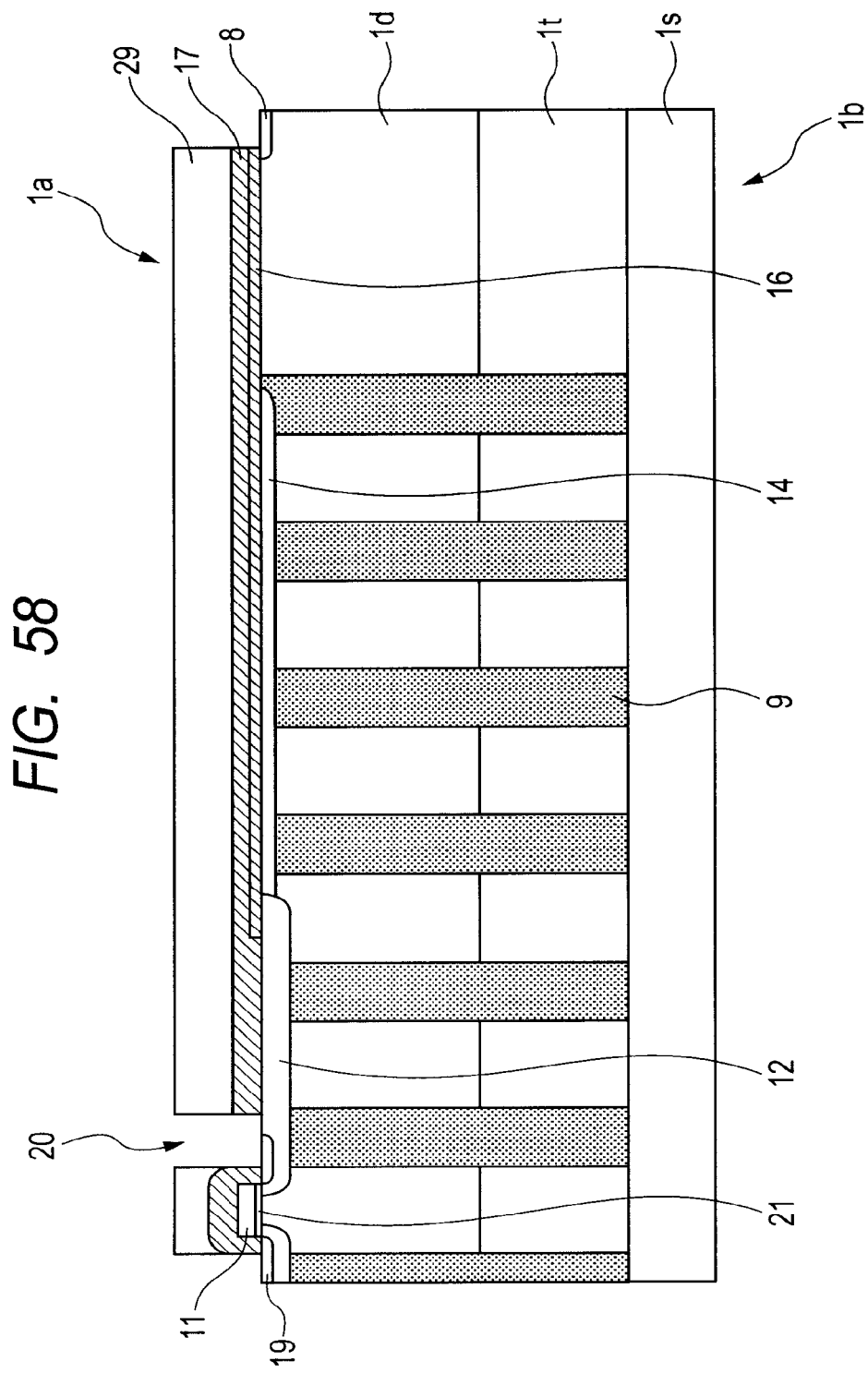
FIG. 58 is a device sectional view corresponding to the section taken along line A-A' of FIG. 3 corresponding to FIG. 4, illustrating a manufacturing process (mainly by an epitaxy trench filling technique) related to the device structure (n/n-multilayer ordinary epitaxy type) of a power MOSFET as an example of a semiconductor device in the third embodiment of the invention (contact hole formation step)
Figure 59:
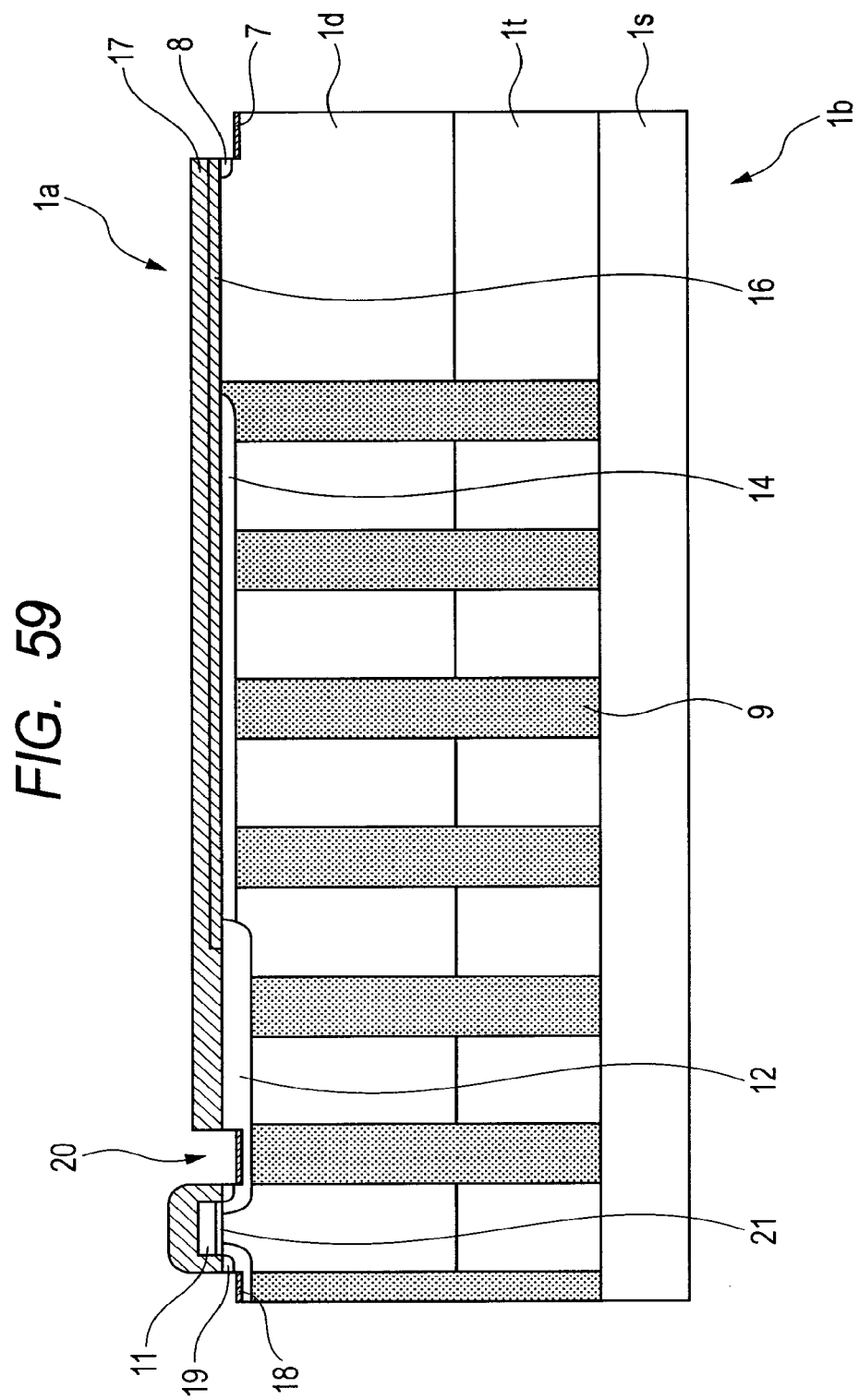
FIG. 59 is a device sectional view corresponding to the section taken along line A-A' of FIG. 3 corresponding to FIG. 4, illustrating a manufacturing process (mainly by an epitaxy trench filling technique) related to the device structure (n/n-multilayer ordinary epitaxy type) of a power MOSFET as an example of a semiconductor device in the third embodiment of the invention ($p^+$-type body contact region introduction step)
Figure 60:
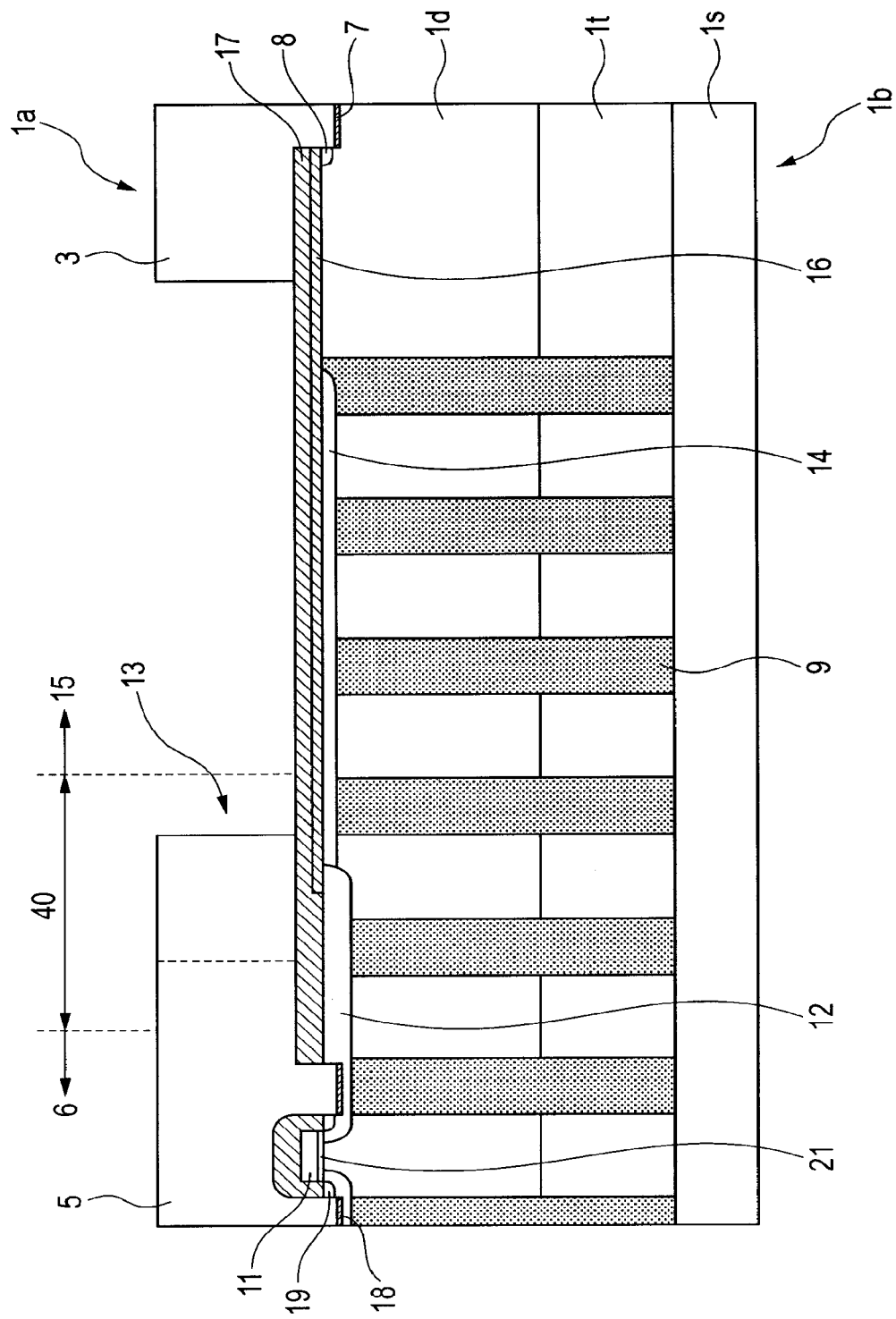
FIG. 60 is a device sectional view corresponding to the section taken along line A-A' of FIG. 3 corresponding to FIG. 4, illustrating a manufacturing process (mainly by an epitaxy trench filling technique) related to the device structure (n/n-multilayer ordinary epitaxy type) of a power MOSFET as an example of a semiconductor device in the third embodiment of the invention (aluminum metal electrode formation step)

FIG. 46 is a device sectional view corresponding to the section taken along line A-A' of FIG. 3 corresponding to FIG. 4. This drawing illustrates a manufacturing process (mainly by an epitaxy trench filling technique) related to the device structure (n/n-multilayer ordinary epitaxy type) of a power MOSFET as an example of a semiconductor device in the third embodiment of the invention (step of patterning hard mask film for forming p-type column groove). FIG. 47 is a device sectional view corresponding to the section taken along line A-A' of FIG. 3 corresponding to FIG. 4. This drawing illustrates a manufacturing process (mainly by an epitaxy trench filling technique) related to the device structure (n/n-multilayer ordinary epitaxy type) of a power MOSFET as an example of a semiconductor device in the third embodiment of the invention (p-type column groove etching step). FIG. 48 is a device sectional view corresponding to the section taken along line A-A' of FIG. 3 corresponding to FIG. 4. The drawing illustrates a manufacturing process (mainly by an epitaxy trench filling technique) related to the device structure (n/n-multilayer ordinary epitaxy type) of a power MOSFET as an example of a semiconductor device in the third embodiment of the invention (epitaxy trench filling step). FIG. 49 is a device sectional view corresponding to the section taken along line A-A' of FIG. 3 corresponding to FIG. 4. This drawing illustrates a manufacturing process (mainly by an epitaxy trench filling technique) related to the device structure (n/n-multilayer ordinary epitaxy type) of a power MOSFET as an example of a semiconductor device in the third embodiment of the invention (planarization step). FIG. 50 is a device sectional view corresponding to the section taken along line A-A' of FIG. 3 corresponding to FIG. 4. This drawing illustrates a manufacturing process (mainly by an epitaxy trench filling technique) related to the device structure (n/n-multilayer ordinary epitaxy type) of a power MOSFET as an example of a semiconductor device in the third embodiment of the invention (p$^-$-type RESURF region introduction step). FIG. 51 is a device sectional view corresponding to the section taken along line A-A' of FIG. 3 corresponding to FIG. 4. This drawing illustrates a manufacturing process (mainly by an epitaxy trench filling technique) related to the device structure (n/n-multilayer ordinary epitaxy type) of a power MOSFET as an example of a semiconductor device in the third embodiment of the invention (field insulating film etching step). FIG. 52 is a device sectional view corresponding to the section taken along line A-A' of FIG. 3 corresponding to FIG. 4. This drawing illustrates a manufacturing process (mainly by an epitaxy trench filling technique) related to the device structure (n/n-multilayer ordinary epitaxy type) of a power MOSFET as an example of a semiconductor device in the third embodiment of the invention (p-type body region introduction step). FIG. 53 is a device sectional view corresponding to the section taken along line A-A' of FIG. 3 corresponding to FIG. 4. This drawing illustrates a manufacturing process (mainly by an epitaxy trench filling technique) related to the device structure (n/n-multilayer ordinary epitaxy type) of a power MOSFET as an example of a semiconductor device in the third embodiment of the invention (gate oxidation step). FIG. 54 is a device sectional view corresponding to the section taken along line A-A' of FIG. 3 corresponding to FIG. 4. This drawing illustrates a manufacturing process (mainly by an epitaxy trench filling technique) related to the device structure (n/n-multilayer ordinary epitaxy type) of a power MOSFET as an example of a semiconductor device in the third embodiment of the invention (gate polysilicon film formation step). FIG. 55 is a device sectional view corresponding to the section taken along line A-A' of FIG. 3 corresponding to FIG. 4. This drawing illustrates a manufacturing process (mainly by an epitaxy trench filling technique) related to the device structure (n/n-multilayer ordinary epitaxy type) of a power MOSFET as an example of a semiconductor device in the third embodiment of the invention (gate polysilicon film patterning step). FIG. 56 is a device sectional view corresponding to the section taken along line A-A' of FIG. 3 corresponding to FIG. 4. This drawing illustrates a manufacturing process (mainly by an epitaxy trench filling technique) related to the device structure (n/n-multilayer ordinary epitaxy type) of a power MOSFET as an example of a semiconductor device in the third embodiment of the invention ($n^+$-type source region introduction step). FIG. 57 is a device sectional view corresponding to the section taken alone line A-A' of FIG. 3 corresponding to FIG. 4. This drawing illustrates a manufacturing process (mainly by an epitaxy trench filling technique) related to the device structure (n/n-multilayer ordinary epitaxy type) of a power MOSFET as an example of a semiconductor device in the third embodiment of the invention (interlayer insulating film formation step). FIG. 58 is device sectional view corresponding to the section taken along line A-A' of FIG. 3 corresponding to FIG. 4. This drawing illustrates a manufacturing process (mainly by an epitaxy trench filling technique) related to the device structure (n/n-multilayer ordinary epitaxy type) of a power MOSFET as an example of a semiconductor device in the third embodiment of the invention (contact hole formation step). FIG. 59 is a device sectional view corresponding to the section taken along line A-A' of FIG. 3 corresponding to FIG. 4. This drawing illustrates a manufacturing process (mainly by an epitaxy trench filling technique) related to the device structure (n/n-multilayer ordinary epitaxy type) of a power MOSFET as an example of a semiconductor device in the third embodiment of the invention ($p^+$-type body contact region introduction step). FIG. 60 is a device sectional view corresponding to the section taken along line A-A' of FIG. 3 corresponding to FIG. 4. This drawing illustrates a manufacturing process (mainly by an epitaxy trench filling technique) related to the device structure (n/n-multilayer ordinary epitaxy type) of a power MOSFET as an example of a semiconductor device in the third embodiment of the invention (aluminum metal electrode formation step). Description will be given to a manufacturing process (mainly by an epitaxy trench filling technique) for the device structure (n/n-multilayer ordinary epitaxy type) of a power MOSFET as an example of a semiconductor device in the third embodiment of the invention with reference to these drawings.

First, the processing described in Section 2 is carried out as illustrated in FIG. 46. That is, a semiconductor wafer 1 in which an n-epitaxial layer in, 50 micrometers or so in thickness, doped with phosphorus is formed over an $n^+$-silicon single crystal substrate 1s doped with antimony is prepared. (Antimony is doped to the order of, for example, $10^{18}$ to $10^{19}/cm^3$.) (In this example, the $n^+$-silicon single crystal substrate 1s is, for example, a 200φ-wafer. The wafer diameter may be 150φ, 300φ, or 450φ.) (In terms of device, the n-epitaxial layer in is a region to be a drift region and the concentration is, for example, the order of $10^{15}/cm^3$ or so. More specific description will be given. When the thickness of the n-type lower silicon epitaxial layer it is 20 micrometers or so and its phosphorus concentration is $3\times10^{15}/cm^3$ or so, the n-type upper silicon epitaxial layer 1d is so set that the following is implemented: its thickness is 30 micrometers or so and its phosphorus concentration is $2.5\times10^{15}/cm^3$ or so.) A hard mask film 22 for forming trenches for p-type columns comprised of, for example, P-TEOS (Plasma-Tetraethylorthosilicate) or the like is formed over the device surface 1a (main surface on the opposite side to the back surface 1b) of the semiconductor wafer 1. The width Wn of the n-type column region at the patterning level is, for example, 6 micrometers or so and the width Wp of the p-type column region is, for example, 4 micrometers or so. (That is, the pitch of the superjunction is 10 micrometers or so.)

Subsequently, as illustrated in FIG. 47, the n-epitaxial layer 1n and the like are subjected to anisotropic dry etching with the hard mask film 22 for forming trenches for p-type columns used as a mask. (The hard mask film 22 is, for example, a plasma TEOS film, a silicon nitride film, or a laminated film of them and an example of its thickness is 1.5 micrometers or so.) (An example of the gas atmosphere is a mixed atmosphere of Ar, $SF_6$, $O_2$, and the like and an example of the etching depth is 50 micrometers or so.) Trenches 23 for p-type columns are thereby formed. Subsequently, the hard mask film 22 that became unnecessary is removed.

Subsequently, as illustrated in FIG. 48, burying epitaxial growth is carried out on the trenches 23 for p-type columns to form a p-type burying epitaxial layer 24. (The boron concentration is, for example, $5\times10^{15}/cm^3$ or so.) Examples of the source gas for burying epitaxial growth are silicon tetrachloride, trichlorosilane, dichlorosilane, and monosilane. An example of the preferable range of processing atmospheric pressure is 10 kPa to 110 kPa or so.

Subsequently, as illustrated in FIG. 49, the p-type burying epitaxial layer 24 located outside the trenches 23 for p-type columns is removed by a planarization step, for example, CMP (Chemical Mechanical Polishing). Then the front surface 1a of the semiconductor wafer 1 is planarized.

Substantially, as illustrated in FIG. 50, a silicon oxide film 16 is formed over substantially the entire front surface 1a of the semiconductor wafer 1 by thermal oxidation. (The silicon oxide film 16 is a field oxide film and its thickness is, for example, 350 nm or so.) A resist film 25 for introducing a $p^-$-type RESURF region is formed thereover by lithography. Subsequently, a $p^-$-type surface RESURF region 14 is introduced by ion implantation with the resist film 25 for introducing a $p^-$-type RESURF region used as a mask. (The dopant is, for example, boron; the dose amount is, for example, $1\times10^{11}$ to $1\times10^{12}/cm^2$ or so; and the implantation energy is, for example, 200 keV or so.) Thereafter, the resist film 25 that became unnecessary is entirely removed.

Subsequently, as illustrated in FIG. 51, a resist film 26 for field insulating film processing is formed over the field oxide film 16 by lithography and using it as a mask, the edge portions, active cell region 6, and the like of the chip are exposed. Thereafter, the resist film 26 that became unnecessary is entirely removed.

Subsequently, as illustrated in FIG. 52, a resist film 27 for p-type body region introduction is formed over the front surface 1a of the semiconductor wafer 1 by lithography. Using this film as a mask, a p-type body region 12 is introduced by ion implantation (the dopant is boron). This ion implantation is carried out in two steps described below, for example. At the first step, implantation is carried out at, for example, 200 keV on the order of $10^{13}/\text{cm}^2$ and the subsequent step, or the second step, implantation is carried out at, for example, 75 keV on the order of $10^{12}/\text{cm}^2$.

According to the non-self-alignment p-type body region introduction process used here, the portion to be a gate electrode has been already recessed to 1 micrometer or so at the time of doping. Therefore, it is possible to reduce the burden on the subsequent heat treatment. As a result, it is possible to reduce unwanted variation in the impurity distribution of the superjunction. However, as the result of the depth of the p-type body region 12 being reduced, breakdown voltage may be reduced as a side-effect. To avoid this problem, the ion implantation in the p-type body region 12 is carried out in two steps as mentioned above.

As mentioned above, the p-type body region 12 of the second conductivity type is introduced before the formation of a gate polysilicon film. Thus the introduced portion is not limited by the width or position of the gate and it can be introduced in the optimum position. This makes it possible to reduce the burden on the subsequent heat treatment and, in addition, use the subsequent heat treatment (including the formation of a gate polysilicon film and the like) in a shared manner. This non-self-alignment p-type body region introduction process is applicable to not only cases where the ordinary epitaxy layer as the base for superjunction formation is of single layer but also cases where it is of multilayer.

Subsequently, as illustrated in FIG. 53, a gate oxide film 21 (for example, 50 to 200 nm or so in film thickness) is formed over the front surface 1a of the semiconductor wafer 1 by thermal oxidation (for example, wet oxidation at 950 degrees Celsius).

As illustrated in FIG. 54, a gate polysilicon film 11 (for example, 200 to 800 nm or so in film thickness) is formed over the gate oxide film 21 by, for example, low pressure CVD (Chemical Vapor Deposition). As wafer cleaning before gate oxidation, for example, wet cleaning using a first cleaning liquid and a second cleaning liquid can be applied. The first cleaning liquid is a liquid of ammonia:hydrogen peroxide:pure water=1:1:5 (volume ratio) and the second cleaning liquid is a liquid of hydrochloric acid:hydrogen peroxide:pure water=1:1:6 (volume ratio).

Subsequently, as illustrated in FIG. 55, the gate electrode 11 is patterned by dry etching.

Subsequently, as illustrated in FIG. 56, a resist film 28 for $n^+$-source region introduction is formed by lithography. Using this film as a mask, an $n^+$-source region 19, the $n^+$-type channel stopper region 8 of chip edge parts, and the like are introduced by ion implantation (for example, arsenic). (The dopant is, for example, arsenic; the dose amount is, for example, the order of $10^{15}/\text{cm}^2$ or so; and the implantation energy is, for example, 40 keV or so.) Thereafter, the resist film 28 that became unnecessary is entirely removed.

Subsequently, as illustrated in FIG. 57, a PSG (Phospho-Silicate-Glass) film 17 (interlayer insulating film) is formed over substantially the entire front surface 1a of the semiconductor wafer 1 by CVD or the like. (An SOG film may be stacked above and planarized.) As the interlayer insulating film 17, aside from the PSG film, BPSG, TEOS film, SiN film, others, or a composite film of them can be applied. An example of the total film thickness of the interlayer insulating film 17 is 900 nm or so.

Subsequently, as illustrated in FIG. 58, a resist film 29 for source contact hole formation is formed over the front surface 1a of the semiconductor wafer 1. Using this resist film as a mask, a source contact hole 20, a chip edge opening, and the like are formed by dry etching. Subsequently, the resist film 29 that became unnecessary is entirely removed.

Subsequently, as illustrated in FIG. 59, the substrate front surface is etched (to, for example, the depth of 0.3 micrometers or so) by anisotropic dry etching using the patterned interlayer insulating film 17 as a mask to form a recess region. Subsequently, ion implantation is carried out in this recess region to form the $p^+$-type body contact region 18 and the outermost peripheral $p^+$-type region 7. An example of the conditions for this ion implantation is as follows: dopant: $BF_2$; implantation energy: 30 keV or so; and dose amount: the order of $10^{15}/\text{cm}^2$.

Subsequently, as illustrated in FIG. 60, an aluminum metal layer is formed by sputtering or the like through a barrier metal film of TiW or the like and patterned. The metal source electrode 5, the guard ring electrode 3, and the like are thereby formed.

Thereafter, a final passivation film such as inorganic final passivation film or organic inorganic final passivation film is formed thereover if necessary and a pad opening and a gate opening are formed. As the final passivation film, the following measure may be taken aside from such a single-layer film as inorganic final passivation film or organic inorganic final passivation film: an organic inorganic final passivation film or the like is laminated over an inorganic final passivation film located below.

14. Single Narrow n-Type Column (Mainly FIG. 64 to FIG. 66)

The examples in this section and the next section are respectively modifications to the examples of the layout of extraordinary p-type columns in Section 1 and Section 3. A difference from the layout of extraordinary p-type columns is in that: in the examples in Sections 14 and 15, an extraordinary n-type column is introduced in place of the extraordinary p-type column.

Figure 64:
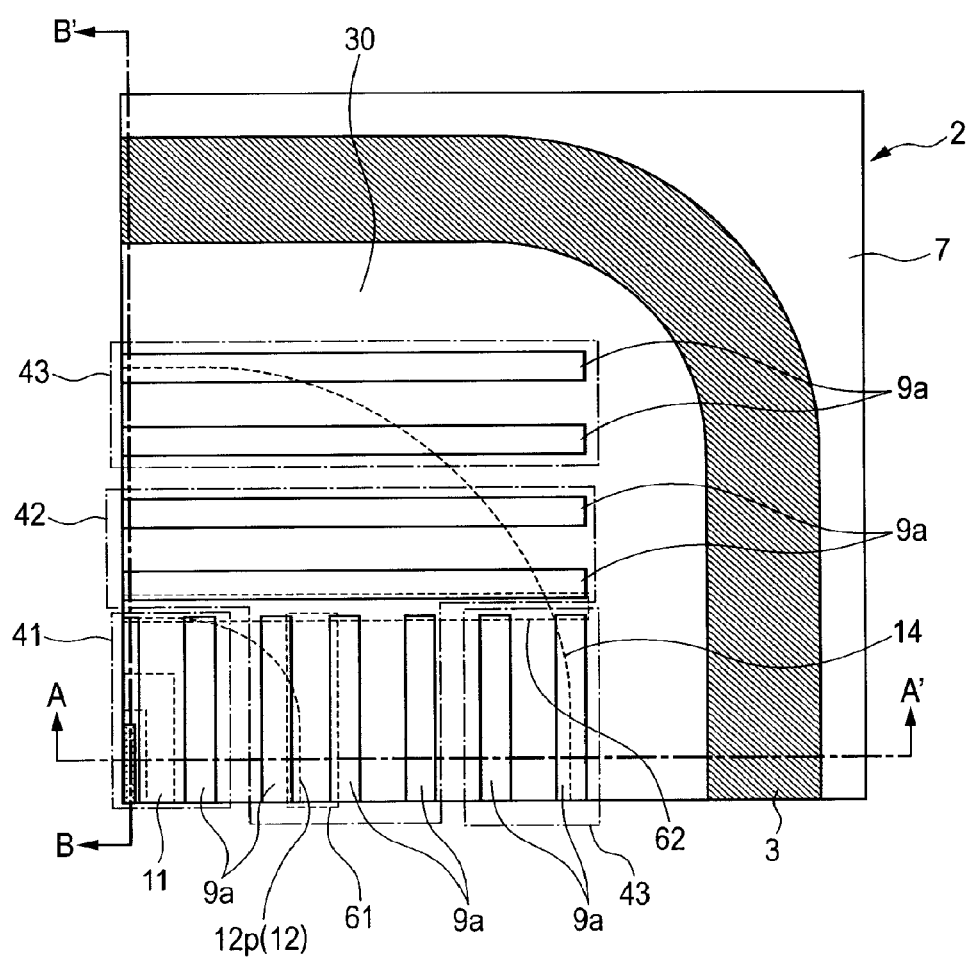
FIG. 64 is an enlarged plan view of the chip corner portion CR in FIG. 2 corresponding to FIG. 3, related to a sixth modification (narrow n-type column type: #1) to a plan layout of the device structure of a power MOSFET as an example of a semiconductor device in the first embodiment of the invention.
Figure 65:
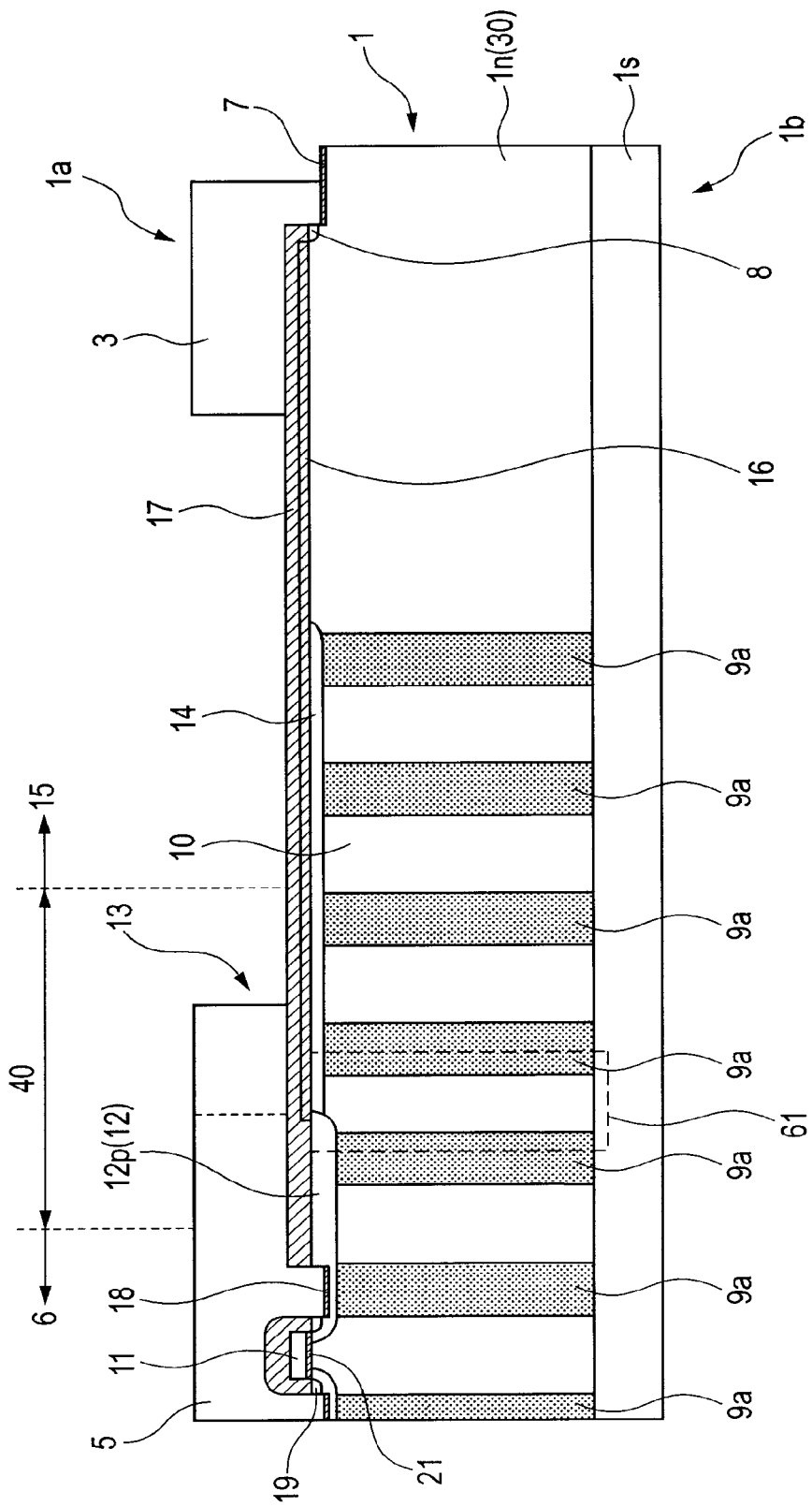
FIG. 65 is a device sectional view corresponding to the section taken along line A-A' of FIG. 64.
Figure 66:
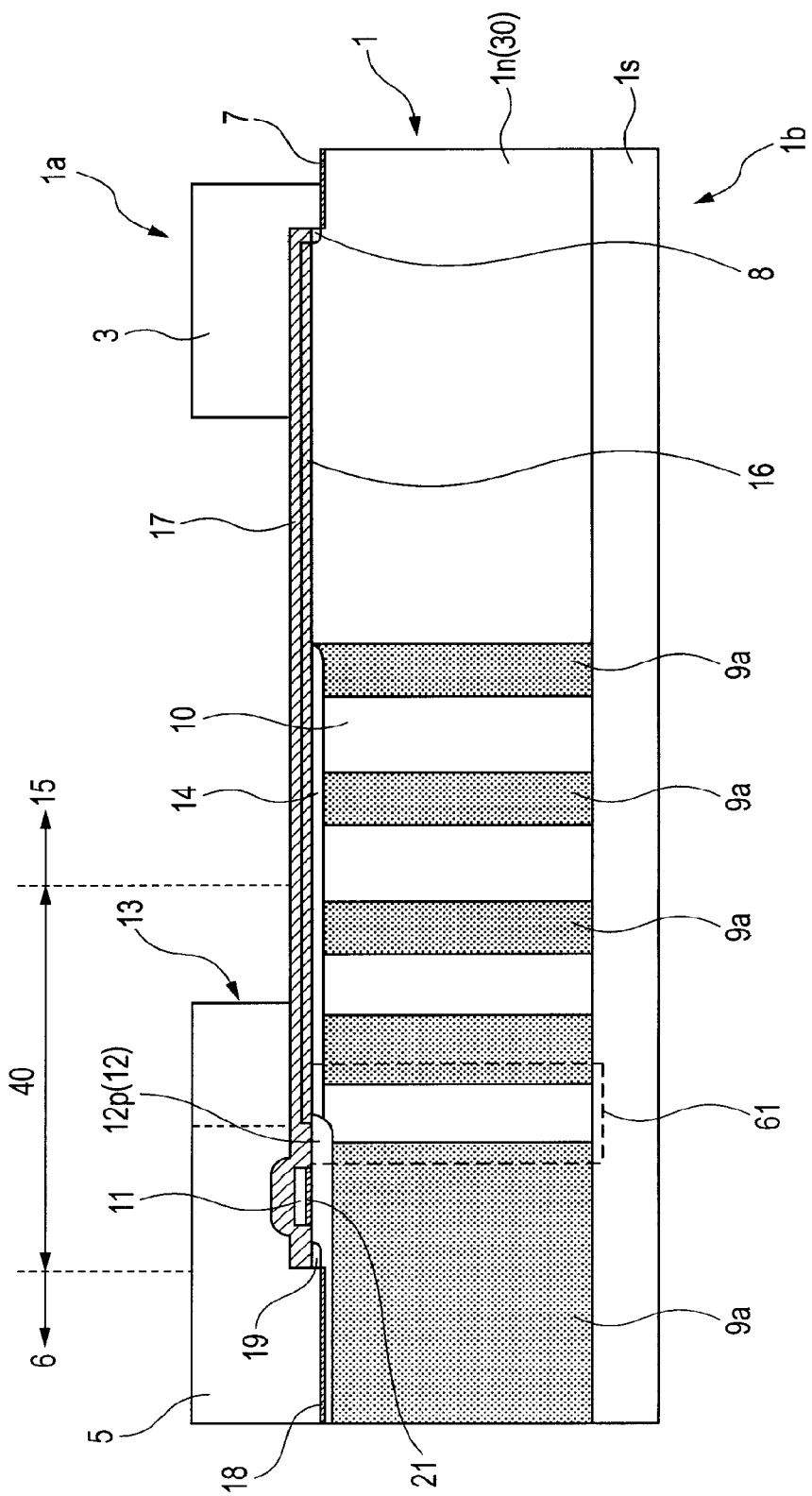
FIG. 66 is a device sectional view corresponding to the section taken along line B-B' of FIG. 64.

FIG. 64 is an enlarged plan view of the chip corner portion CR in FIG. 2 corresponding to FIG. 3. This drawing relates to a sixth modification (narrow n-type column type: #1) to a plan layout of the device structure of a power MOSFET as an example of a semiconductor device in the first embodiment of the invention. FIG. 65 is a device sectional view corresponding to the section taken along line A-A' of FIG. 64. FIG. 66 is a device sectional view corresponding to the section taken along line B-B' of FIG. 64.

As illustrated in FIG. 64 to FIG. 66, a first superjunction structure 41, a second superjunction structure 42, and a third superjunction structure 43 are all comprised of an ordinary p-type column region 9a as a rule. Then the width of the second superjunction structure 42 and a p-type column-p-type column region 61 (extraordinary n-type column and the like) and a p-type column end-p-type column region 62 in proximity thereto is made smaller than the width between the ordinary p-type columns. As a result, it is possible to locally break down charge balance and shift the high electric field portion from the surface region to the bulk region located below by the same principle as described with reference to FIG. 6. In this example, the width of p-type column regions 9a formed by an implant epitaxy process can be made identical. This brings about the following advantage: conditions for the implant epitaxy process can be easily optimized as compared with cases where a p-type column region having an extraordinary width exists together as in Section 1 and Section 3.

15. Double Narrow n-Type Column (Mainly FIG. 67 to FIG. 69)

Figure 67:
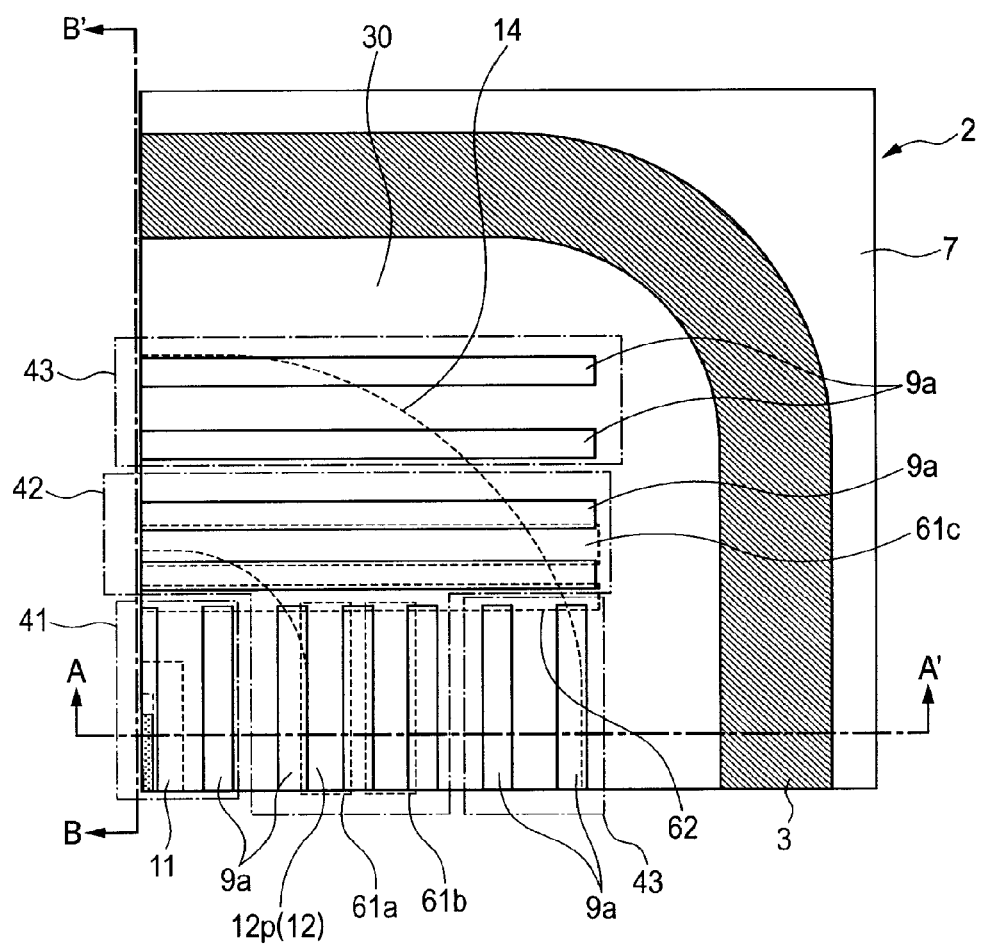
FIG. 67 is an enlarged plan view of the chip corner portion CR in FIG. 2 corresponding to FIG. 3, related to a seventh modification (narrow n-type column type: #2) to a plan layout of the device structure of a power MOSFET as an example of a semiconductor device in the first embodiment of the invention.
Figure 68:
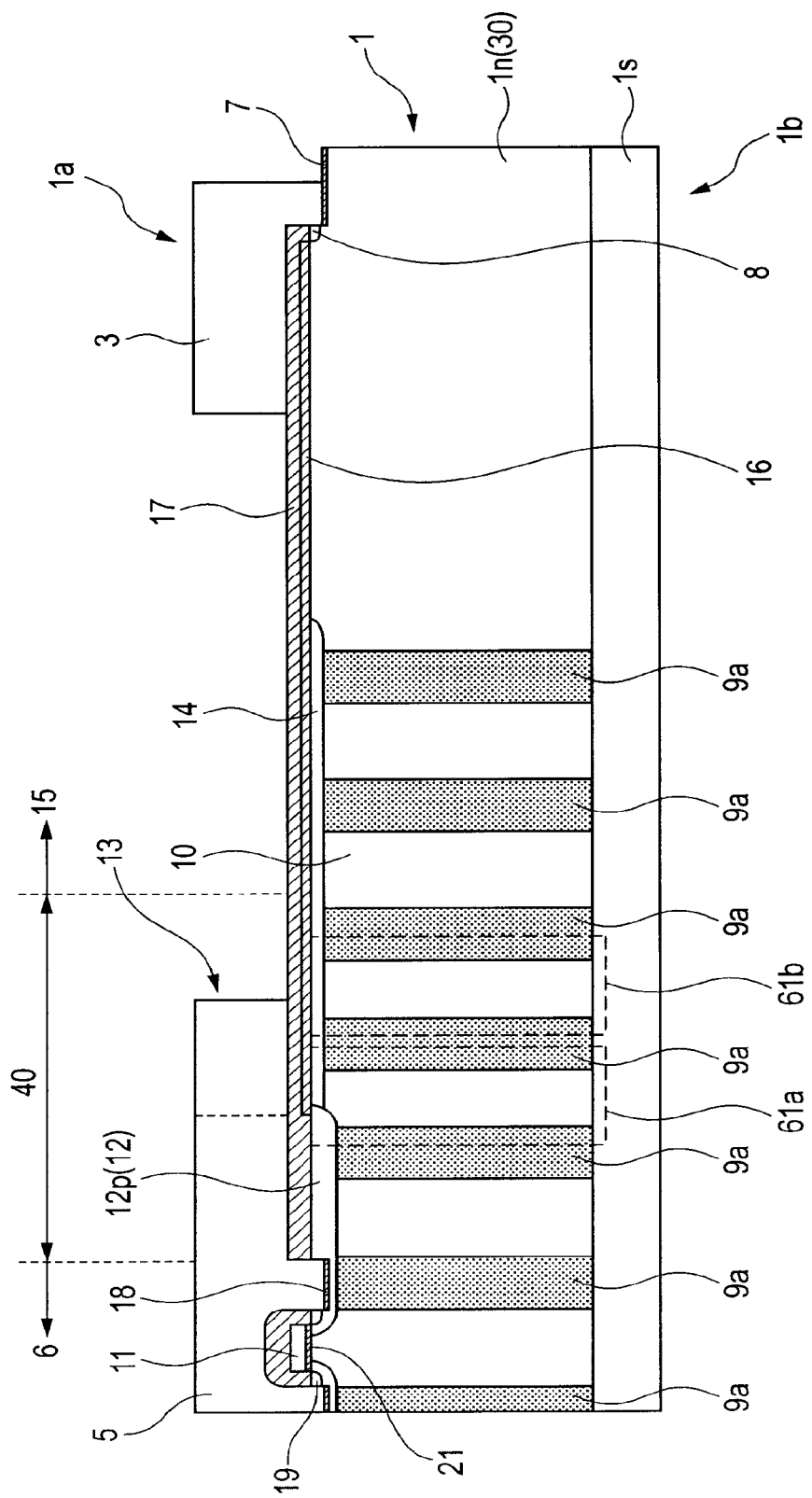
FIG. 68 is a device sectional view corresponding to the section taken along line A-A' of FIG. 67.
Figure 69:
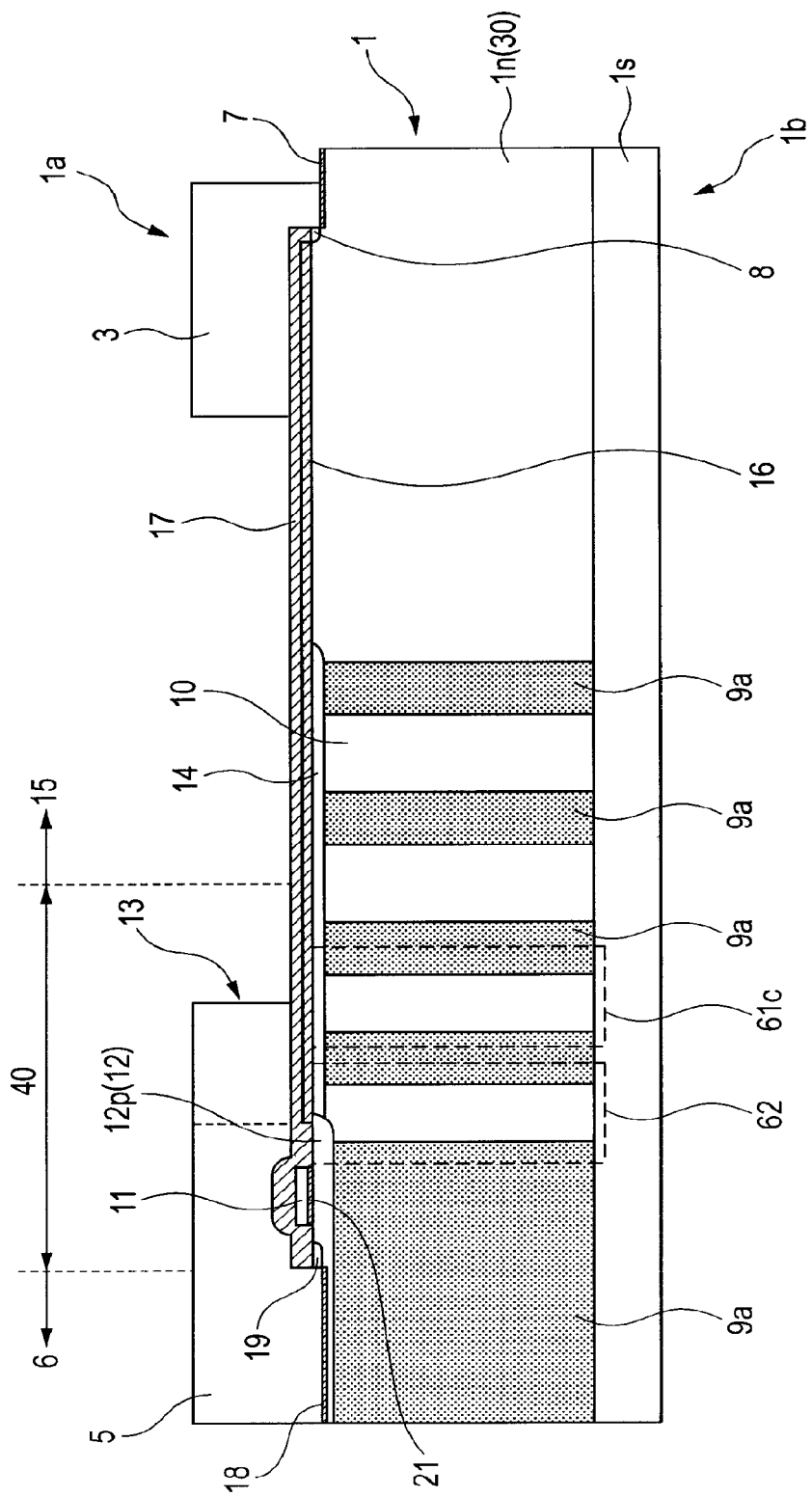
FIG. 69 is a device sectional view corresponding to the section taken along line B-B' of FIG. 67.

FIG. 67 is an enlarged plan view of the chip corner portion CR in FIG. 2 corresponding to FIG. 3. This drawing relates to a seventh modification (narrow n-type column type: #2) to a plan layout of the device structure of a power MOSFET as an example of a semiconductor device in the first embodiment of the invention. FIG. 68 is a device sectional view corresponding to the section taken along line A-A' of FIG. 67. FIG. 69 is a device sectional view corresponding to the section taken along line B-B' of FIG. 67.

As illustrated in FIG. 67 to FIG. 69, extraordinary n-type columns and the like are multiply arranged using a narrow p-type column end-p-type column region 62, narrow p-type column-p-type column regions 61a, 61b, 61c, and the like. The features of Section 3 and the features of Sections 14 are provided together.

16. Description of Variations in Overall Column Layout (Layout of p-Type Column Regions) Common to Each Embodiment (Mainly FIG. 61 to FIG. 63)

Figure 61:
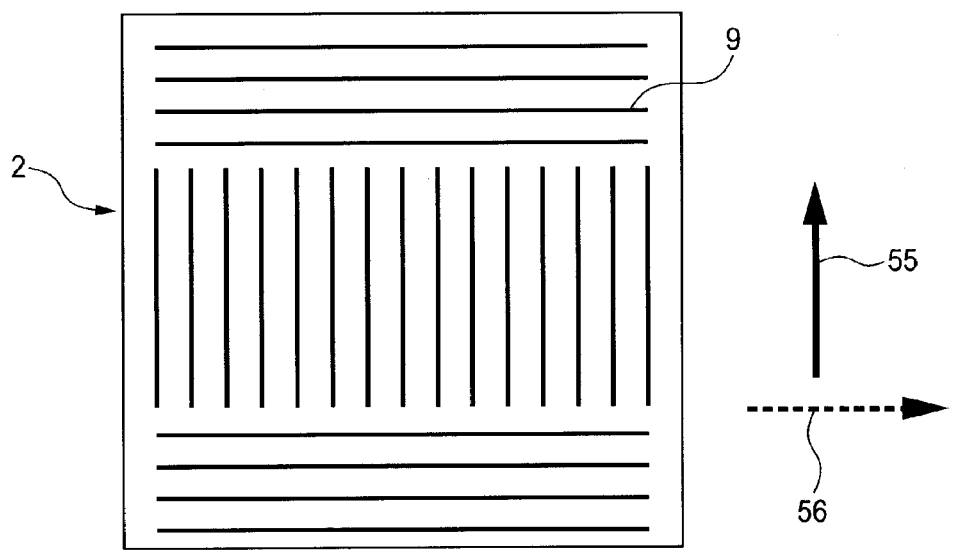
FIG. 61 is a column overall layout diagram (basic layout) corresponding to FIG. 2.
Figure 62:
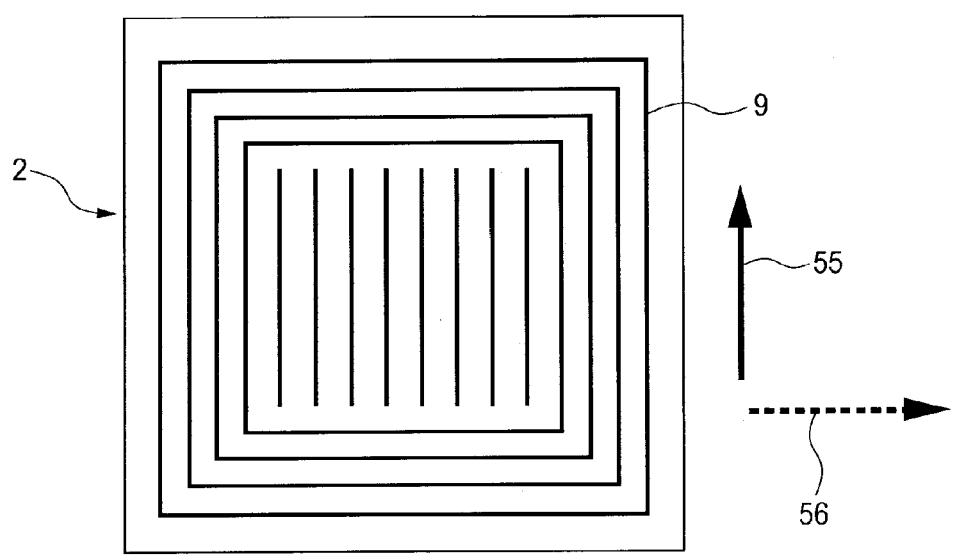
FIG. 62 is a column overall layout diagram in a first modification to FIG. 61.
Figure 63:
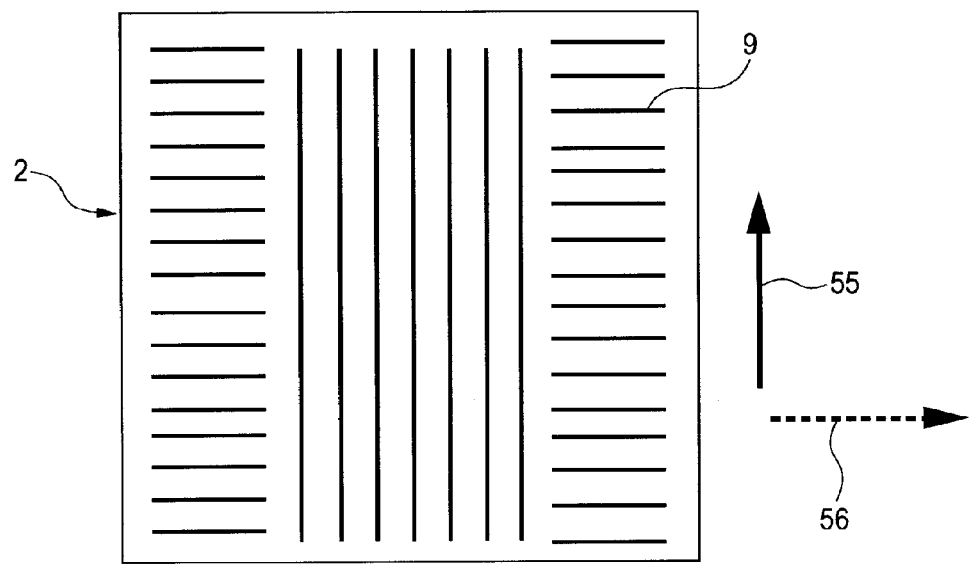
FIG. 63 is a column overall layout diagram in a second modification to FIG. 61.

FIG. 61 is a column overall layout diagram (basic layout) corresponding to FIG. 2. FIG. 62 is a column overall layout diagram of a first modification to FIG. 61. FIG. 63 is a column overall layout diagram of a second modification to FIG. 61.

In the above description of each of the embodiments, the following case has been taken as an example: a case where such a p-type column layout as illustrated in FIG. 61 corresponding to FIG. 2 is used and the orientation 55 of the gate in the active cell region and the orientation of the p-type columns 9 are parallel to each other. However, the invention is not limited to this and the gate orientation 56 may be used and the overall column layout may be as illustrated in FIG. 62 or FIG. 63.

17. Consideration of General and Each Embodiment and Summary

The present inventors repeated simulation based on such a full chip layout (including peripheral termination) as illustrated in FIG. 2. The result of the simulation revealed that such an unwanted breakdown mode as shown on the left side of FIG. 10 was established due to subtle fluctuation in process parameter. That is, the following takes place when the dose amount of a p⁻-type surface RESURF region is shifted to the smaller side in the border (intermediate region) between a cell end part and a chip peripheral region: when charge balance in a superjunction is shifted to $Qp<Qn$ as a whole, electric field concentration is prone to occur in proximity to the cell peripheral body region and there is a possibility that the breakdown voltage of the entire device is degraded.

The following is a description of a gist of the remedial measures against it, described up to this point:

(1) In the intermediate region, the width of at least some p-type column region is increased by, for example, 10 to 40% or so as compared with the principal p-type column regions in the other regions. The charge balance at this portion is thereby made substantially equivalent or Qp rich (that is, $Qp=xQn$; $1 \leq x \leq 1.3$ or so).

(2) In the intermediate region, the impurity concentration of at least some p-type column region is increased by, for example, 10 to 40% or so as compared with the principal p-type column regions in the other regions. The charge balance at this portion is thereby made substantially equivalent or Qp rich (that is, $Qp=xQn$; $1 \leq x \leq 1.3$ or so).

(3) In the entire superjunction structures, the n-type epitaxial layers are provided with a multilayer structure in which the upper part is higher in concentration. For example, the impurity concentration of the upper part is relatively increased by, for example, 10 to 40% or so as compared with the lower part. This makes it possible to shift a maximum point of electric field strength in the direction of depth to the depth of a column. As a result, the concentration of electric field strength in the intermediate region can be reduced.

Or, (4) Local ((1), (2), Section 11, and the like) or global ((3) and the like) adjustment of charge balance having the same effect is carried out.

The following is a description of the effect obtained by local measures described in (1), (2), and the like and the reasons for this:

(A) When $Qp \geq Qn$, electric field strength distribution at the time of avalanche breakdown has a peak in the direction of the depth of a column and this reduces the electric field strength in the superficial portion of the column. The reason for this is as described below. The front surface of a p-column coupled with source potential is at 0V. When $Qp \geq Qn$, the p-column is less prone to be depleted. As a result, the distance between equipotential lines of the front surface of the p-column and the front surface of an n-column adjacent thereto is increased. This weakens the electric field strength at the column superficial portion.

(B) The electric field at the outer end portion of the cell peripheral body region is reduced by (A). The reason for this is as described below. Equipotential lines terminated from the cell part to the peripheral portion are wider in spacing on the cell part front surface side. Therefore, the spacing between equipotential lines in proximity to a p-type well corner portion (outer end portion of the cell peripheral body region) is also increased and this reduces the electric field at the p-type well corner portion.

(C) Because of (B), breakdown voltage fluctuation due to variation in the amount of ion implantation in a p⁻-type surface RESURF region in the vicinity of the active cell region can be reduced. More specific description will be given. When $Qp<Qn$ and the spacing between equipotential lines is narrow in proximity to the front surface of the cell part, an electric field is prone to be concentrated in proximity to a p-type well corner portion. Therefore, the breakdown voltage of the device is sensitive to the impurity concentration of the p-RESURF region. When $Qp \geq Qn$, however, the electric field in proximity to the p-type well corner portion can be reduced. Therefore, the breakdown voltage of the device becomes insensitive to the impurity concentration of the p-RESURF region and variation in breakdown voltage can be suppressed.

18. End Summary

Up to this point, concrete description has been given to the invention made by the present inventors based on embodiments thereof. However, the invention is not limited to these embodiments and can be variously modified without departing from the subject matter thereof, needless to add.

Some examples will be taken. In the above concrete description of the embodiments, a MOS structure with a planar gate structure has been taken as an example. However, the invention is not limited to this and can be exactly similarly applied to trench gate structures such as U-MOSFET, needless to add. As the layout of MOSFET, a striped arrangement parallel to pn-columns has been taken as an example. However, the layout can be variously modified and an arrangement orthogonal to pn-columns and a lattice arrangement are also acceptable.

In the above concrete description of the embodiments, a case where an n-channel device is mainly formed over the upper surface of an n-epitaxial layer placed over an n$^+$-silicon single crystal substrate has been taken as an example. However, the invention is not limited to these embodiments and a p-channel device may be formed over the upper surface of an n-epitaxial layer placed over a p$^+$-silicon single crystal substrate.

In the above concrete description of the embodiments, a power MOSFET has been taken as an example. However, the invention is not limited to these embodiments and can also be applied to the following, needless to add: power devices, that is, diodes, bipolar transistors, IGBTs (Insulated gate Bipolar Transistors), and the like having a superjunction structure. It is also applicable to semiconductor integrated circuit devices and the like incorporating such a power MOSFET, a diode, a bipolar transistor, IGBT, or the like, needless to add.

In the above concrete description of the embodiments, a trench fill technique has been mainly taken as an example of a method for forming superjunction structures. However, the invention is not limited to these embodiments and can also be applied to, for example, a multi-epitaxial technique and the like, needless to add.

In the above description, a case where a p-type column region is formed in an n-type region has been taken as an example of the structure of a superjunction. Instead, an n-type column region may be formed in a p-type region, needless to add.

In the above description, an n-channel device has been mainly taken as an example. The examples taken up to this point can also be applied to a p-channel device substantially without change by pn inverting operation.

In the above description, type surface RESURF region, field plate, and the like have been taken examples of means for reducing the electric field concentration in a drift region front surface. In addition, a field limiting ring, a floating field ring, or the like may be used together.

What is claims is:

1. A method for manufacturing a semiconductor device including a power MISFET having a super junction structure, comprising steps of:
   (a) providing a semiconductor substrate;
   (b) forming a first n-type layer over the semiconductor substrate;
   (c) selectively introducing impurities into the first n-type layer, thereby forming first and second p-type impurity regions in the first n-type layer;
   (d) forming a second n-type layer over the first n-type layer, the first p-type impurity region and the second p-type impurity region;
   (e) selectively introducing impurities into the second n-type layer, thereby forming third and fourth p-type impurity regions in the second n-type layer such that the first and third p-type impurity regions are connected and the second and fourth p-type impurity regions are connected;
   (f) forming a body region of the power MISFET in the second n-type layer such that the body region is connected to a first p-type column and a second p-type column,
   (g) forming a source region of the power MISFET in the body region;
   (h) forming a gate insulating film of the power MISFET over the second n-type layer; and
   (i) forming a gate electrode of the power MISFET over the gate insulating film,
   wherein the first p-type column of the super junction structure comprises the first and third p-type impurity regions and extends in a first direction in a plan view,
   wherein the second p-type column of the super junction structure comprises the second and fourth p-type impurity regions and extends in the first direction in the plan view,
   wherein the second p-type column is arranged between the first p-type column and an edge of the semiconductor substrate in a second direction perpendicular to the first direction in the plan view, and
   wherein the second p-type column includes a larger impurity concentration portion than the first p-type column.

2. A method for manufacturing a semiconductor device according to the claim 1,
   wherein the step (c) includes the steps of:
   (c1) forming the first and second p-type impurity regions by using a first resist film such that a part of the first n-type layer is exposed; and
   (c2) after the step (c1), selectively introducing impurities into the second p-type impurity region by using a second resist film such that the second p-type impurity region is exposed and the first p-type impurity region is covered.

3. A method for manufacturing a semiconductor device according to the claim 2,
   wherein the step (e) includes the steps of:
   (e1) forming the third and fourth p-type impurity regions by using a third resist film such that a part of the second n-type layer is exposed; and
   (e2) after the step (e1), selectively introducing impurities into the fourth p-type impurity region by using a fourth resist film such that the fourth p-type impurity region is exposed and the third p-type impurity region is covered.

4. A method for manufacturing a semiconductor device according to the claim 3,
   wherein the second p-type impurity region includes a larger impurity concentration than the fourth p-type impurity region.

5. A method for manufacturing a semiconductor device according to the claim 4,
   wherein the second p-type impurity region includes a larger impurity concentration than each of the first, third and fourth p-type impurity regions.

6. A method for manufacturing a semiconductor device according to the claim 1,
   wherein the first and second n-type layers are formed by epitaxial growth.

* * * * *